US012764957B2

(12) United States Patent
Sharangpani et al.

(10) Patent No.: US 12,764,957 B2
(45) Date of Patent: Oct. 13, 2026

(54) MEMORY DEVICE INCLUDING ALUMINUM NITRIDE DIFFUSION BARRIER LAYER AND METHODS FOR FORMING THE SAME

(71) Applicant: WESTERN DIGITAL TECHNOLOGIES, INC., San Jose, CA (US)

(72) Inventors: Rahul Sharangpani, Fremont, CA (US); Raghuveer S. Makala, Campbell, CA (US); Fei Zhou, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 483 days.

(21) Appl. No.: 18/344,227

(22) Filed: Jun. 29, 2023

(65) Prior Publication Data

US 2025/0008730 A1 Jan. 2, 2025

(51) Int. Cl.

| | |
|---|---|
| ***H10B 43/27*** | (2023.01) |
| ***G11C 16/04*** | (2006.01) |
| ***H10B 43/10*** | (2023.01) |
| ***H10B 43/35*** | (2023.01) |
| ***H10W 20/41*** | (2026.01) |
| ***H10W 20/42*** | (2026.01) |

(52) U.S. Cl.

CPC ......... *H10B 43/27* (2023.02); *G11C 16/0483* (2013.01); *H10B 43/10* (2023.02); *H10B 43/35* (2023.02); *H10W 20/42* (2026.01); *H10W 20/435* (2026.01)

(58) Field of Classification Search

CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/465; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS 9,613,977 B2 4/2017 Sharangpani et al.
9,659,955 B1 5/2017 Sharangpani et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.
(Continued)

*Primary Examiner* — William B Partridge
*Assistant Examiner* — Gustavo G Ramallo
(74) *Attorney, Agent, or Firm* — THE MARBURY LAW GROUP PLLC

(57) ABSTRACT

A semiconductor structure includes an alternating stack of insulating layers and electrically conductive layers, a memory opening vertically extending through the alternating stack, and a memory opening fill structure located in the memory opening and containing a memory film, a vertical semiconductor channel, and an aluminum nitride layer that laterally surrounds the memory film.

8 Claims, 48 Drawing Sheets

(56) References Cited

U.S. PATENT DOCUMENTS

| | | | | |
|---|---|---|---|---|
| 9,659,956 | B1 | 5/2017 | Pachamuthu et al. | |
| 9,875,929 | B1 | 1/2018 | Shukla et al. | |
| 10,283,513 | B1 | 5/2019 | Zhou et al. | |
| 10,438,964 | B2 | 10/2019 | Makala et al. | |
| 10,804,282 | B2 | 10/2020 | Baraskar et al. | |
| 10,861,869 | B2 | 12/2020 | Nakamura et al. | |
| 11,049,807 | B2 | 6/2021 | Li et al. | |
| 11,177,280 | B1 | 11/2021 | Rajashekhar et al. | |
| 11,244,953 | B2 | 2/2022 | Kanakamedala et al. | |
| 11,289,416 | B2 | 3/2022 | Tsutsumi et al. | |
| 11,398,496 | B2 | 7/2022 | Kai et al. | |
| 11,482,539 | B2 | 10/2022 | Sharangpani et al. | |
| 11,489,043 | B2 | 11/2022 | Kai et al. | |
| 11,569,260 | B2 | 1/2023 | Rajashekhar et al. | |
| 2016/0379989 | A1 | 12/2016 | Sharangpani et al. | |
| 2017/0125436 | A1 | 5/2017 | Sharangpani et al. | |
| 2018/0374866 | A1 | 12/2018 | Makala et al. | |
| 2020/0020715 | A1 | 1/2020 | Nakamura et al. | |
| 2021/0035965 | A1 | 2/2021 | Mizutani et al. | |
| 2021/0159167 | A1 | 5/2021 | Tsutsumi et al. | |
| 2021/0233929 | A1* | 7/2021 | Lee | H10B 43/27 |
| 2021/0265372 | A1 | 8/2021 | Kanakamedala et al. | |
| 2021/0265385 | A1 | 8/2021 | Rajashekhar et al. | |
| 2021/0335805 | A1 | 10/2021 | Kai et al. | |
| 2021/0335999 | A1 | 10/2021 | Kai et al. | |
| 2022/0052073 | A1 | 2/2022 | Kitazawa et al. | |
| 2022/0109003 | A1 | 4/2022 | Nagahata et al. | |
| 2022/0130853 | A1 | 4/2022 | Sharangpani et al. | |
| 2022/0285387 | A1 | 9/2022 | Hinoue et al. | |
| 2022/0285388 | A1 | 9/2022 | Cui et al. | |
| 2022/0399350 | A1 | 12/2022 | Sharangpani et al. | |
| 2022/0399354 | A1 | 12/2022 | Sharangpani et al. | |
| 2022/0406379 | A1 | 12/2022 | Takeguchi et al. | |
| 2022/0406720 | A1 | 12/2022 | Hinoue et al. | |
| 2022/0406793 | A1 | 12/2022 | Takeguchi et al. | |
| 2022/0406794 | A1 | 12/2022 | Hinoue et al. | |
| 2024/0096415 | A1* | 3/2024 | Lee | H10D 30/693 |
| 2025/0254880 | A1* | 8/2025 | Kim | H10D 64/037 |
| 2025/0275145 | A1* | 8/2025 | Choi | H10B 43/27 |
| 2025/0316597 | A1* | 10/2025 | Kim | H10W 20/48 |

OTHER PUBLICATIONS

Korbutowicz, R. et al., "Oxidation rates of aluminium nitride thin films: effect of composition of the atmosphere," J Mater Sci: Mater Electron (2017) 28:13937-13949, DOI 10.1007/s10854-017-7243-5.

U.S. Appl. No. 17/378,196, filed Jul. 6, 2021, SanDisk Technologies LLC.

U.S. Appl. No. 17/587,470, filed Jan. 28, 2022, SanDisk Technologies LLC.

U.S. Appl. No. 17/587,518, filed Jan. 28, 2022, SanDisk Technologies LLC.

U.S. Appl. No. 17/655,827, filed Mar. 22, 2022, SanDisk Technologies LLC.

U.S. Appl. No. 17/663,055, filed May 12, 2022, SanDisk Technologies LLC.

U.S. Appl. No. 18/343,118, filed Jun. 28, 2023, Western Digital Technologies, Inc.

U.S. Appl. No. 18/343,162, filed Jun. 28, 2023, Western Digital Technologies, Inc.

U.S. Appl. No. 63/481,622, filed Jan. 26, 2023, SanDisk Technologies LLC.

U.S. Appl. No. 63/488,243, filed Mar. 3, 2023, SanDisk Technologies LLC.

* cited by examiner

MEMORY DEVICE INCLUDING ALUMINUM NITRIDE DIFFUSION BARRIER LAYER AND METHODS FOR FORMING THE SAME

FIELD

The present disclosure relates generally to the field of semiconductor devices, and particularly to memory devices including an aluminum nitride diffusion barrier layer and methods for forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure comprises: an alternating stack of insulating layers and electrically conductive layers; a memory opening vertically extending through the alternating stack; and a memory opening fill structure located in the memory opening and comprising a memory film, a vertical semiconductor channel, and an aluminum nitride layer that laterally surrounds the memory film.

According to another aspect of the present disclosure, a method of forming a semiconductor structure is provided. The method comprises: forming an alternating stack of insulating layers and sacrificial material layers over a substrate; forming a memory opening through the alternating stack; forming a memory opening fill structure in the memory opening by sequentially forming an aluminum nitride layer, a memory film, and a vertical semiconductor channel in the memory opening; and replacing the sacrificial material layers with electrically conductive layers.

DETAILED DESCRIPTION

Figure 1:
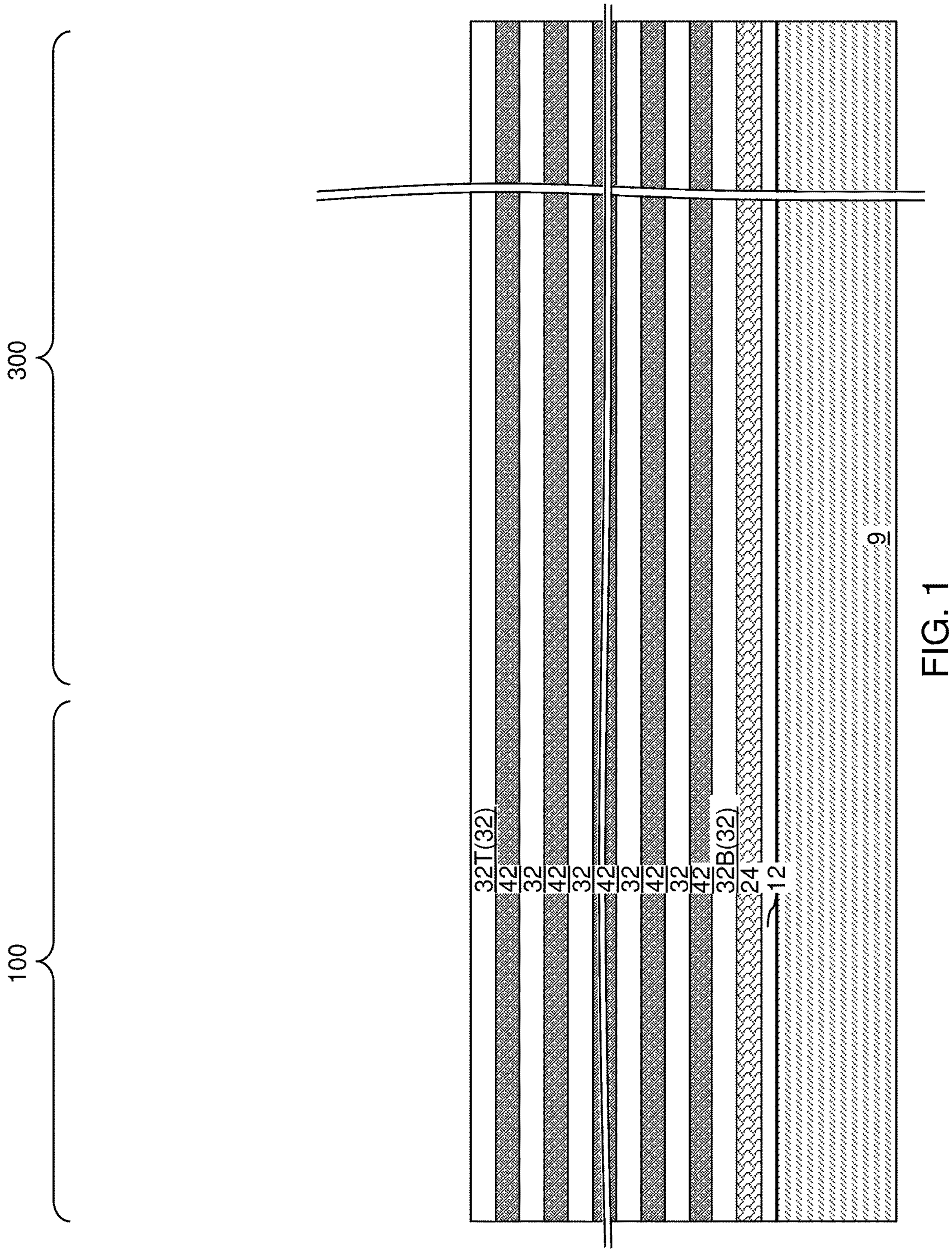
FIG. 1 is a schematic vertical cross-sectional view of a first exemplary structure after formation of a buried insulating layer, a source-select-level semiconductor layer, and an alternating stack of insulating layers and sacrificial material layers over a carrier substrate according to a first embodiment of the present disclosure.

As discussed above, the embodiments of the present disclosure are directed to memory devices including aluminum nitride diffusion barrier layer and methods for forming the same, the various aspects of which are described below. Embodiments of the disclosure can be employed to form various structures including a multilevel memory structure, non-limiting examples of which include three-dimensional memory devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1\times10^{-5}$ S/m to $1\times10^{5}$ S/m. As used herein, a "semiconductor material" refers to a material having electrical conductivity in the range from $1\times10^{-5}$ S/m to 1 S/m in the absence of electrical dopants therein, and is capable of producing a doped material having electrical conductivity in a range from 1 S/m to $1\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1\times10^{5}$ S/m. As used herein, an "insulator material" or a "dielectric material" refers to a material having electrical conductivity less than $1\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1\times10^{-5}$ S/m to $1\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

A buried insulating layer 12 can be optionally formed on the top surface of the carrier substrate 9. The buried insulating layer 12 includes an insulating material such as silicon oxide. The thickness of the buried insulating layer 12 may be in a range from 20 nm to 200 nm, such as from 40 nm to 100 nm, although lesser and greater thicknesses may also be employed.

A source-select-level semiconductor layer 24 including a semiconductor material can be optionally formed over the buried insulating layer 12. The semiconductor material may comprise silicon (e.g., polysilicon or amorphous silicon), germanium or a silicon-germanium compound semiconductor material, and may be formed by chemical vapor deposition, atomic layer deposition or physical vapor deposition. In one embodiment, the semiconductor material may be heavily doped. The atomic concentration of dopants in the source-select-level semiconductor layer 24 may be in a range from $5\times10^{18}/cm^3$ to $2\times10^{21}/cm^3$, such as from $1\times10^{19}/cm^3$ to $1\times10^{21}/cm^3$, although lesser and greater thicknesses may also be employed. The source-select-level semiconductor layer 24 laterally extends along horizontal directions, may have a uniform thickness throughout, which may be in a range from 10 nm to 100 nm, although lesser and greater thicknesses may also be employed. The source-select-level semiconductor layer 24 can be subsequently employed as a source select gate electrode. Alternatively, the buried insulating layer 12 and/or the source-select-level semiconductor layer 24 may be omitted, An alternating stack of first material layers and second material layers can be formed over the substrate 9 (e.g., over the source-select-level semiconductor layer 24, if present). The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the carrier substrate 9. The insulating layers 32 comprise an insulating material such as undoped silicate glass or a doped silicate glass, and the sacrificial material layers 42 comprise a sacrificial material such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers.

The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32T may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness of about one half of the thickness of other insulating layers 32.

The first exemplary structure comprises a memory array region 100 in which a three-dimensional array of memory elements is to be subsequently formed, and a contact region 300 in which layer contact via structures contacting word lines are to be subsequently formed.

While an embodiment is described in which the spacer material layers are formed as sacrificial material layers 42, the spacer material layers may be formed as electrically conductive layers in an alternative embodiment. Generally, spacer material layers of the present disclosure may be formed as, or may be subsequently replaced at least partly with, electrically conductive layers.

Figure 2:
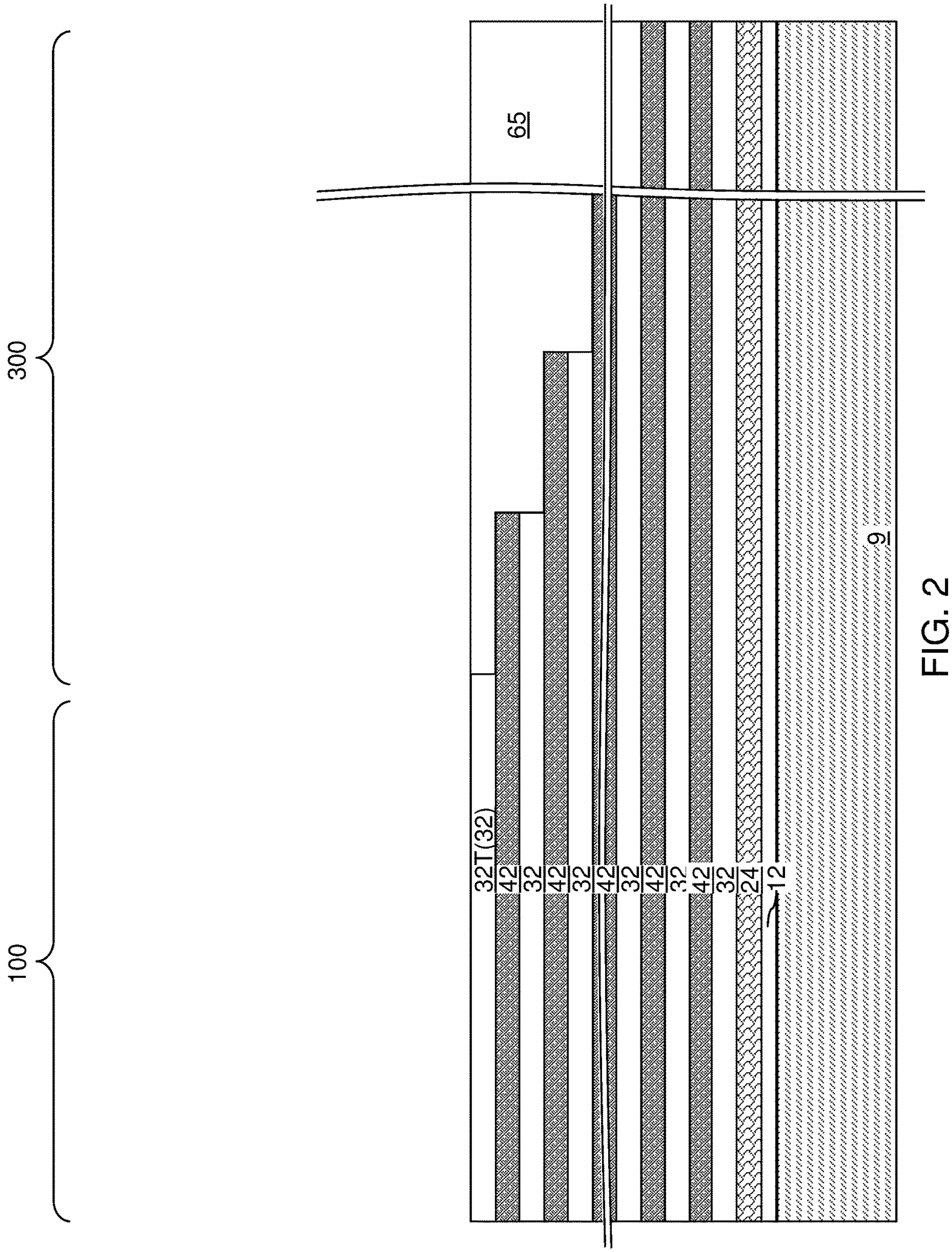
FIG. 2 is a schematic vertical cross-sectional view of the first exemplary structure after formation of stepped surfaces and a stepped dielectric material portion according to the first embodiment of the present disclosure.

Referring to FIG. 2, optional stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the source-select-level semiconductor layer 24. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases or decreases stepwise as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3:
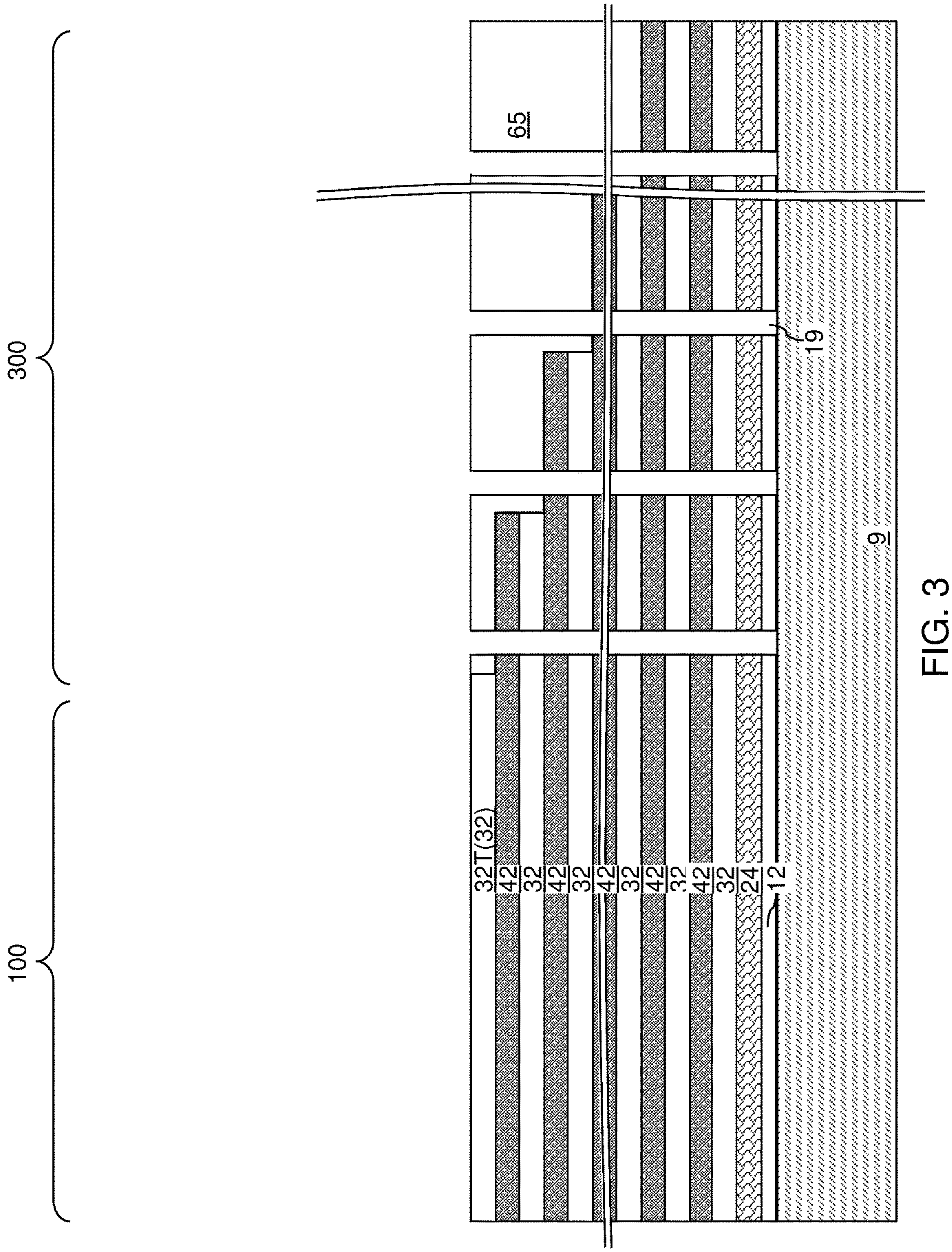
FIG. 3 is a schematic vertical cross-sectional view of the first exemplary structure after formation of support openings according to the first embodiment of the present disclosure.

Referring to FIG. 3, an optional first etch mask layer (such as a photoresist layer) can be formed over the alternating stack (32, 42), and can be lithographically patterned to form openings in the contact region 300. An anisotropic etch process can be performed to transfer the pattern of the openings in the first etch mask layer through the stepped dielectric material portion 65 and the alternating stack (32, 42). Support openings 19 can optionally be formed through the stepped dielectric material portion 65 and the alternating stack (32, 42) in the contact region 300. Each of the support openings 19 can vertically extend into the carrier substrate 9. In one embodiment, bottom surfaces of the support openings 19 may be formed at or below the top surface of the carrier substrate 9. The support openings 19 may have a diameter in a range from 60 nm to 400 nm, such as from 120 nm to 300 nm, although lesser and greater thicknesses may be employed.

Figure 4:
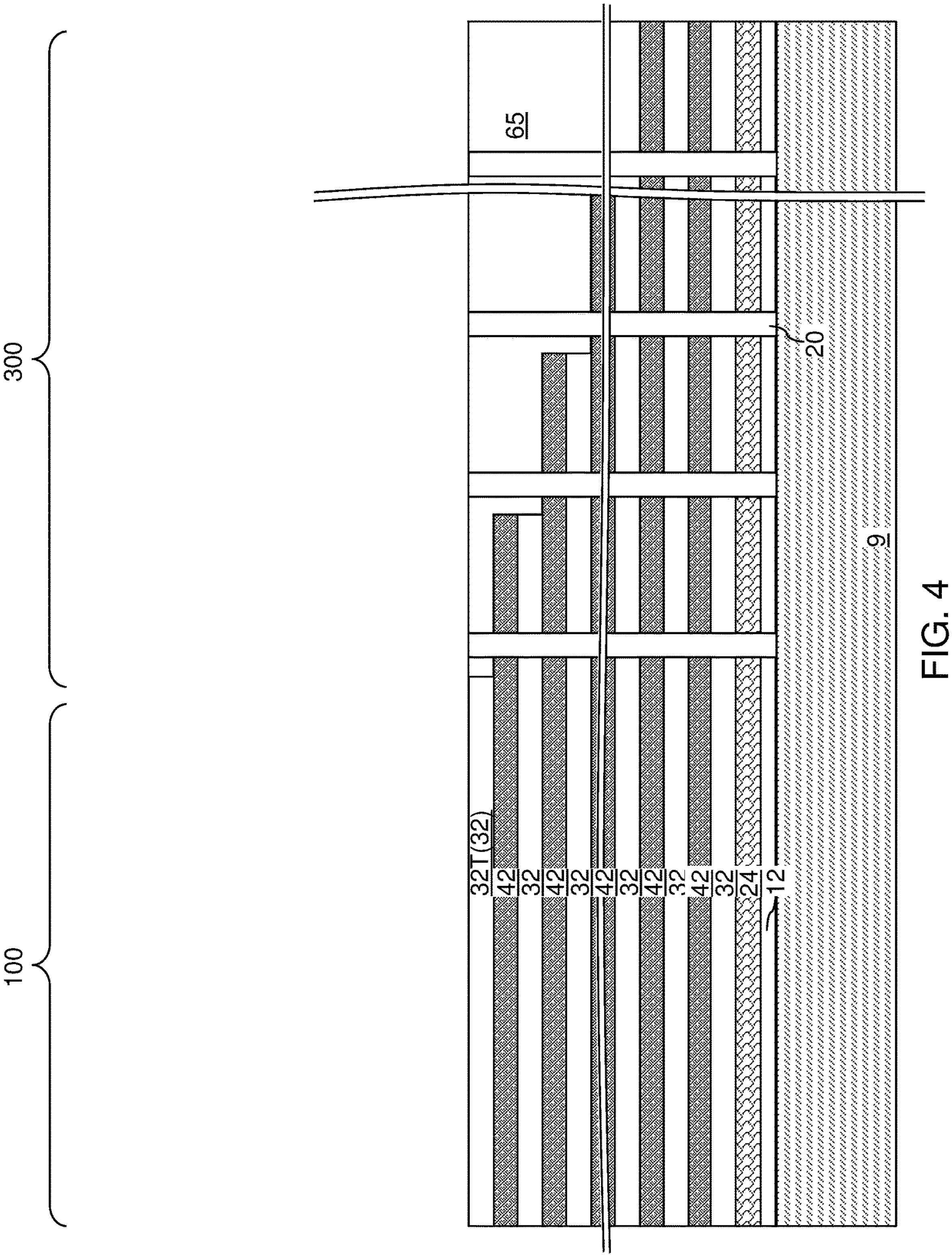
FIG. 4 is a vertical cross-sectional view of the first exemplary structure after formation of support pillar structures according to the first embodiment of the present disclosure.

Referring to FIG. 4, a dielectric fill material, such as silicon oxide, can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the stepped dielectric material portion 65 during replacement of the sacrificial material layers 42 with electrically conductive layers. Alternatively, the support openings 19 can be formed at a later step at the same time as the memory openings, and the support pillar structures 20 can be formed in the support openings 19 at the same time as the memory opening fill structures are formed in the memory openings, as will be described below.

Figure 5A:
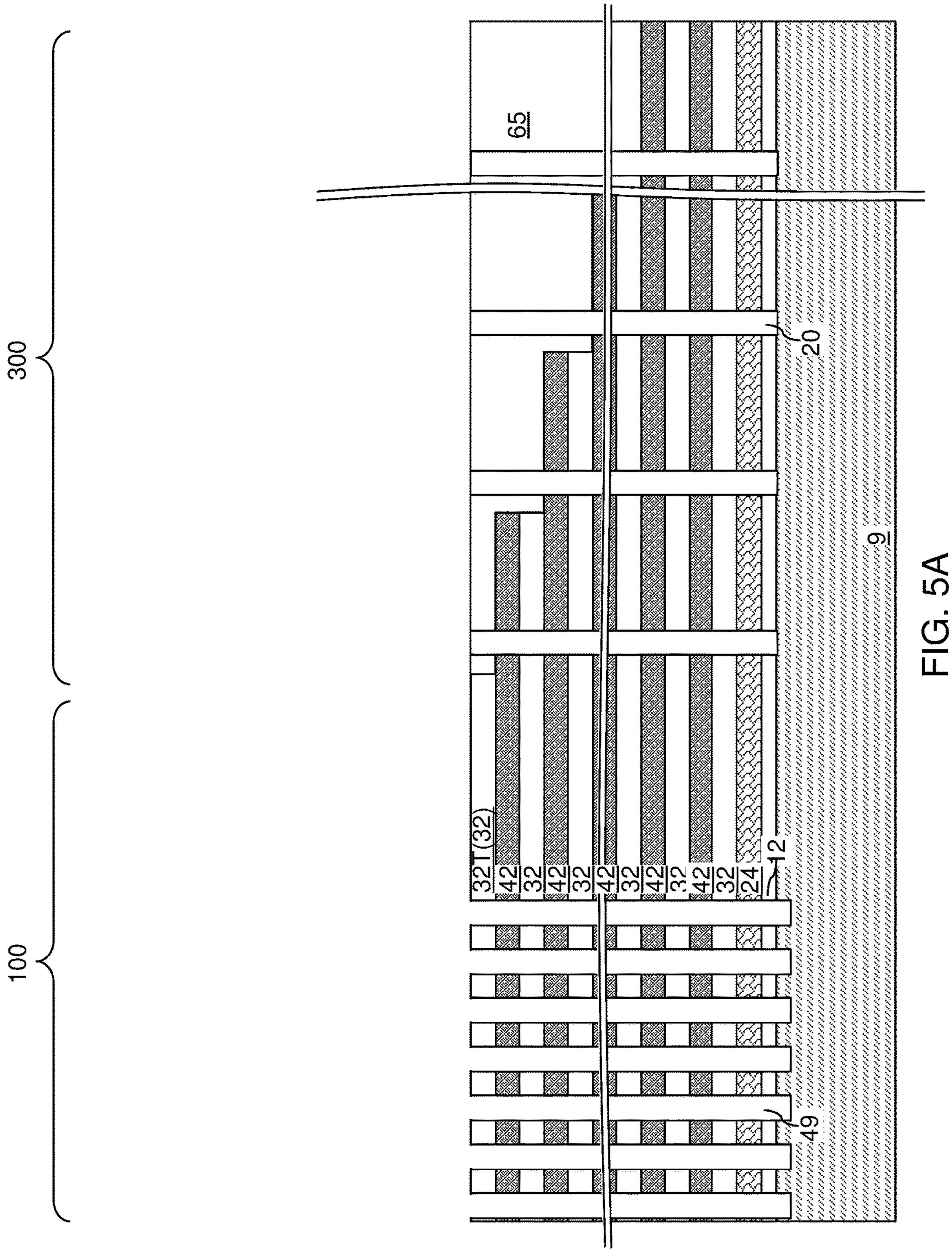
FIG. 5A is a schematic vertical cross-sectional view of the first exemplary structure after formation of memory openings according to the first embodiment of the present disclosure.
Figure 5B:
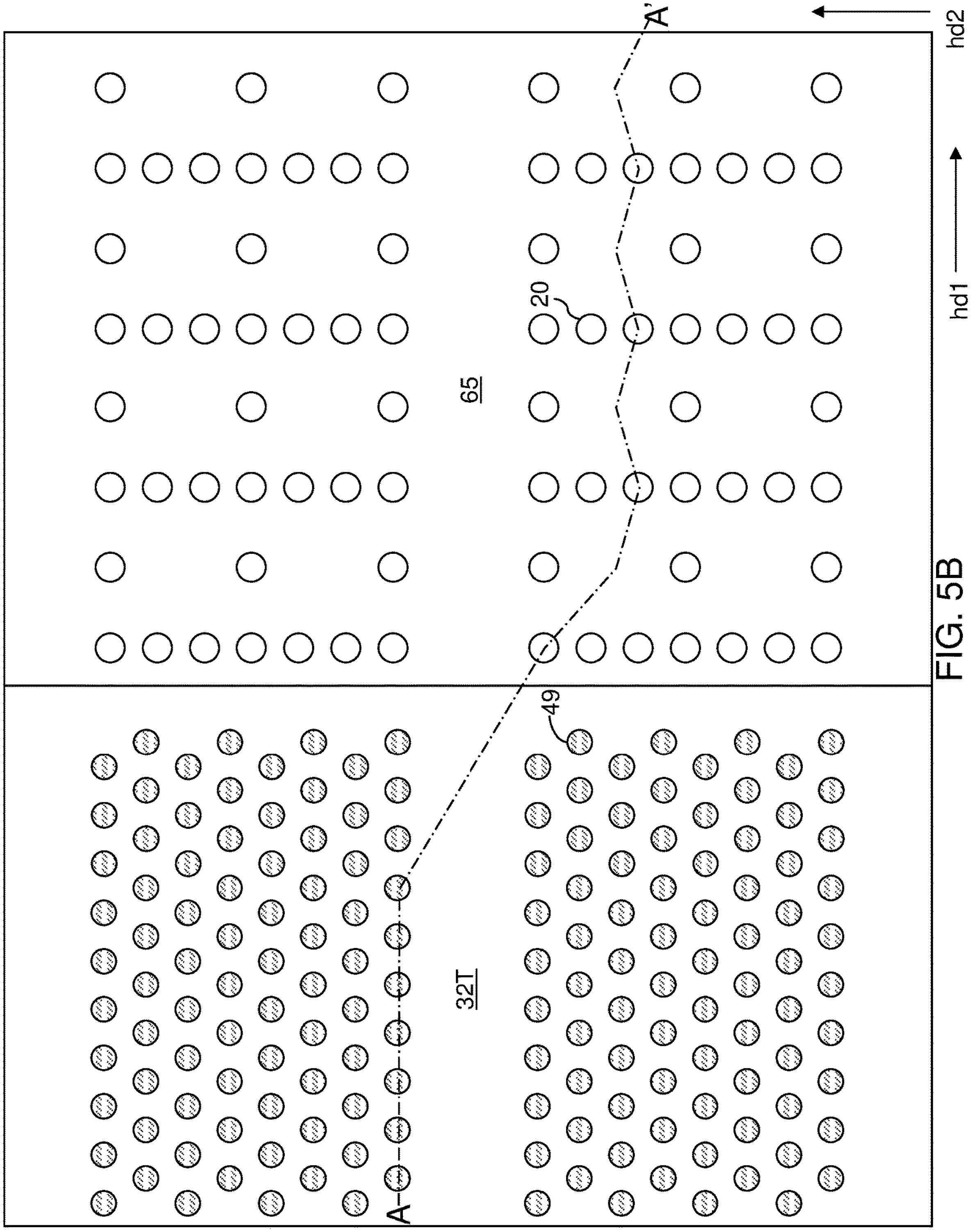
FIG. 5B is a top-down view of the first exemplary structure of FIG. 5A. The vertical plane A-A is the cut plane of the vertical cross-sectional view of FIG. 5A.

Referring to FIGS. 5A and 5B, a second etch mask layer (such as a photoresist layer) can be formed over the alternating stack (32, 42), and can be lithographically patterned to form openings in the memory array region 100. An anisotropic etch process can be performed to transfer the pattern of the openings in the second etch mask layer through the alternating stack (32, 42), the source-select-level semiconductor layer 24, and the buried insulating layer 12. According to an aspect of the present disclosure, the anisotropic etch process may comprise a first anisotropic etch step that etches the materials of the insulating layers 32 and the spacer material layers (such as the sacrificial material layers 42) selective to the first semiconductor material of the source-select-level semiconductor layer 24, a second anisotropic etch step that etches the first semiconductor material selective to the material of the buried insulating layer 12, and a third anisotropic etch process that etches the material of the buried insulating layer 12 selective to the material of the carrier substrate 9.

Memory openings 49 can be formed through the alternating stack (32, 42), the source-select-level semiconductor layer 24, and the buried insulating layer 12 in the memory array region 100. According to an aspect of the present disclosure, sequential use of selective etch chemistries can minimize overetch of the third anisotropic etch step into a top portion of the carrier substrate 9. Thus, bottom surfaces of the memory openings 49 may be formed within or underneath, but in proximity to, a horizontal plane including the bottom surface of the buried insulating layer 12. In one embodiment, recess distance of the bottom surfaces of the memory openings 49 relative to the horizontal plane including the bottom surface of the buried insulating layer 12 may be less than the total thickness of each memory film to be subsequently formed, and may be in a range from 0 nm to 15 nm, such as from 0 nm to 10 nm.

Each cluster of memory openings 49 may comprise a plurality of rows of memory openings 49. Each row of memory openings 49 may comprise a plurality of memory openings 49 that are arranged along the first horizontal direction hd1 with a uniform pitch. The rows of memory openings 49 may be laterally spaced among one another along the second horizontal direction hd2, which may be perpendicular to the first horizontal direction hd2. In one embodiment, each cluster of memory openings 49 may be formed as a two-dimensional periodic array of memory openings 49. The memory openings 49 may have a diameter in a range from 60 nm to 400 nm, such as from 120 nm to 300 nm, although lesser and greater thicknesses may be employed. In the alternative embodiment, the support openings 19 are formed at the same time as the memory openings 49 using the same patterned photoresist layer.

FIGS. 6A-6F are sequential vertical cross-sectional views of a memory opening 49 during formation of a memory opening fill structure 58 according to an embodiments of the present disclosure.

Figure 6B:
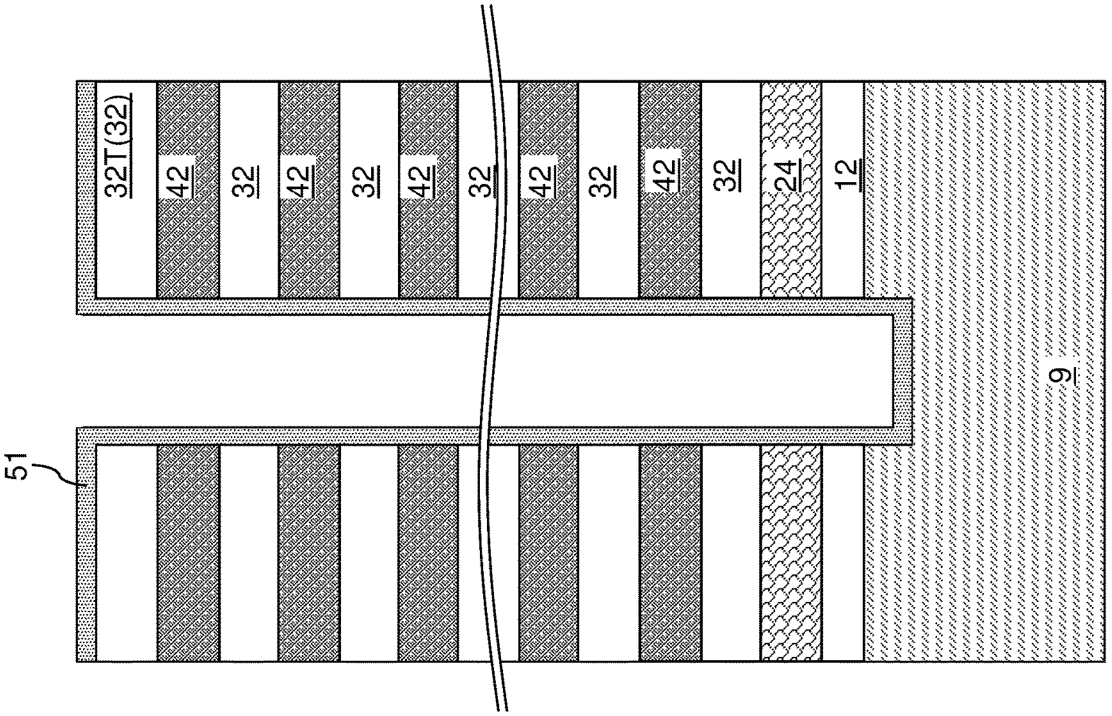
FIGS. 6A-6F are sequential vertical cross-sectional views of a memory opening during formation of a memory opening fill structure according to the first embodiments of the present disclosure.
Figure 6A:
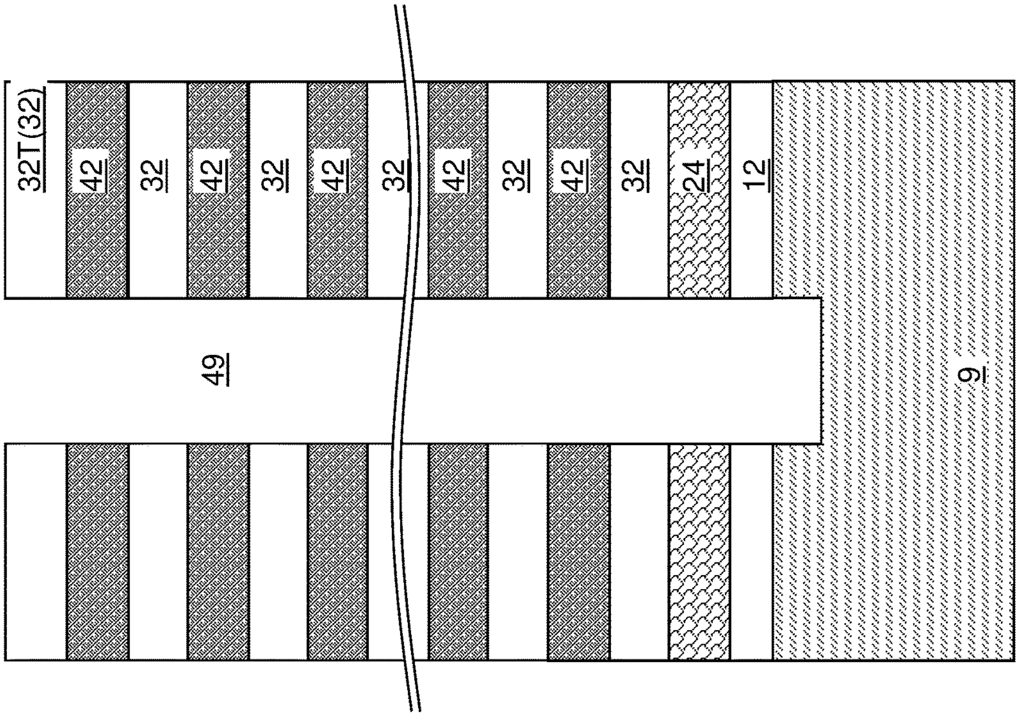

Referring to FIG. 6A, a memory opening 49 is illustrated after the processing steps of FIGS. 5A and 5B.

Referring to FIG. 6B, an aluminum nitride layer 51 can be conformally deposited on the physically exposed surfaces of the memory openings 49 and over the topmost insulating layer 32T. For example, the aluminum nitride layer 51 may be deposited by a chemical vapor deposition process, an atomic layer deposition process or a physical vapor deposition process. The aluminum nitride layer 51 may be stoichiometric or near-stoichiometric. In one embodiment, the atomic percentage of nitrogen atoms in the aluminum nitride layer 51 may be in a range from 48% to 50%, such as from 49.9% to 50%, and/or from 49.999% to 50%. Stoichiometric aluminum nitride includes nitrogen atoms at an atomic percentage of 50%. The thickness of the aluminum nitride layer 51 may be in a range from 2 nm to 10 nm, such as from 2.5 nm to 4 nm, although lesser and greater thicknesses may also be employed. The aluminum nitride layer 51 can contact sidewalls of the insulating layers 32, sacrificial material layers 42, the buried insulating layer 12 (if present), and the source-select-level semiconductor layer 24 (if present), and can contact a recessed surface of the carrier substrate 9. In one embodiment, the aluminum nitride layer 51 is in contact with a sidewall of each of the insulating layers 32.

Figure 6D:
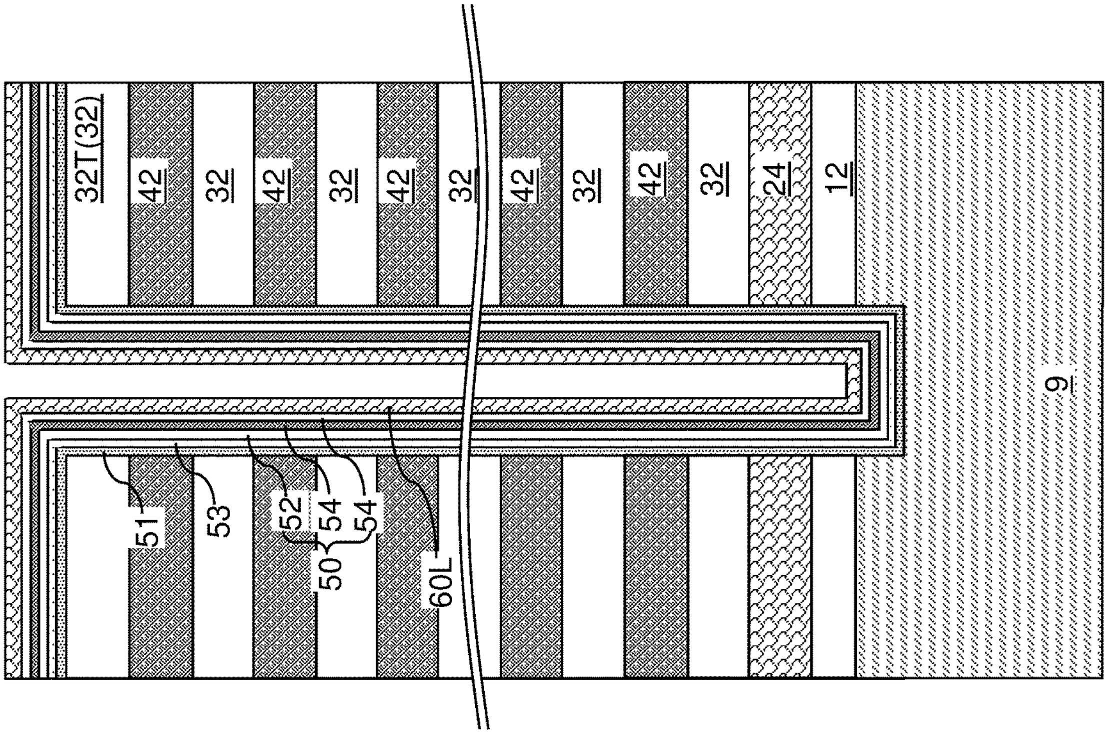
Figure 6C:
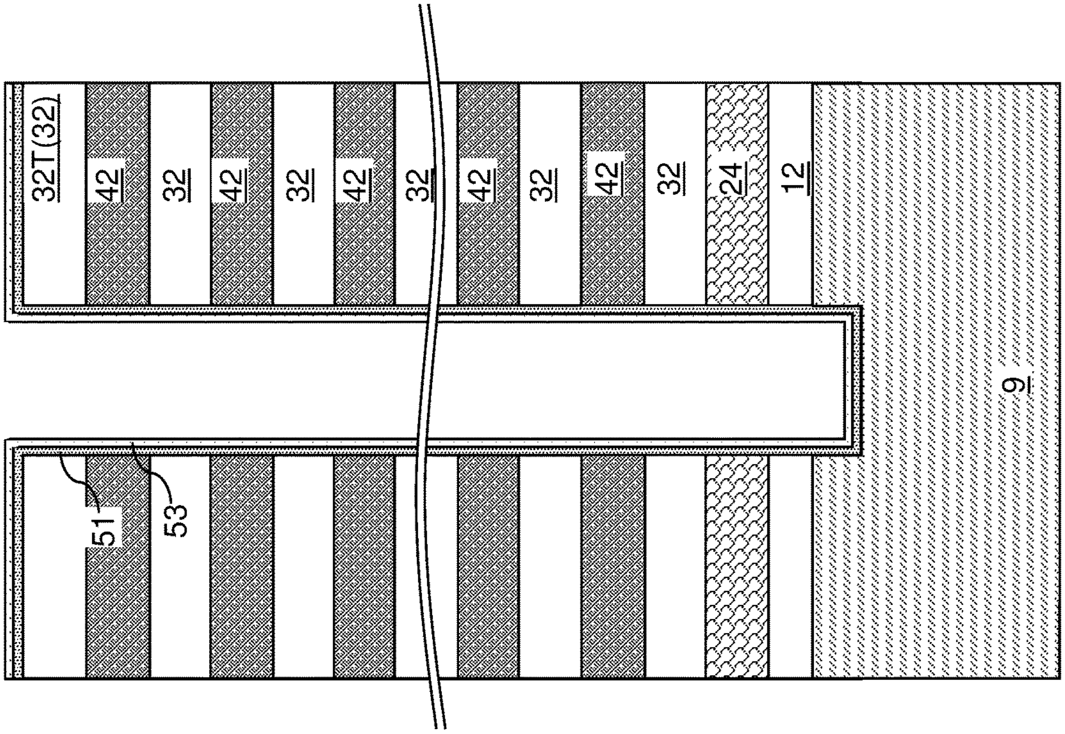

Referring to FIG. 6C, an oxidation process can be performed to convert physically exposed surface portions of the aluminum nitride layer 51 into an aluminum oxide layer 53. The aluminum oxide layer may be an undoped aluminum oxide layer which consists essentially of only aluminum and oxygen (e.g., $Al_2O_3$) or a nitrogen doped aluminum oxide layer (e.g., aluminum oxynitride layer) which contains 0.1 to 10 atomic percent nitrogen. The oxidation process may comprise a thermal oxidation process and/or a plasma oxidation process. The duration of the oxidation process is selected such that a continuous layer of aluminum nitride in proximity to the alternating stack (32, 42) is not converted into the aluminum oxide layer 53, and remains as a thinned aluminum nitride layer 51. The thinned aluminum nitride layer 51 may have a thickness in a range from 1 nm to 5 nm, such as from 1.5 nm to 3 nm, although lesser and greater thicknesses may also be employed. The thickness of the aluminum oxide layer 53 may be in a range from 1.5 nm to 5 nm, such as from 2 nm to 4 nm, although lesser and greater thicknesses may also be employed.

In one embodiment, in which the aluminum oxide layer 53 comprises a nitrogen doped aluminum oxide layer, the atomic concentration of nitrogen atoms in the nitrogen doped aluminum oxide layer 53 decreases with a distance from the aluminum nitride layer 51. For example, the atomic concentration of nitrogen atoms in the aluminum oxide layer 53 may decrease from about 10% to about 0.1%, and/or from about 5% to about 1%, with a distance from the aluminum nitride layer 51.

Referring to FIG. 6D, a memory film 50 can be formed directly on physically exposed surfaces of the aluminum oxide layer 53. The physically exposed surfaces of the aluminum oxide layer 53 include the inner sidewall of the aluminum oxide layer 53. The memory film 50 can generally include a layer stack containing a memory material layer 54. In an illustrative example, the layer stack may comprise an optional silicon oxide blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprises a charge storage material, the optional dielectric liner 56 may comprise a tunneling dielectric layer. In one embodiment, the memory material layer 54 may comprise a silicon nitride charge storage material layer.

The aluminum nitride layer 51 laterally surrounds the memory film 50. The aluminum oxide layer 53 is interposed between the aluminum nitride layer 51 and the memory film 50. The aluminum oxide layer 53 contacts an inner sidewall of the aluminum nitride layer 51 and contacts an outer sidewall of the memory film 50. In one embodiment, the aluminum oxide layer 53 comprises an outer blocking dielectric layer and the silicon oxide blocking dielectric layer 52 comprises an inner blocking dielectric layer. In this embodiment, the memory film 50 comprises a blocking dielectric layer 52 that is in contact with the aluminum oxide layer 53, a vertical stack of memory elements (comprising portions of the memory material layer 54) located at levels of the sacrificial material layers 42), and a dielectric liner 56 (which may comprise a tunneling dielectric layer). In another embodiment, the silicon oxide blocking dielectric layer 52 is omitted. In this embodiment, the memory film 50 comprises a vertical stack of memory elements (comprising portions of the memory material layer 54) located at levels of the sacrificial material layers 42 and in contact with the aluminum oxide layer (i.e., the blocking dielectric layer) 53, and a dielectric liner 56 (which may comprise a tunneling dielectric layer).

A semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type. In one embodiment, the atomic concentration of dopants of the first conductivity type in the semiconductor channel material layer 60L may be in a range from $1.0\times10^{14}/cm^3$ to $3.0\times10^{17}/cm^3$, although lesser and greater atomic concentrations may also be employed. The thickness of the semiconductor channel material layer 60L may be in a range from 5 nm to 50 nm, such as from 10 nm to 30 nm, although lesser and greater thicknesses may also be employed. In one embodiment, the combination of the memory film 50 and the semiconductor channel material layer 60L may have the same thickness as or be thinner than the buried insulating layer 12. The top surface of a horizontally-extending bottom portion of the semiconductor channel material layer 60L may be formed below, at or above, the horizontal plane including the top surface of the buried insulating layer 12.

Figure 6E:
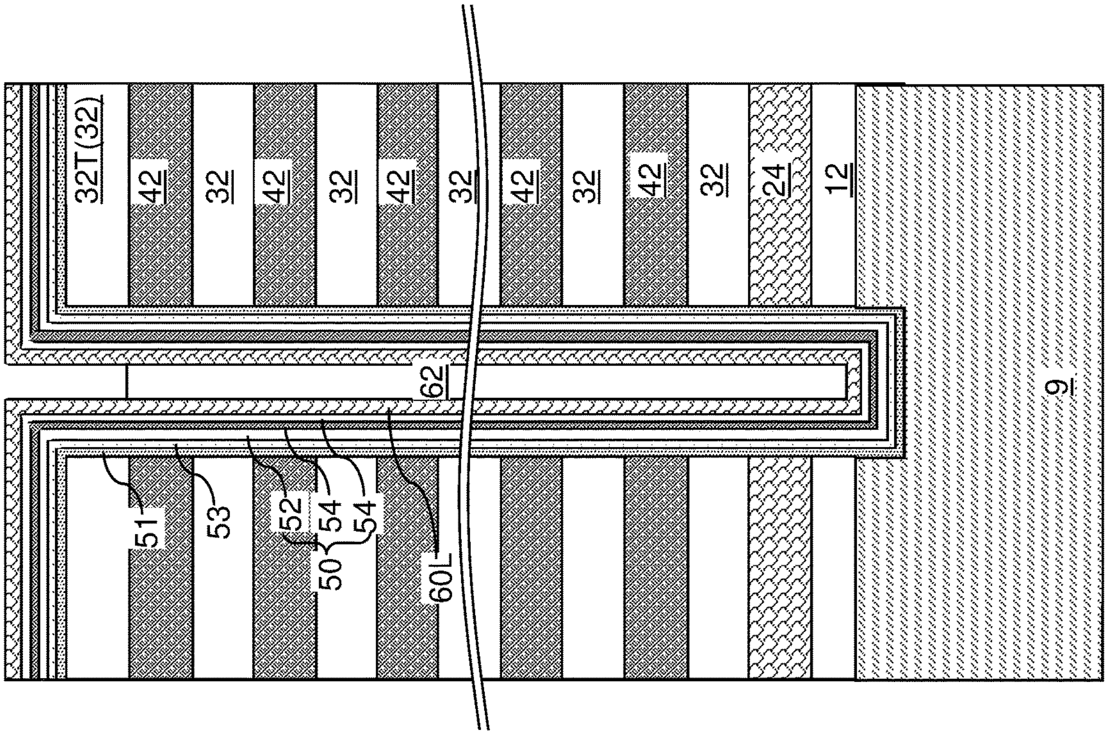

Referring to FIG. 6E, a dielectric core layer comprising a dielectric fill material, such as silicon oxide, can be deposited in remaining volumes of the memory openings 49. While the dielectric core layer can be deposited employing a conformal deposition process, such as a chemical vapor deposition process, the conformity of the conformal deposition process may not be perfect. Thus, the thickness of a bottom portion of the dielectric core layer at the bottom of each memory opening 49 may be less than the thickness of an upper portion of the dielectric core layer at the top of each memory opening 49. The dielectric core layer can be vertically recessed such that each remaining portion of the dielectric core layer has a top surface at, or about, the horizontal plane including the bottom surface of the topmost insulating layer 32T. Each remaining portion of the dielectric core layer constitutes a dielectric core 62.

Figure 6F:
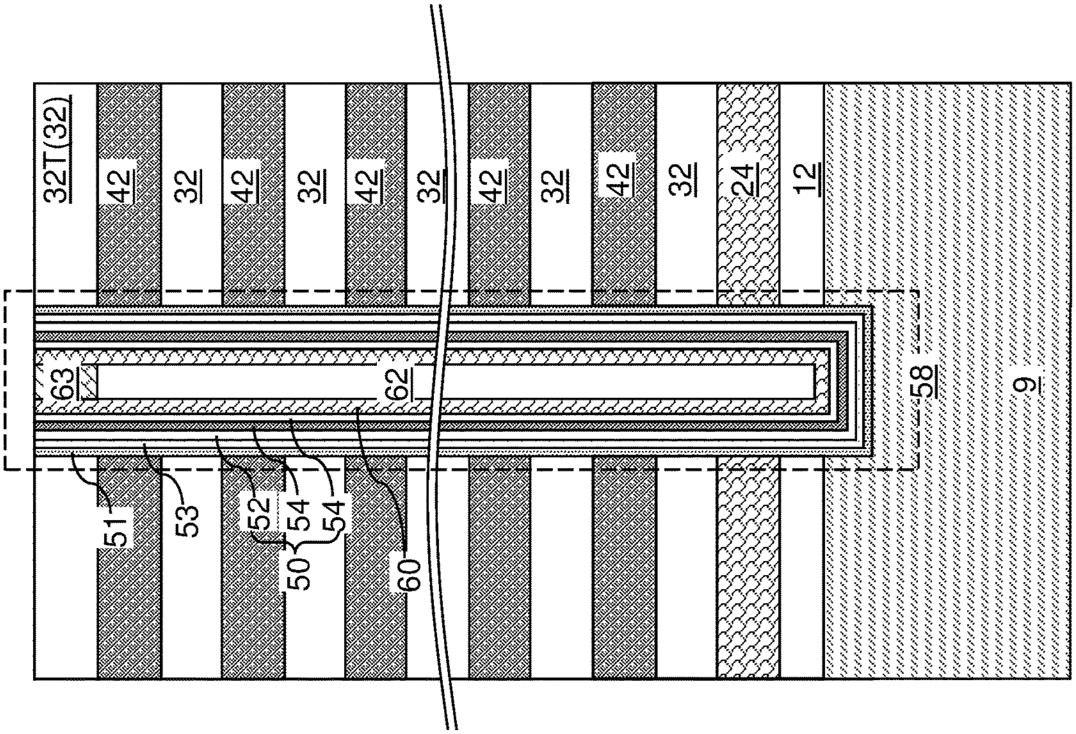

Referring to FIG. 6F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5\times10^{18}/cm^3$ to $2\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each contiguous combination of a memory film 50 and a vertical semiconductor channel 60 constitutes a memory stack structure 55. Each combination a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42. In the alternative embodiment, the support pillar structures 20 may be formed in the support openings 19 at the same time as the memory opening fill structures 58 are formed in the memory openings 49. In this case, the support pillar structures 20 comprise the same materials as the memory opening fill structures 58.

Figure 7A:
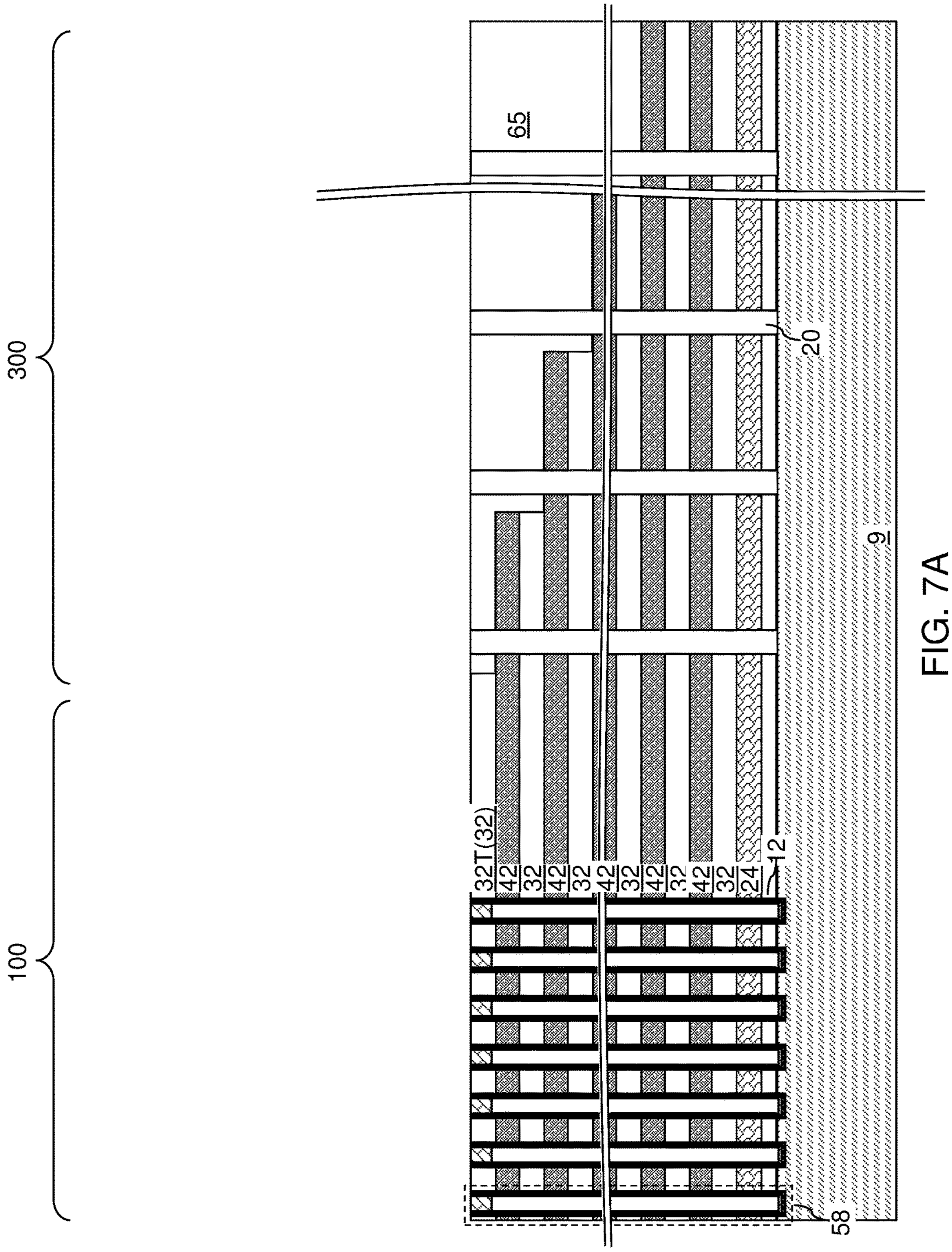
FIG. 7A is a schematic vertical cross-sectional view of the first exemplary structure after formation of memory opening fill structures according to the first embodiment of the present disclosure.
Figure 7B:
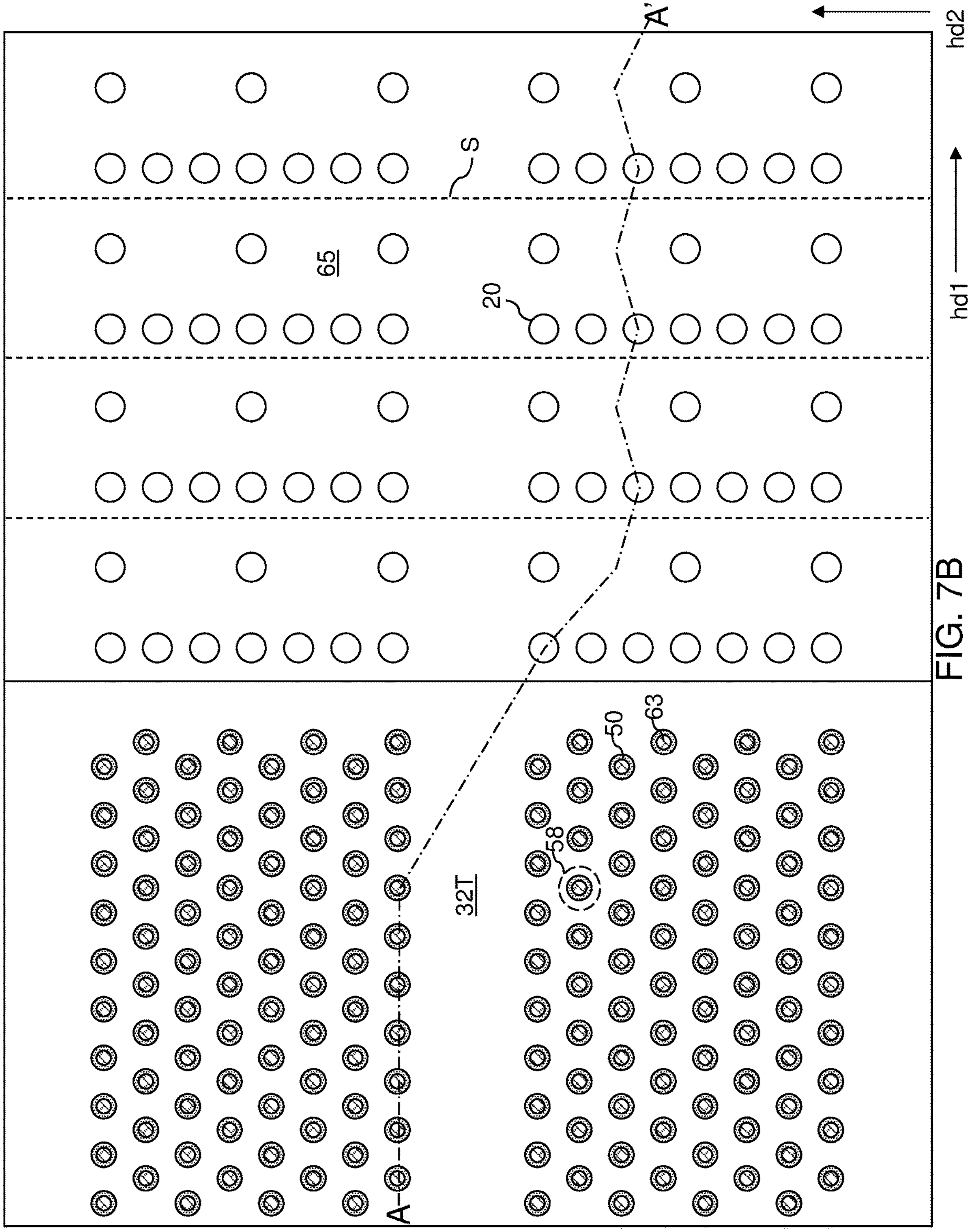
FIG. 7B is a top-down view of the first exemplary structure of FIG. 7A. The vertical plane A-A is the cut plane of the vertical cross-sectional view of FIG. 7A.

Referring to FIGS. 7A and 7B, the first exemplary structure is illustrated after formation of memory opening fill structures 58 within the memory openings 49. The memory opening fill structures 58 are located in the memory openings 49. Each of the memory opening fill structures 58 comprises a respective memory film 50 and a respective vertical semiconductor channel 60.

Figure 8A:
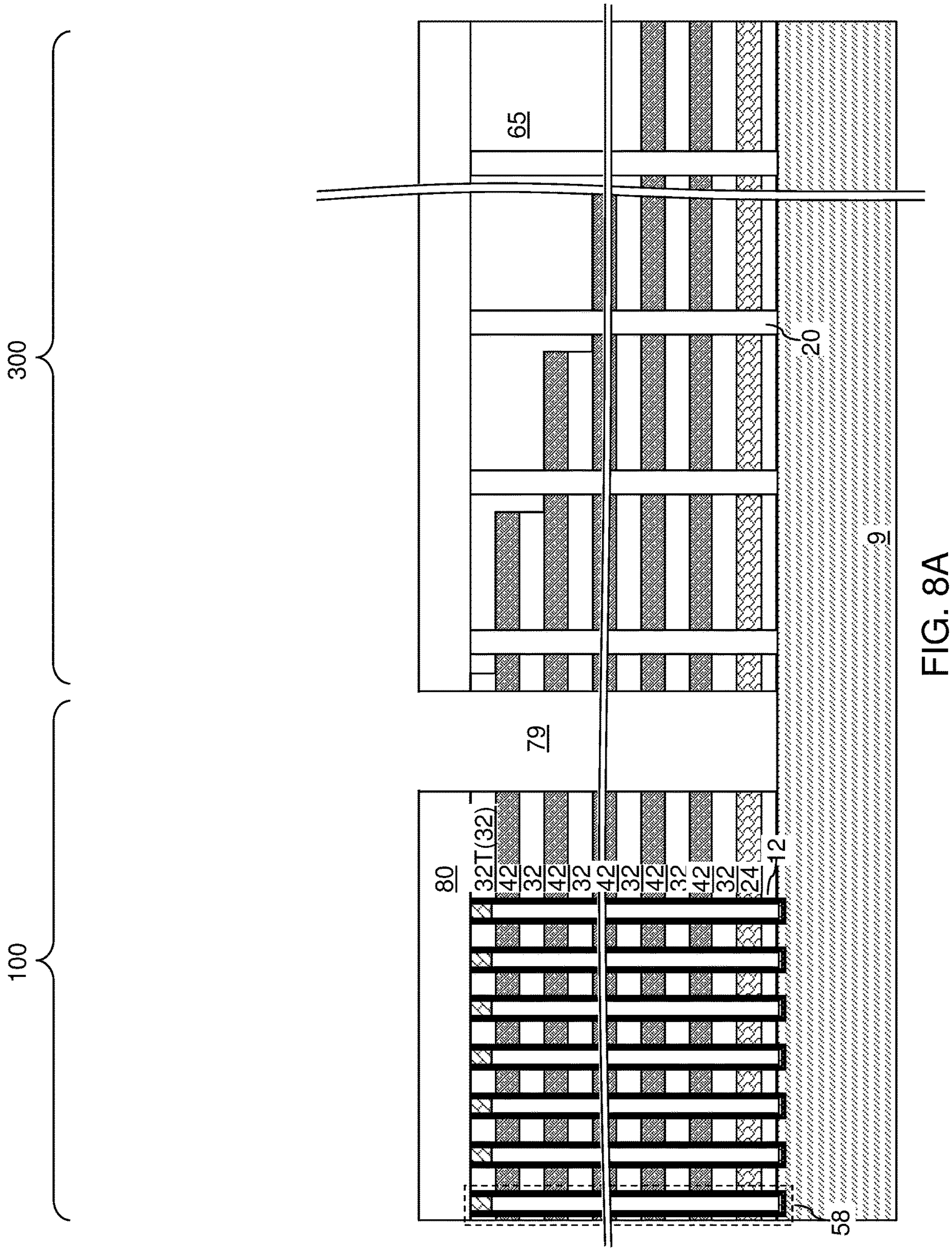
FIG. 8A is a vertical cross-sectional view of the first exemplary structure after formation of lateral isolation trenches according to the first embodiment of the present disclosure.
Figure 8B:
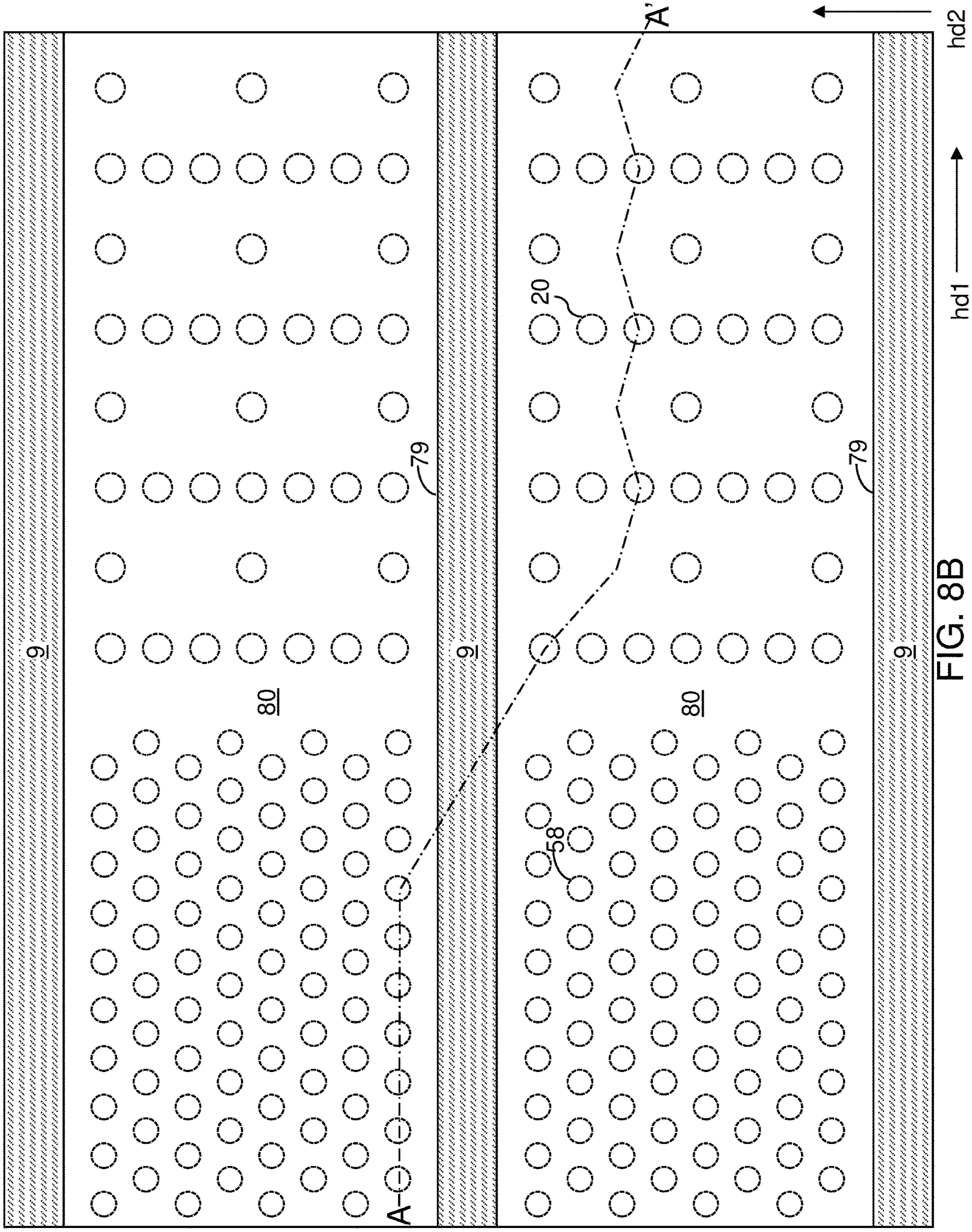
FIG. 8B is a top-down view of the first exemplary structure of FIG. 8A. The vertical plane A-A is the cut plane of the vertical cross-sectional view of FIG. 8A.
Figure 8C:
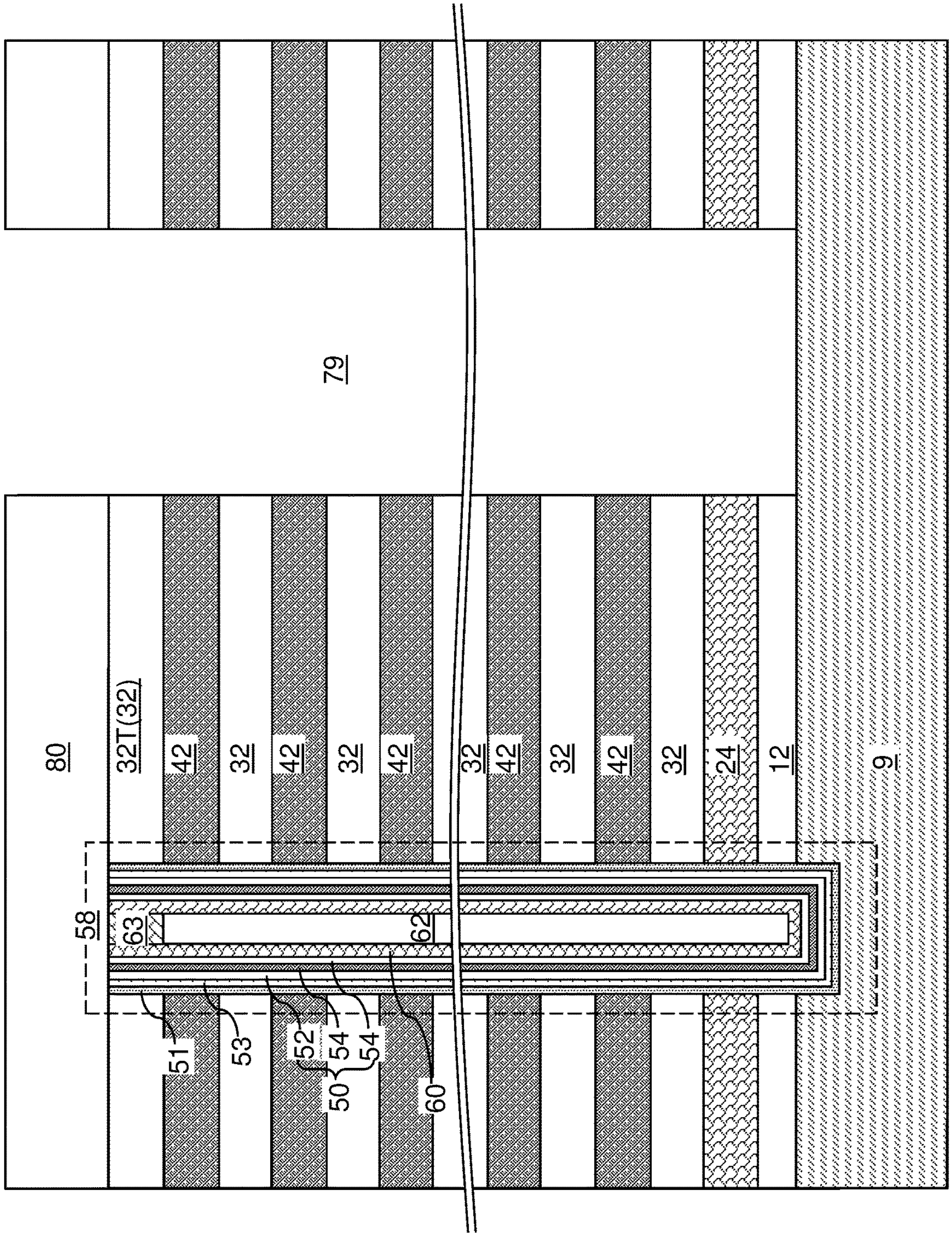
FIG. 8C is a magnified view of a region of the first exemplary structure in FIG. 8A.

Referring to FIGS. 8A-8C, a dielectric material, such as undoped silicate glass (i.e., silicon oxide) or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), and the stepped dielectric material portion 65, and to a top surface of the source-select-level semiconductor layer 24. Lateral isolation trenches 79 laterally extending along the first horizontal direction hd1 can be formed through the alternating stack (32, 42), the stepped dielectric material portion 65, and the contact-level dielectric layer 80. Each of the lateral isolation trenches 79 may comprise a respective pair of lengthwise sidewalls that are parallel to the first horizontal direction hd1 and vertically extend from the top surface of the contact-level dielectric layer 80 to the top surface of the source-select-level semiconductor layer 24. A surface of the source-select-level semiconductor layer 24 can be physically exposed underneath each lateral isolation trench 79. The photoresist layer can be subsequently removed, for example, by ashing.

Figure 9A:
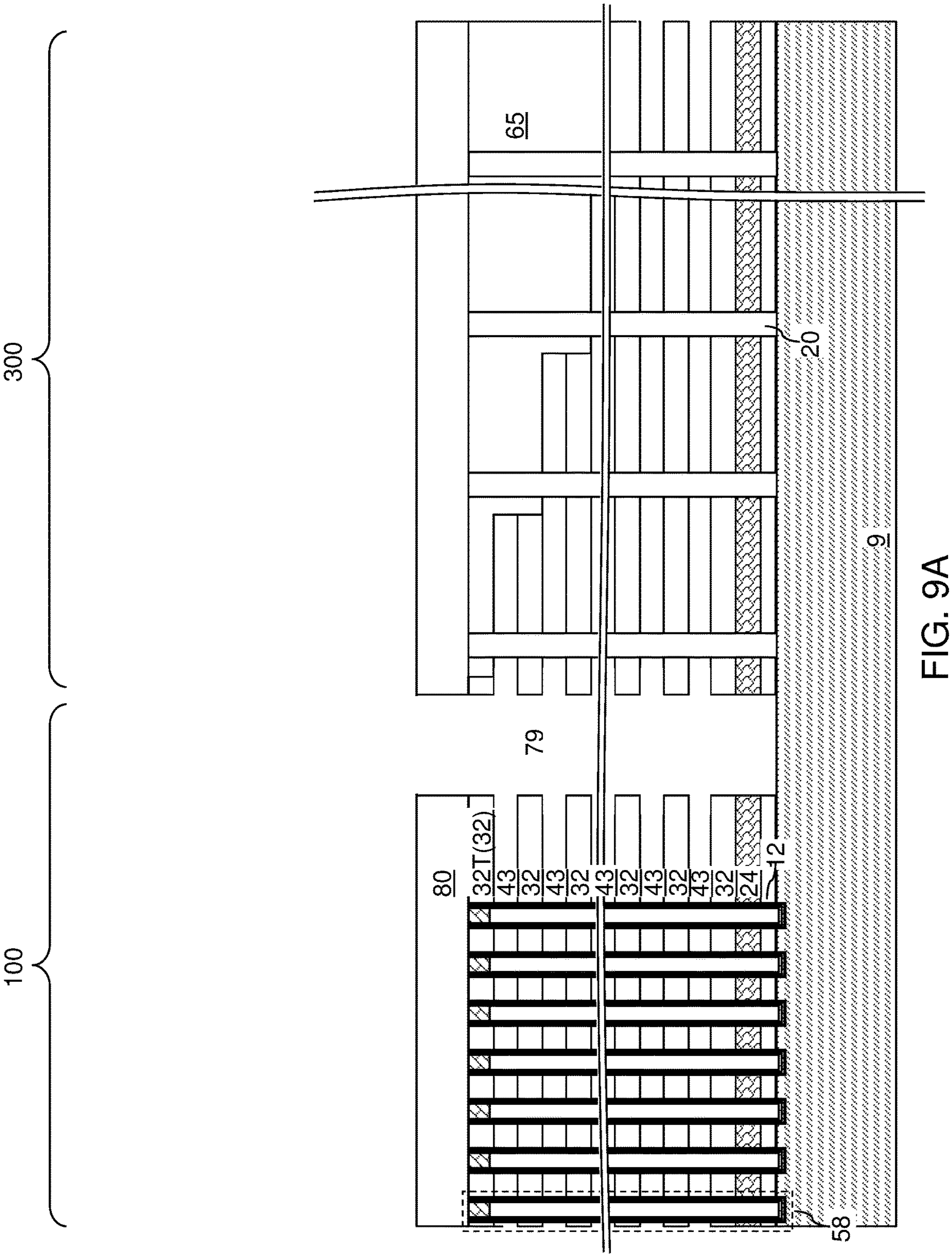
FIG. 9A is a vertical cross-sectional view of the first exemplary structure after formation of lateral recesses according to the first embodiment of the present disclosure.
Figure 9B:
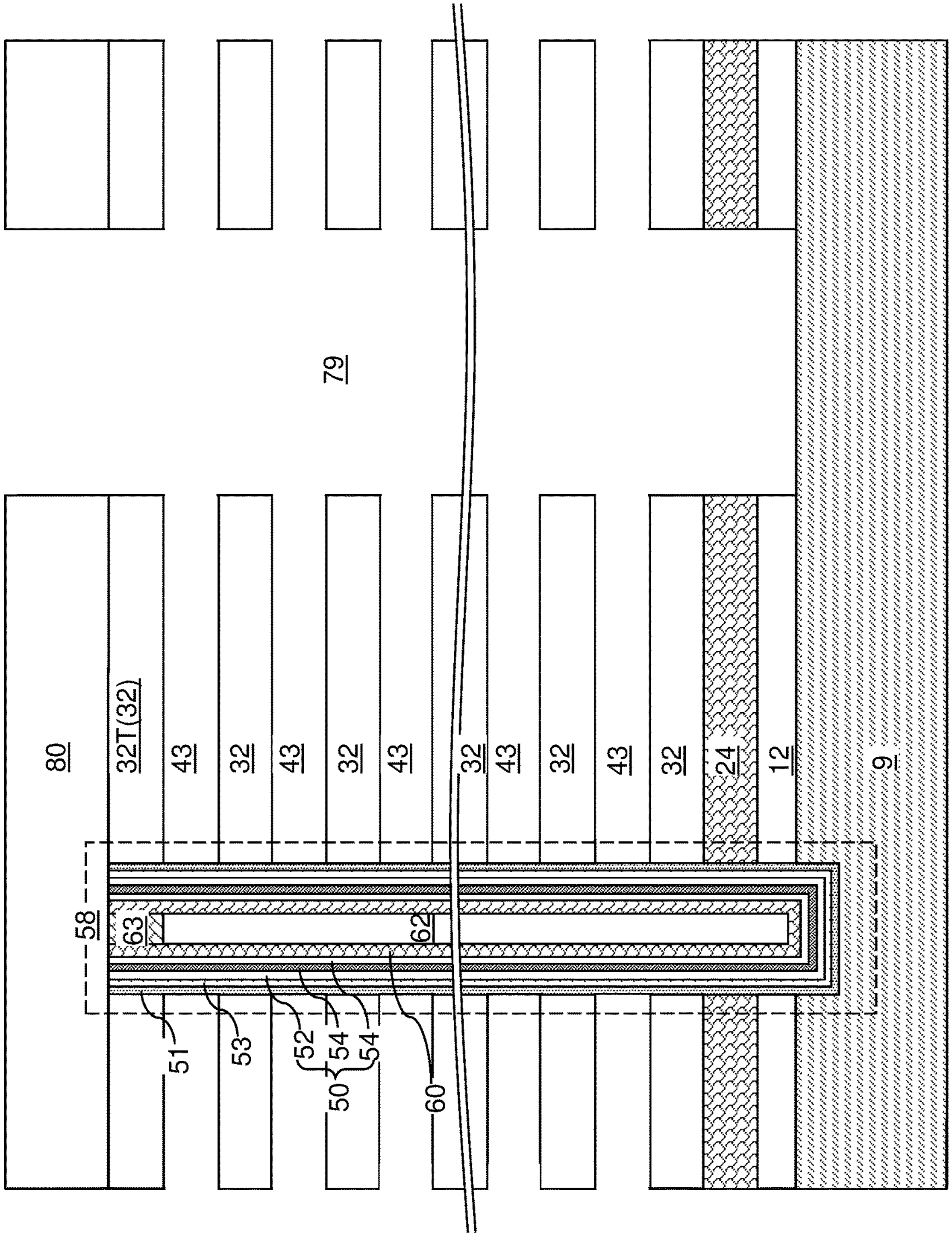
FIG. 9B is a magnified view of a region of the first exemplary structure of FIG. 9A.

Referring to FIGS. 9A and 9B, an etchant that selectively etches the material of the sacrificial material layers 42 with respect to the material of the insulating layers 32 and the aluminum nitride layers 51 can be introduced into the lateral isolation trenches 79, for example, employing an isotropic etch process. Lateral recesses 43 are formed in volumes from which the sacrificial material layers 42 are removed. The removal of the sacrificial material layers 42 can be selective to the materials of the insulating layers 32, the stepped dielectric material portion 65, and the material of the outermost layer of the memory films 50. In one embodiment, the sacrificial material layers 42 can include silicon nitride, and the materials of the insulating layers 32 and the stepped dielectric material portion 65 can include silicon oxide.

The etch process that removes the second material of the sacrificial material layers 42 selective to the first material of the insulating layers 32 and the aluminum nitride layers 51 can be a wet etch process employing a wet etch solution, or can be a gas phase (dry) etch process in which the etchant is introduced in a vapor phase into the lateral isolation trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings in which the memory stack structures 55 are formed are herein referred to as front openings or front cavities in contrast with the lateral recesses 43. Each of the plurality of lateral recesses 43 can extend substantially parallel to the top surface of the carrier substrate 9. A lateral recess 43 can be vertically bounded by a top surface of an underlying insulating layer 32 and a bottom surface of an overlying insulating layer 32. In one embodiment, each lateral recess 43 can have a uniform height throughout.

Figure 10A:
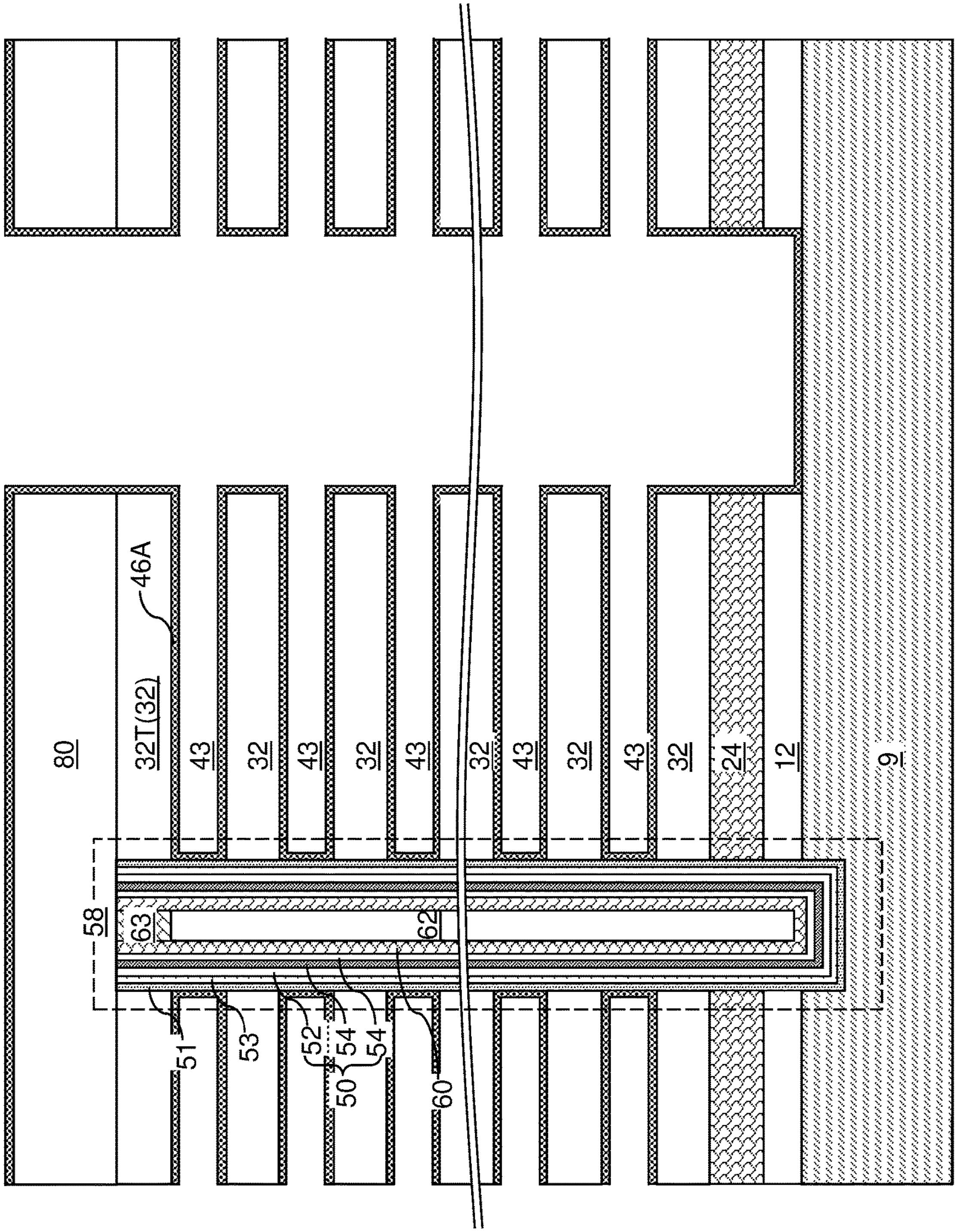
FIGS. 10A-10C are sequential vertical cross-sectional views of a region of the first exemplary structure during formation of electrically conductive layers according to the first embodiment of the present disclosure.
Figure 10B:
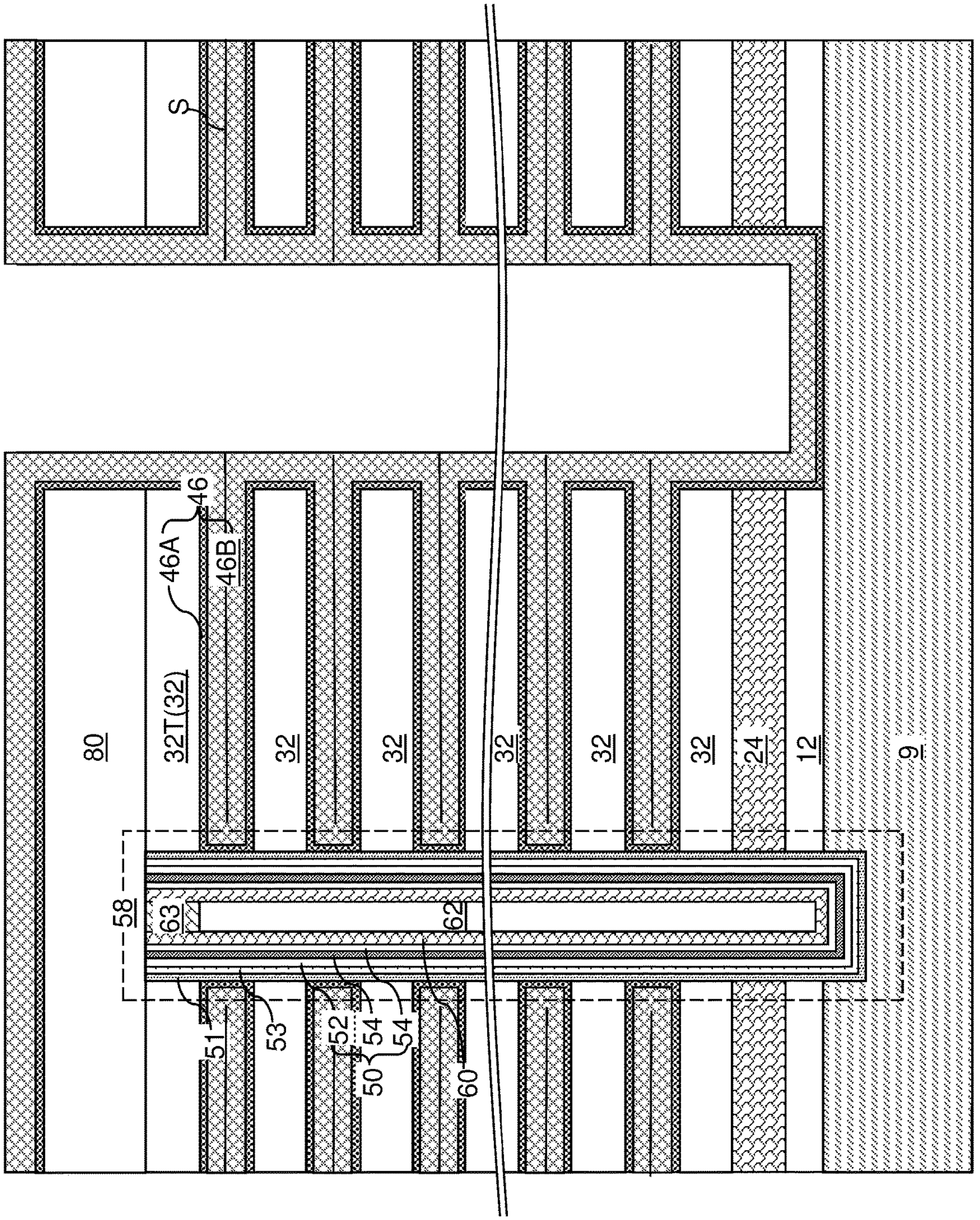
Figure 10C:
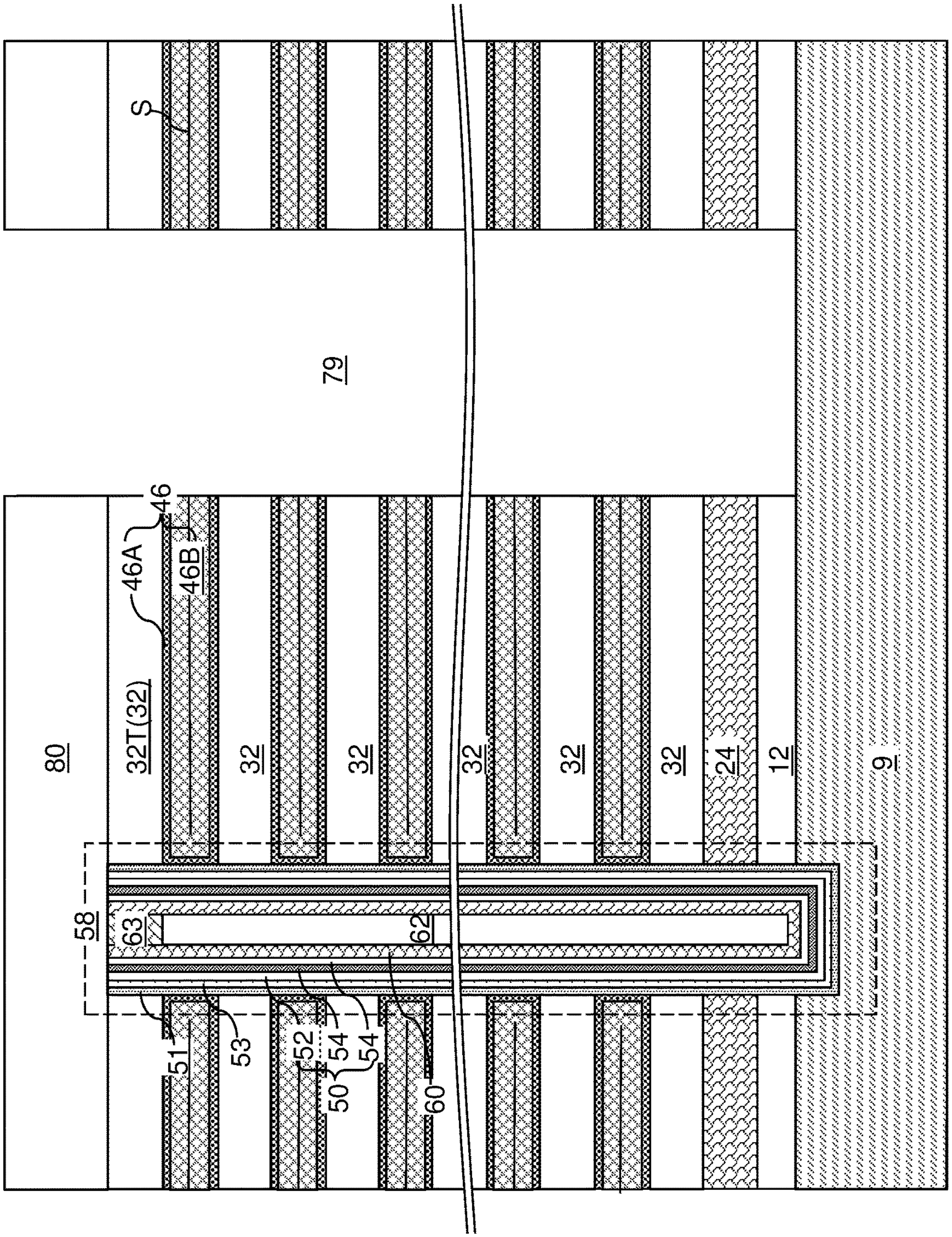

FIGS. 10A-10C are sequential vertical cross-sectional views of a region of the first exemplary structure during formation of electrically conductive layers 46 according the first embodiment of the present disclosure.

Referring to FIG. 10A, a metallic nitride barrier layer 46A can be deposited in the lateral recesses 43. The metallic nitride barrier layer 46A includes an electrically conductive metallic material that can function as a diffusion barrier layer and/or adhesion promotion layer for a metallic fill material to be subsequently deposited. The metallic nitride barrier layer 46A can include a conductive metallic nitride material such as WN, WBN, TiN, TaN, MON, or a stack thereof. In one embodiment, the metallic nitride barrier layer 46A can be deposited by a conformal deposition process such as chemical vapor deposition (CVD) or atomic layer deposition (ALD). The thickness of the metallic nitride barrier layer 46A can be in a range from 2 nm to 8 nm, such as from 3 nm to 6 nm, although lesser and greater thicknesses can also be employed.

In one embodiment, the metallic nitride barrier layer 46A can comprise a boron-doped metallic nitride material such as boron-doped tungsten nitride (i.e., tungsten boronitride, WBN), boron-doped titanium nitride (i.e., titanium boronitride, TiBN), boron-doped tantalum nitride (i.e., tantalum boronitride, TaBN), and/or boron-doped molybdenum nitride (i.e., molybdenum boronitride, MoBN). Boron doping of a metallic nitride material can increase effectiveness of the metallic nitride material as a diffusion barrier layer for impurity atoms such as fluorine atoms. Further, boron doping of the metallic nitride material may increase the step coverage (i.e., conformity) of the metallic nitride barrier layer 46A, may reduce mechanical stress generated by the metallic nitride barrier layer 46A, and may reduce the RC delay of electrically conductive layers to be subsequently formed. Generally, the metallic nitride barrier layer 46A comprises a conductive compound of a transition metal, boron, and nitrogen. The atomic concentration of boron atoms in the metallic nitride barrier layer 46A may be in a range from 0.01% to 10%, such as from 0.1% to 4%, although lesser and greater atomic concentrations may also be employed.

Despite the advantages that a boron-doped metallic nitride barrier layer 46A can provide relative to a boron-free metallic nitride barrier layer, the boron-doped metallic nitride material can induce adverse effects, such as poor data retention if boron atoms diffuse into memory films 50.

According to an aspect of the present disclosure, the aluminum nitride layers 51 in the memory opening fill structures 58 function as effective diffusion barrier structures that prevent or reduce boron diffusion from the boron-doped metallic nitride barrier layer 46A into the memory films 50. Thus, the adverse impacts of boron doping the metallic nitride barrier layer 46A can be avoided or reduced through use of the aluminum nitride layers 51. In addition, the aluminum oxide layer 53 formed by oxidation of the aluminum nitride layer provides a lower leakage and improved performance compared to an aluminum oxide blocking dielectric layer formed by deposition of an aluminum oxide layer into the memory opening 49.

Referring to FIG. 10B, a metal fill material is deposited in the plurality of lateral recesses 43, on the sidewalls of the at least one the lateral isolation trench 79, and over the top surface of the contact-level dielectric layer 80 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer can be selected, for example, from tungsten, cobalt, ruthenium, titanium, tantalum, and/or molybdenum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic nitride barrier layer 46A that blocks diffusion of fluorine atoms therethrough. In one embodiment, the duration of the deposition process that deposits the metallic fill material layer 46B can be selected such that an optional horizontally-extending seam S is formed within each lateral recess 43. A plurality of electrically conductive layers can be formed in the plurality of lateral recesses 43, and a continuous metallic material layer can be formed on the sidewalls of each lateral isolation trench 79 and over the contact-level dielectric layer 80. The continuous metallic material layer includes a continuous portion of the metallic nitride barrier layer 46A and a continuous portion of the metallic fill material layer 46B that are located in the lateral isolation trenches 79 or above the contact-level dielectric layer 80.

Referring to FIG. 10C, the deposited metallic material of the continuous electrically conductive material layer is etched back from the sidewalls of each lateral isolation trench 79 and from above the contact-level dielectric layer 80 by performing an isotropic etch process that etches the at least one conductive material of the continuous electrically conductive material layer. Each remaining portion of the deposited metallic material in the lateral recesses 43 constitutes an electrically conductive layer 46. Each electrically conductive layer 46 can be a conductive line structure. Thus, the sacrificial material layers 42 are replaced with the electrically conductive layers 46. Generally, the electrically conductive layers 46 can be formed by providing a metallic precursor gas into the lateral isolation trenches 79 and into the lateral recesses 43. Each electrically conductive layer 46 includes a metallic nitride barrier layer 46A and a metallic fill material layer 46B. Each electrically conductive layer 46 is formed in the respective lateral recess 43 located between a vertically neighboring pair of insulating layers 32.

At least one uppermost electrically conductive layer 46 may comprise a drain side select gate electrode. At least one bottommost electrically conductive layer 46 may comprise a source side select gate electrode. The remaining electrically conductive layers 46 may comprise word lines. Each word line functions as a common control gate electrode for the plurality of vertical NAND strings (e.g., memory opening fill structures 58).

Generally, the sacrificial material layers 42 can be replaced with the electrically conductive layers 46. In one embodiment, each of the electrically conductive layers 46 comprises a metallic nitride barrier layer 46A that is in contact with a respective cylindrical segment of an outer sidewall of the aluminum nitride layer 51. In one embodiment, the metallic nitride barrier layer 46A comprises boron atoms at an average atomic concentration in a range from 0.01% to 10%. In one embodiment, each of the electrically conductive layers 46 comprises a metallic fill material layer 46B contacting a bottom surface of an upper horizontally-extending portion of the metallic nitride barrier layer 46A, contacting a top surface of a lower horizontally-extending portion of the metallic nitride barrier layer 46A, and contacting a cylindrical outer surface of a tubular portion of the metallic nitride barrier layer 46A. In one embodiment, the metallic fill material layer 46B consists essentially of an elemental metal (e.g., Co, Ru, W, Mo, etc.). In one embodiment, each aluminum nitride layer 51 is in contact with sidewalls of a plurality of the electrically conductive layers 46.

Figure 11A:
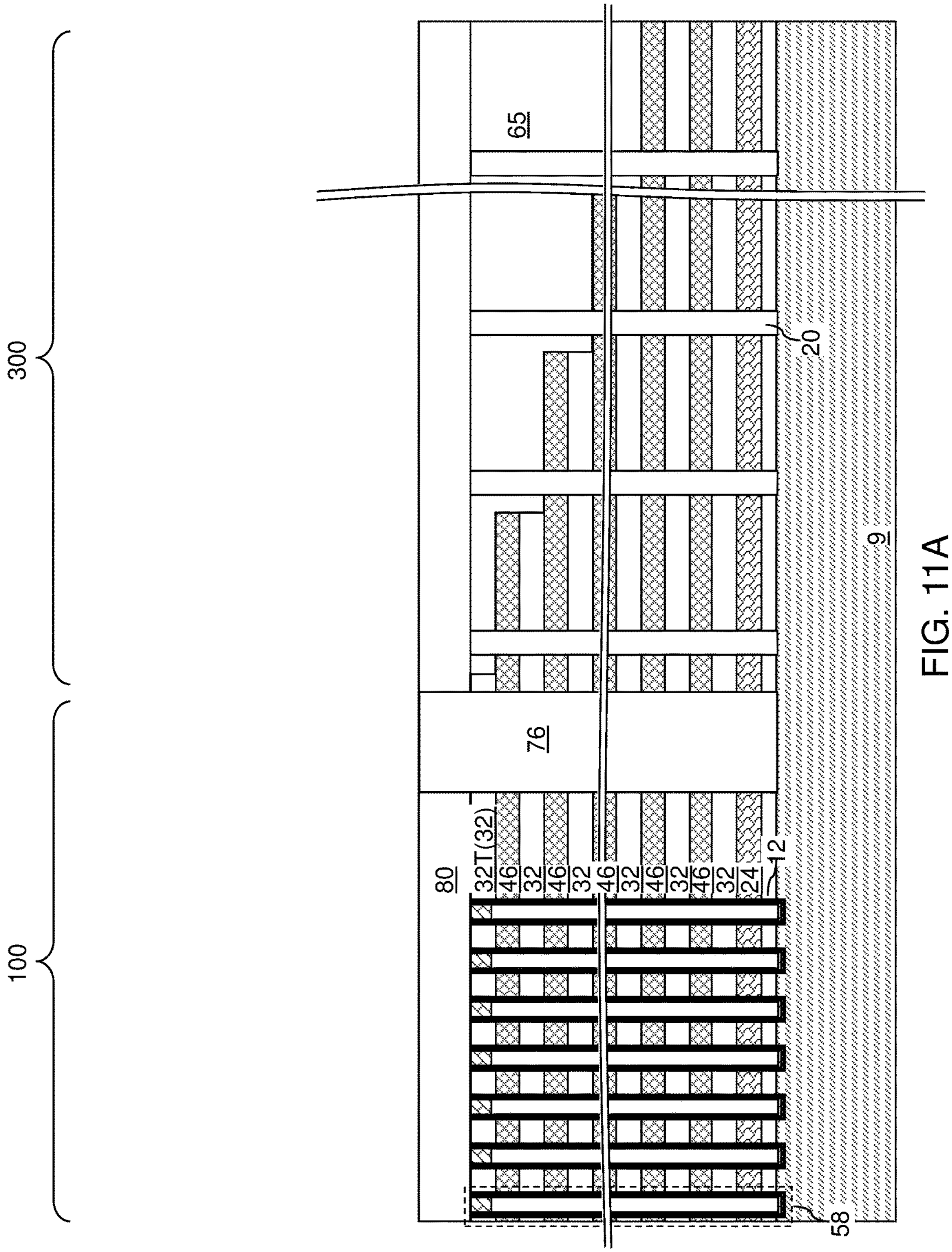
FIG. 11A is a vertical cross-sectional view of the first exemplary structure after formation of lateral isolation trench fill structures, layer contact via structures, and drain contact via structures according to the first embodiment of the present disclosure.
Figure 11B:
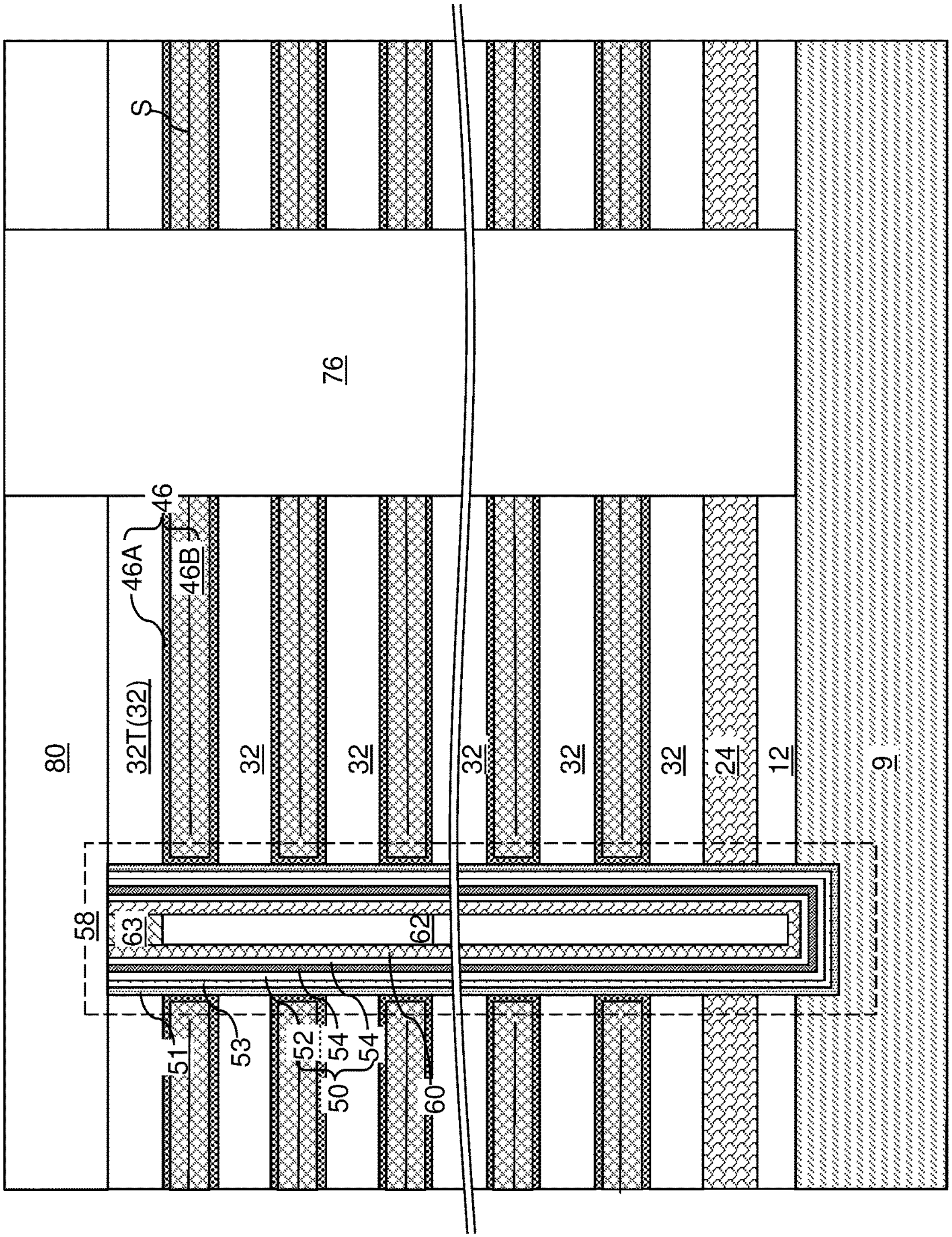
FIG. 11B is a magnified view of a region of the first exemplary structure of FIG. 11A.

Referring to FIGS. 11A and 11B, a dielectric fill material, such as silicon oxide can be deposited in the lateral isolation trenches 79. Excess portions of the dielectric fill material can be removed from above the contact-level dielectric layer 80. Each remaining portion of the dielectric fill material that fills a respective one of the lateral isolation trenches 79 constitutes a lateral isolation trench fill structure 76, which may be a dielectric wall structure. In an alternative embodiment, an insulating spacer having a tubular configuration can be formed in peripheral portions of each of the lateral isolation trenches 79, and a through-stack conductive via structure may be formed within a respective one of the insulating spacers. In this case, each lateral isolation trench fill structure 76 may comprise a combination of a through-stack conductive via structure and an insulating spacer that laterally surrounds the through-stack conductive via structure.

Figure 12A:
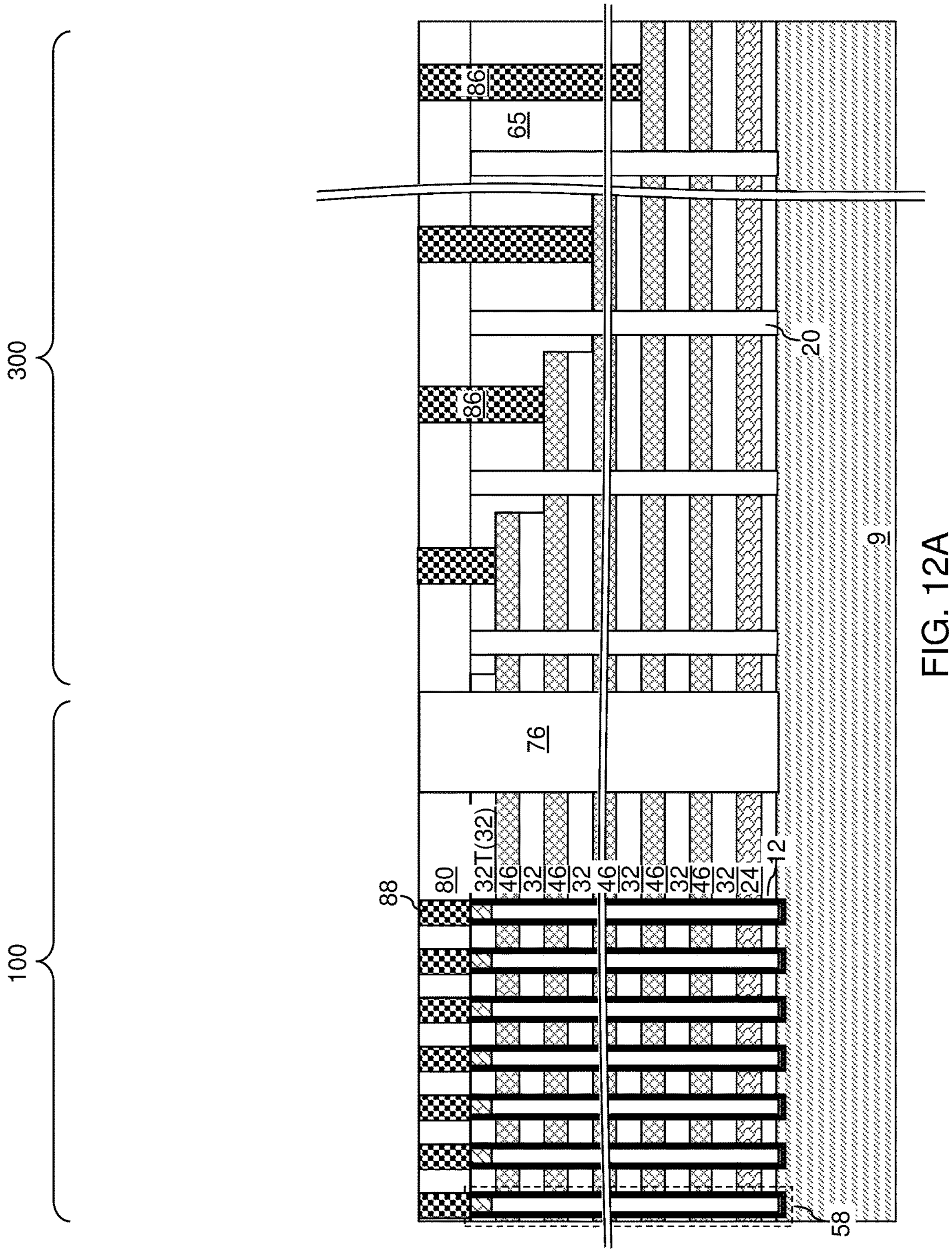
FIG. 12A is a vertical cross-sectional view of the first exemplary structure after formation of layer contact via structures and drain contact via structures according to the first embodiment of the present disclosure.
Figure 12B:
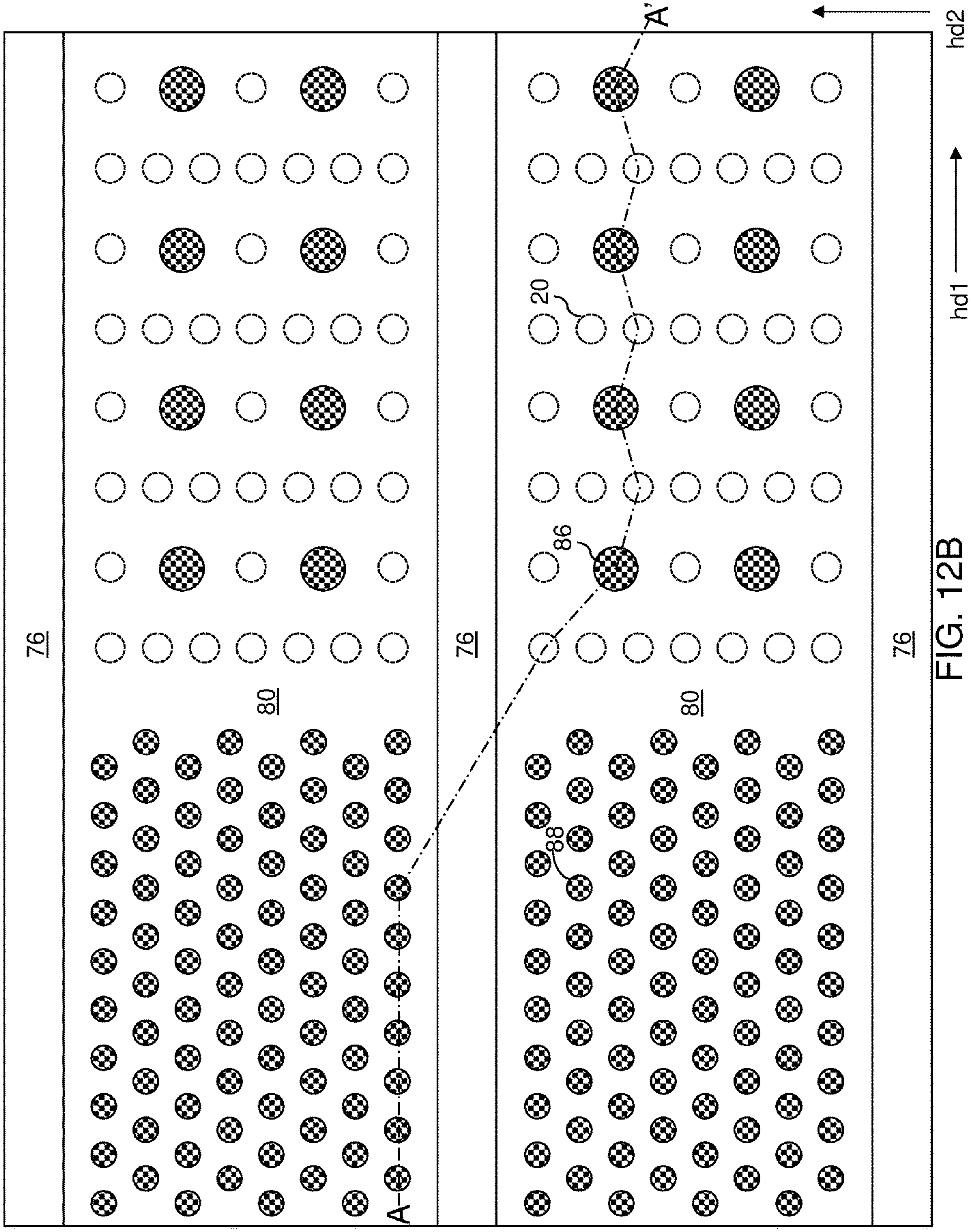
FIG. 12B is a top-down view of the first exemplary structure of FIG. 12A. The vertical plane A-A is the cut plane of the vertical cross-sectional view of FIG. 12A.

Referring to FIGS. 12A and 12B, contact via structures (88, 86) can be formed through the contact-level dielectric layer 80, and optionally through the stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the stepped dielectric material portion 65.

Figure 13:
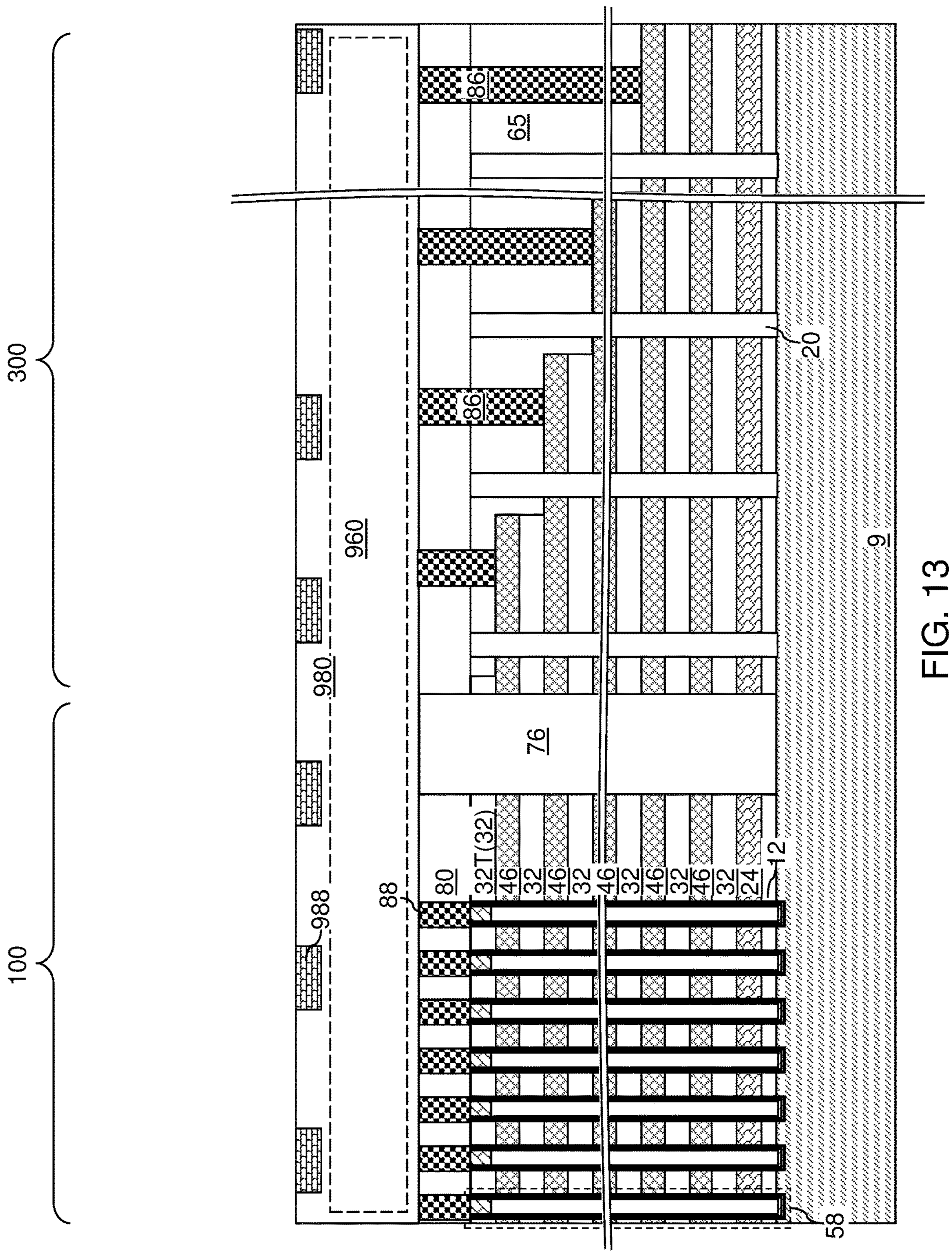
FIG. 13 is a vertical cross-sectional view of the first exemplary structure after formation of a memory die according to the first embodiment of the present disclosure.

Referring to FIG. 13, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to as upper bonding pads 988 or memory-side bonding pads 988, may be formed at the topmost level of the memory-side dielectric material layers 960. The upper bonding pads 988 may be electrically connected to the memory-side metal interconnect structures 980 and various nodes of the three-dimensional memory array including the electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; and a two-dimensional array of contact via structures (such as the drain contact via structures 88) overlying the three-dimensional memory array and electrically connected to a respective one of the vertical semiconductor channels 60.

Figure 14:
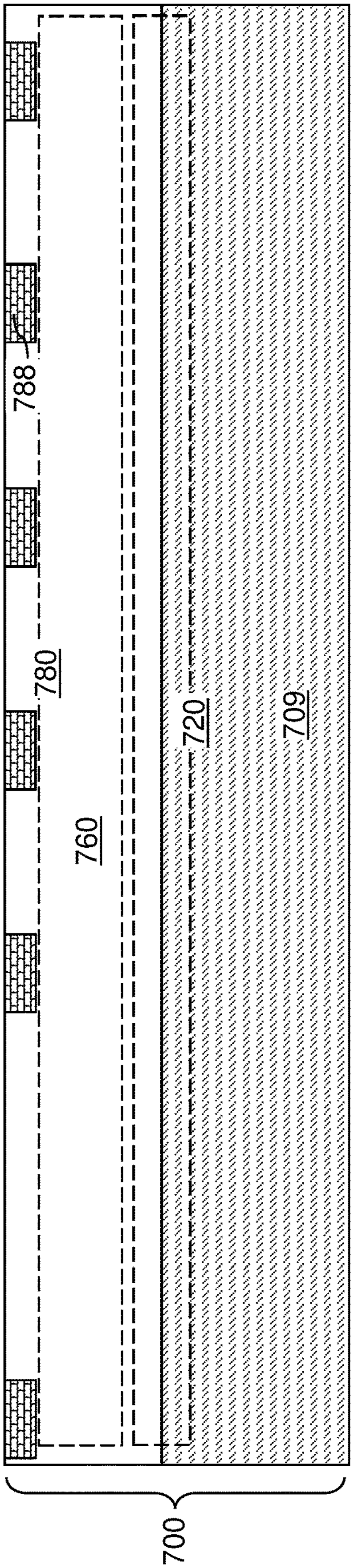
FIG. 14 is a vertical cross-sectional view of a logic die according to the first embodiment of the present disclosure.

Referring to FIG. 14, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 778. The peripheral circuit 720 can be configured to control operation of the memory array within the memory die 900. Specifically, the peripheral circuit 720 can be configured to drive various electrical components within the memory array including, but not limited to, the electrically conductive layers 46, the drain regions 63, and a source contact structure to be subsequently formed. The peripheral circuit 720 can be configured to control operation of the vertical stack of memory elements in the memory array in the memory die 900.

Figure 15:
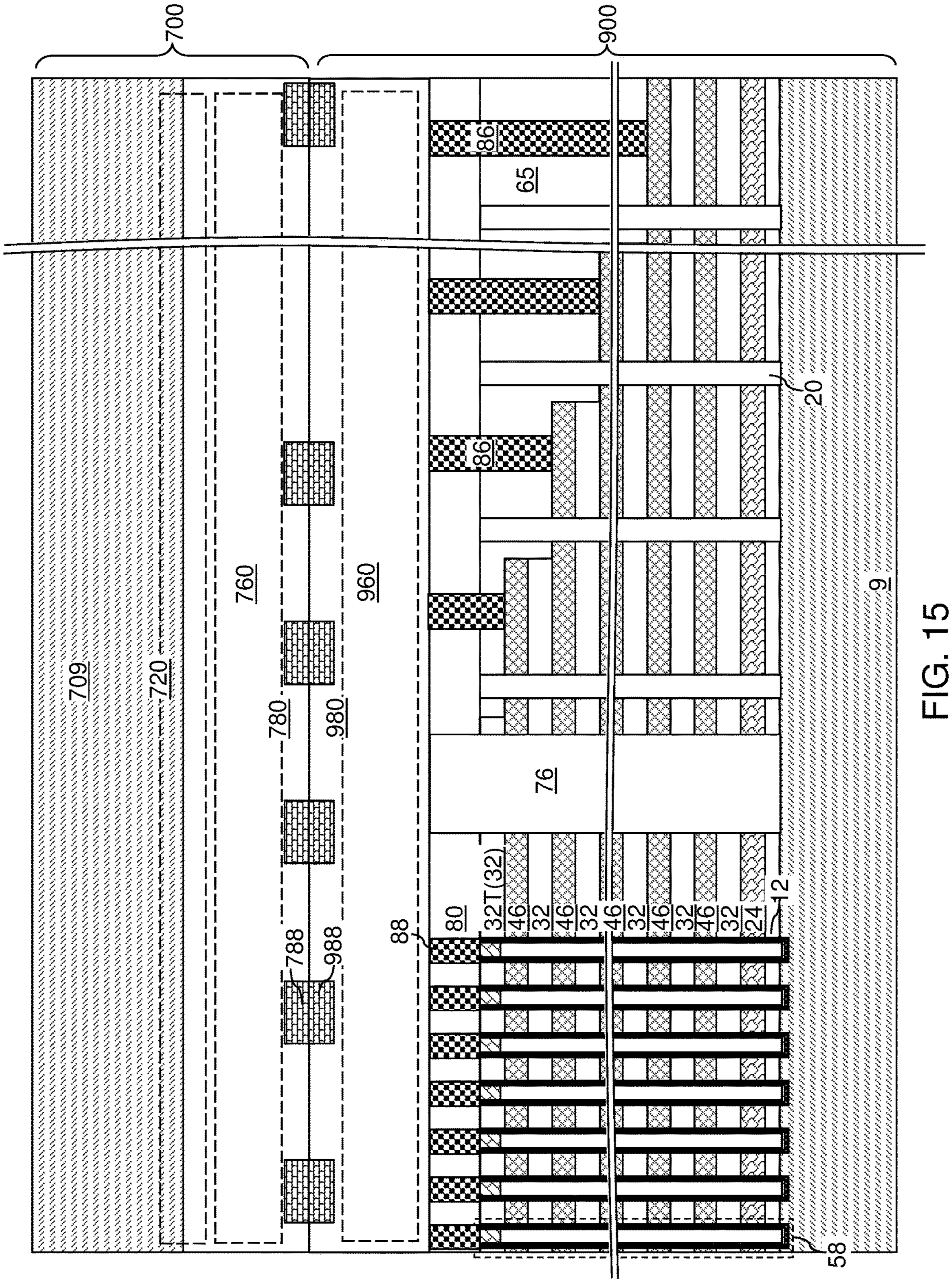
FIG. 15 is a vertical cross-sectional view of the first exemplary structure after attaching the logic die to the memory die according to the first embodiment of the present disclosure.

Referring to FIG. 15, the logic die 700 can be attached to the memory die 900, for example, by bonding the logic-side bonding pads 788 to the memory-side bonding pads 988 at a bonding interface. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 16A:
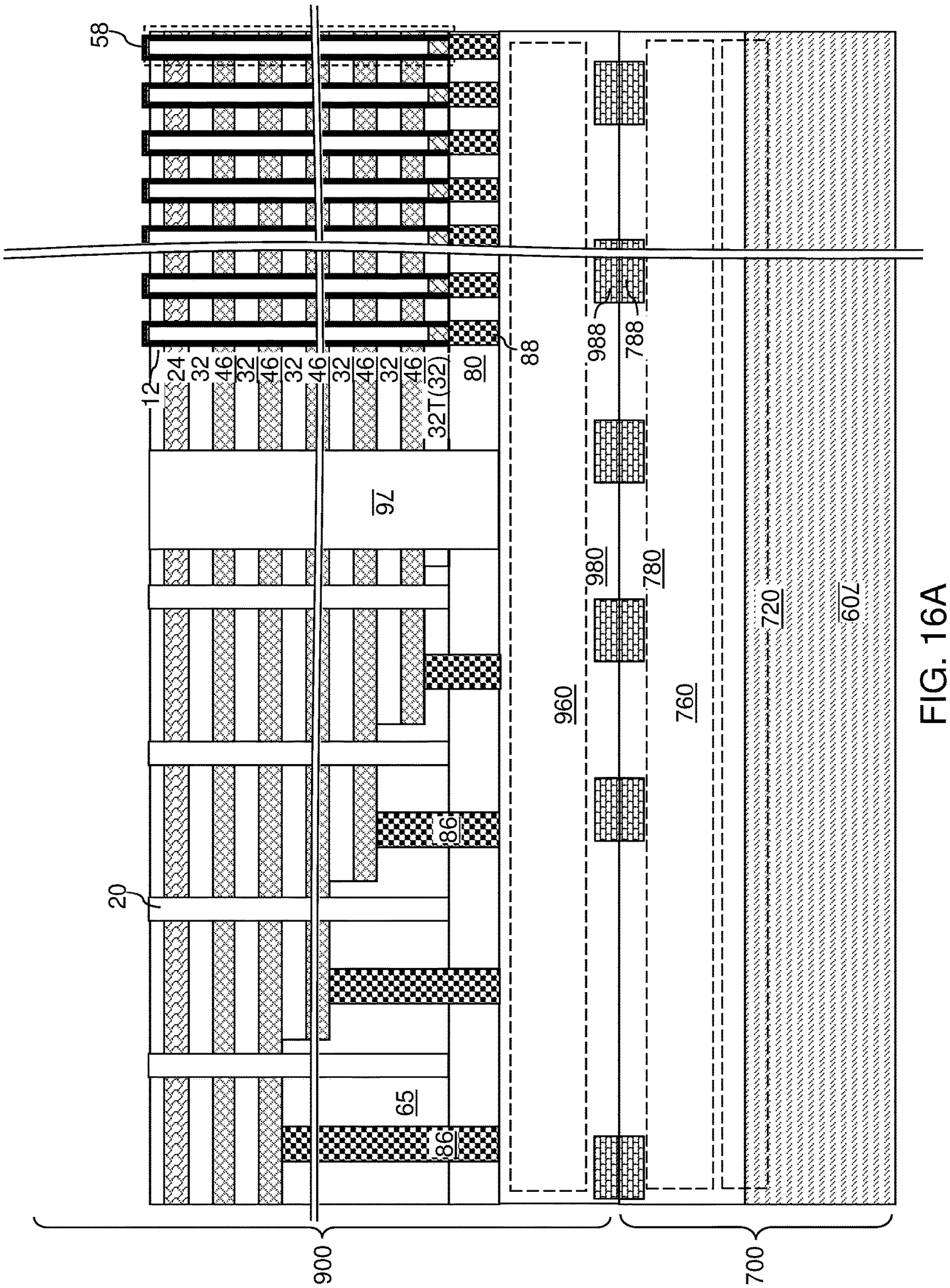
FIG. 16A is a vertical cross-sectional view of the first exemplary structure after removal of the carrier substrate according to the first embodiment of the present disclosure.
Figure 16B:
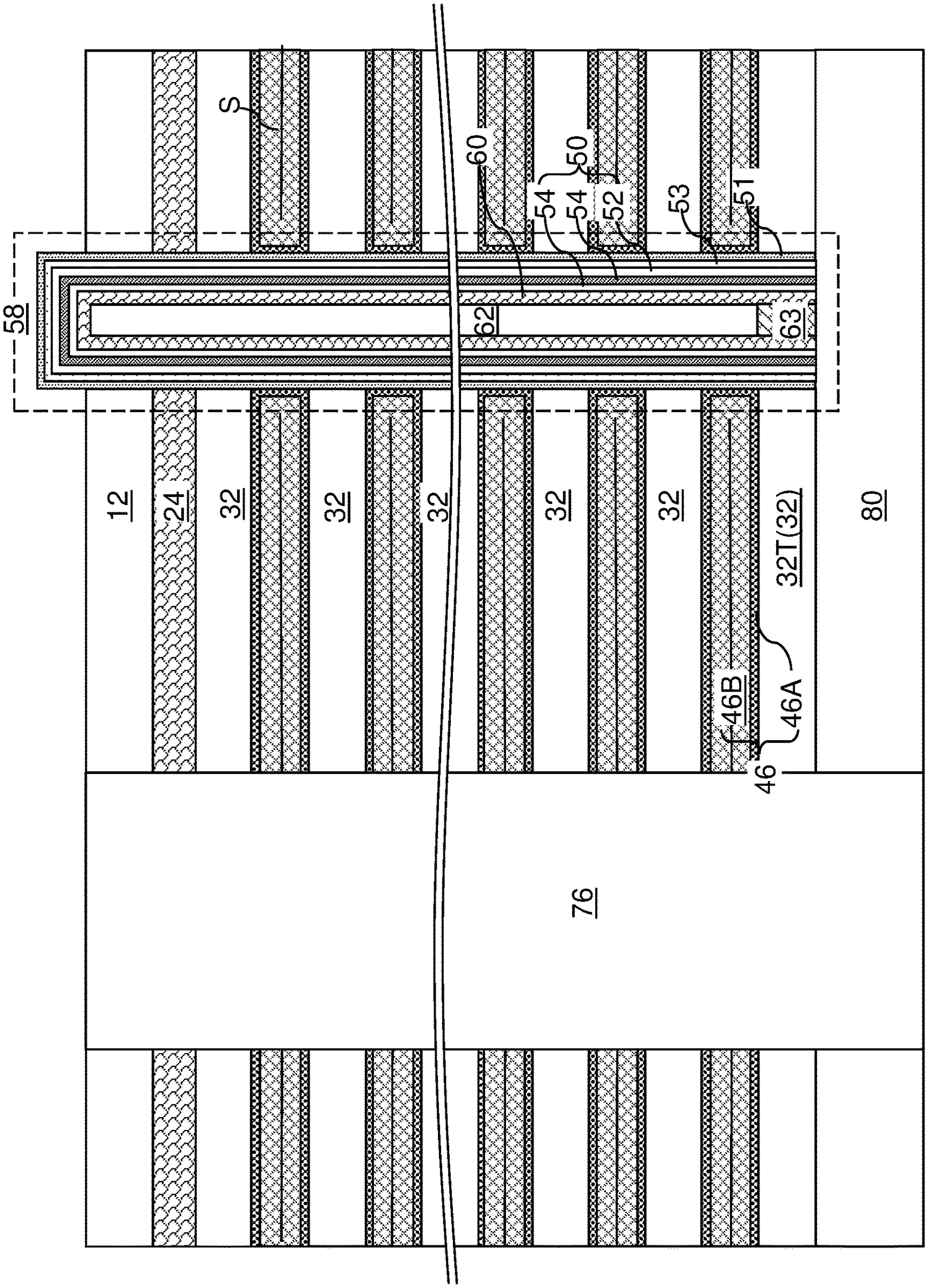
FIG. 16B is a magnified view of a region of the first exemplary structure of FIG. 16A.

Referring to FIGS. 16A and 16B, the carrier substrate 9 can be removed, for example, by grinding, polishing, cleaving, an isotropic etch process, an anisotropic etch process, and/or a combination thereof. In one embodiment, at least a terminal step of at least one removal process that is employed to remove the carrier substrate 9 may comprise a selective wet etch process that etches the material of the carrier substrate 9 (such as a semiconductor material of the carrier substrate 9) selective to the material of the buried insulating layer 12, and selective to at least one material of the aluminum nitride layers 51, the aluminum oxide layers 53, and the memory films 50. In an illustrative example, if the carrier substrate 9 comprises a semiconductor material, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 9 can be removed by the selective wet etch process. Backside end surfaces of the support pillar structures 20 can be physically exposed upon removal of the carrier substrate 9. In the illustrative example, the carrier substrate 9 may be removed selective to the aluminum nitride layers 51.

Figure 17:
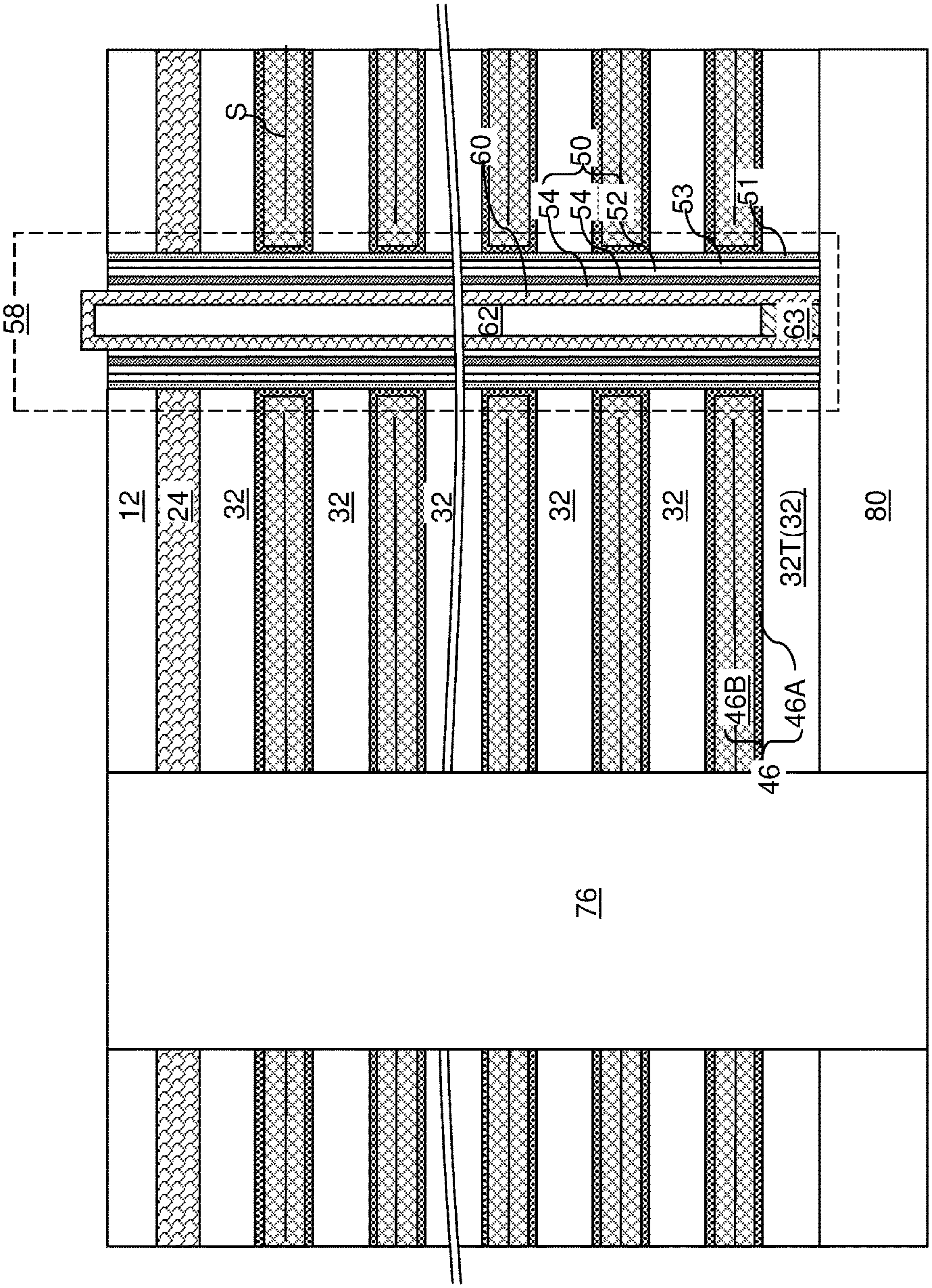
FIG. 17 is a vertical cross-sectional view of a region of the first exemplary structure after physically exposing end portions of the memory opening fill structures according to the first embodiment of the present disclosure.

Referring to FIG. 17, end portions of the aluminum nitride layers 51, the aluminum oxide layers 53, and the memory films 50 can be removed, for example, by performing various selective etch processes that sequentially etch the materials of the aluminum nitride layers 51, the aluminum oxide layers 53, and the memory films 50. For example, a sequence of wet etch processes may be performed. End surfaces of the vertical semiconductor channels 60 can be physically exposed. The backside surface of the buried insulating layer 12 can be collaterally recessed during the various isotropic etch processes.

Figure 18:
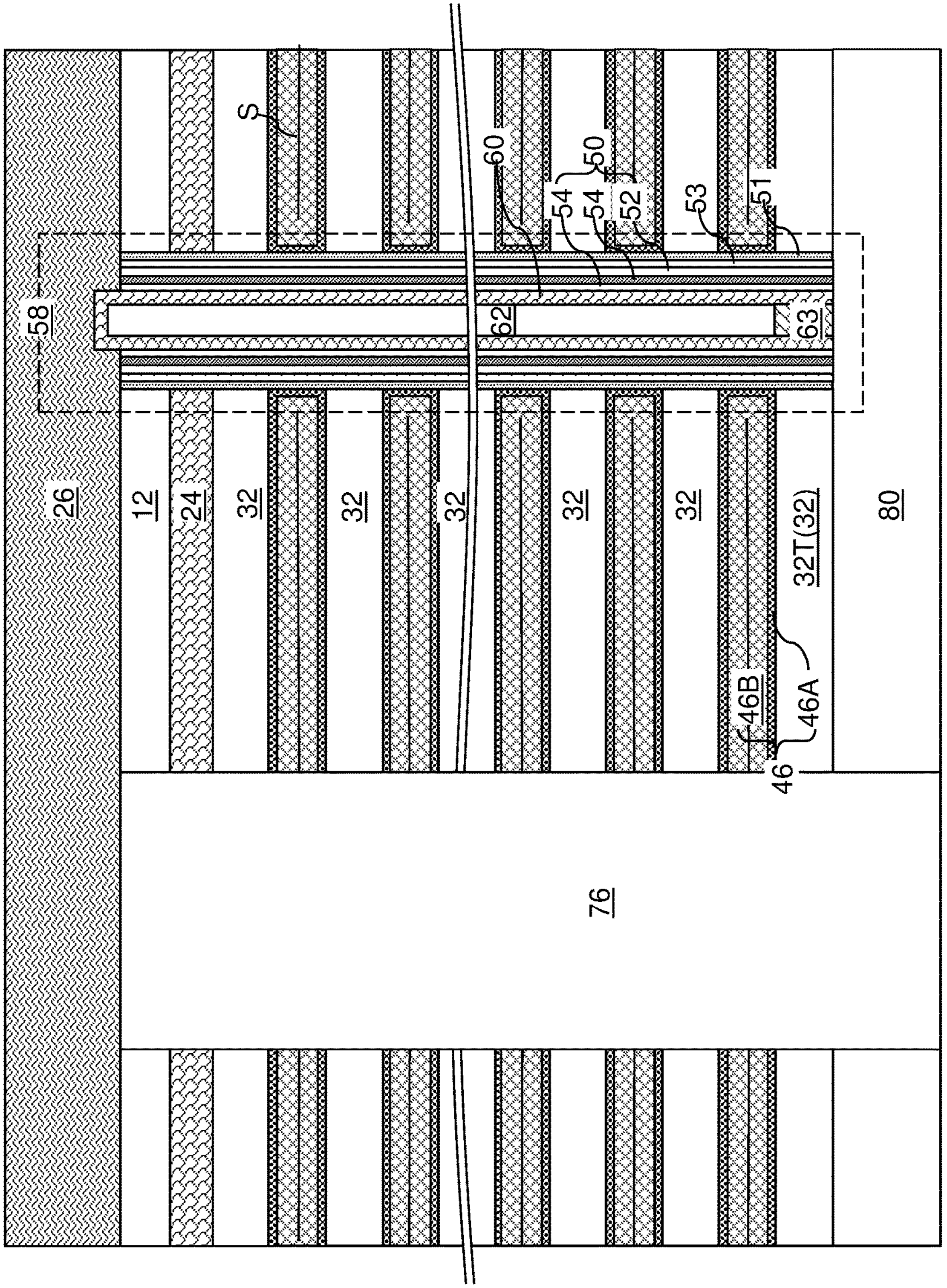
FIG. 18 is a vertical cross-sectional view of a region of the first exemplary structure after formation of a source layer according to the first embodiment of the present disclosure.

Referring to FIG. 18, a backside semiconductor source structure 26 can be formed on the physically exposed surfaces of the vertical semiconductor channels 60. In one embodiment, the backside semiconductor source structure 26 may be formed by selective or non-selective deposition of a semiconductor material. The semiconductor material may be in-situ doped with dopants of the second conductivity type, or may be doped by performing an ion implantation process that implants dopants of the second conductivity type. A suitable anneal process, such as a laser anneal process, may be performed to activate the dopants of the second conductivity type in the backside semiconductor source structure 26, which functions as a source region of the NAND strings in the memory opening fill structures 58.

Generally, the backside semiconductor source structure 26 contacts each of the vertical semiconductor channels 60. In one embodiment, the backside semiconductor source structure 26 may be deposited directly on a horizontal end surface of each vertical semiconductor channel 60, and directly on cylindrical sidewalls of the vertical semiconductor channels 60. The thickness of the horizontally-extending portion of the backside semiconductor source structure 26 may be in a range from 30 nm to 300 nm, although lesser and greater thicknesses may also be employed. The atomic concentration of dopants of the second conductivity type in the backside semiconductor source structure 26 may be in a range from $5\times10^{18}/cm^3$ to $2\times10^{21}/cm^3$, such as from $1\times10^{19}/cm^3$ to $1\times10^{21}/cm^3$, although lesser and greater atomic concentrations may also be employed.

Figure 19:
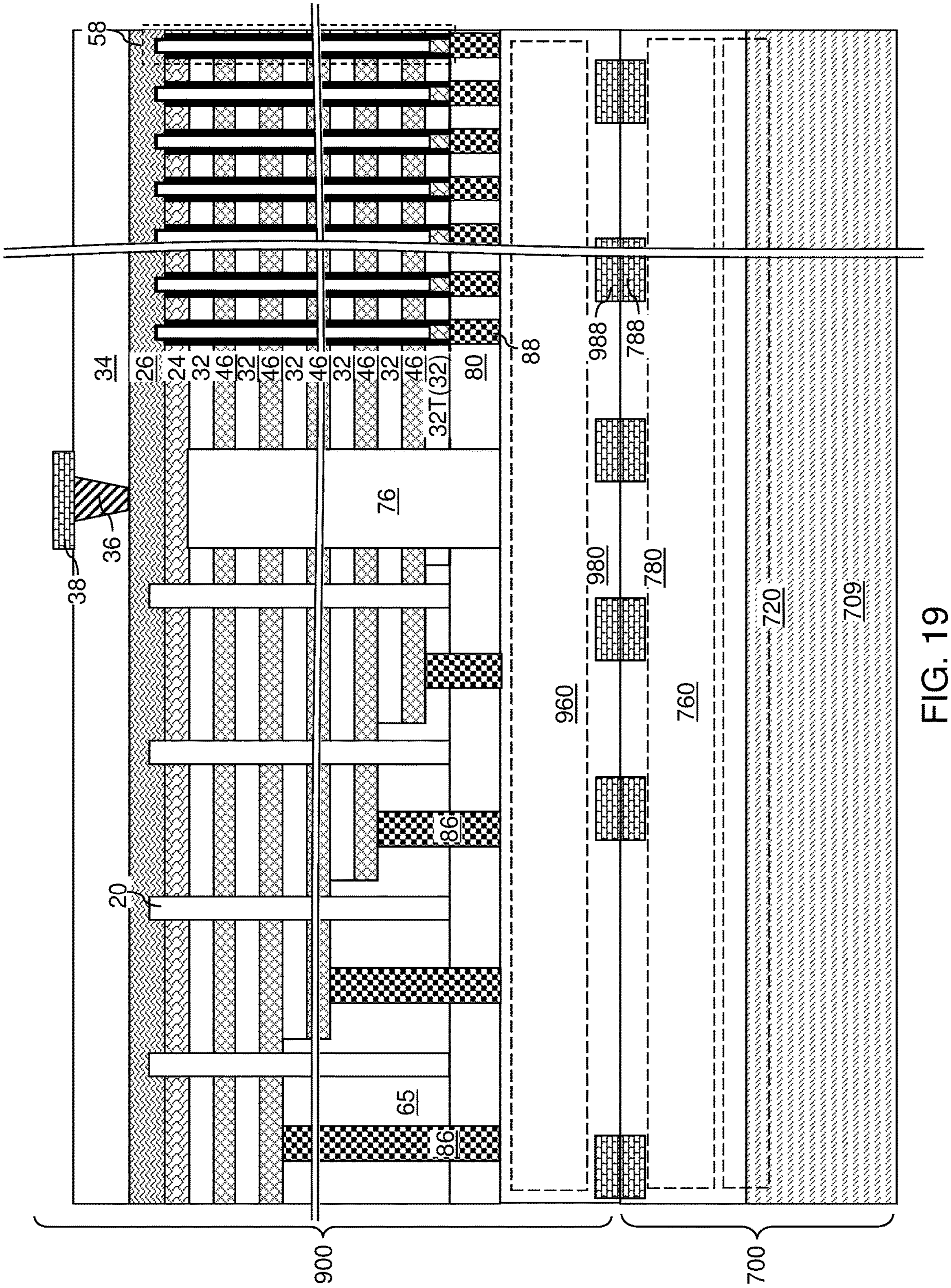
FIG. 19 is a vertical cross-sectional view of the first exemplary structure after formation of a source contact structure according to the first embodiment of the present disclosure.

Referring to FIG. 19, a backside insulating layer 34 including an insulating material can be deposited over the backside semiconductor source structure 26. A source contact structure (36, 38) may be formed through the backside insulating layer 34 on the distal surface of the backside semiconductor source structure 26. The source contact structure (36, 38) may comprise a metal via portion 36 and a metal pad portion 38, which can be employed as a bonding pad for providing electrical connection, for example, by forming a solder ball or a wirebonding connection thereupon.

In alternative embodiments described below, the peripheral circuit may be formed on the substrate 9 below and/or next to the alternating stack (32, 46). In such alternative embodiments, the steps of FIGS. 13 to 19 may be omitted. Furthermore, the backside semiconductor source structure 26 may be omitted and the source structure may comprise a doped source region in semiconductor substrate and/or a discrete strap contact which extends horizontally over the top surface of the substrate and contacts a sidewall of the vertical semiconductor channel 60.

Figure 20:
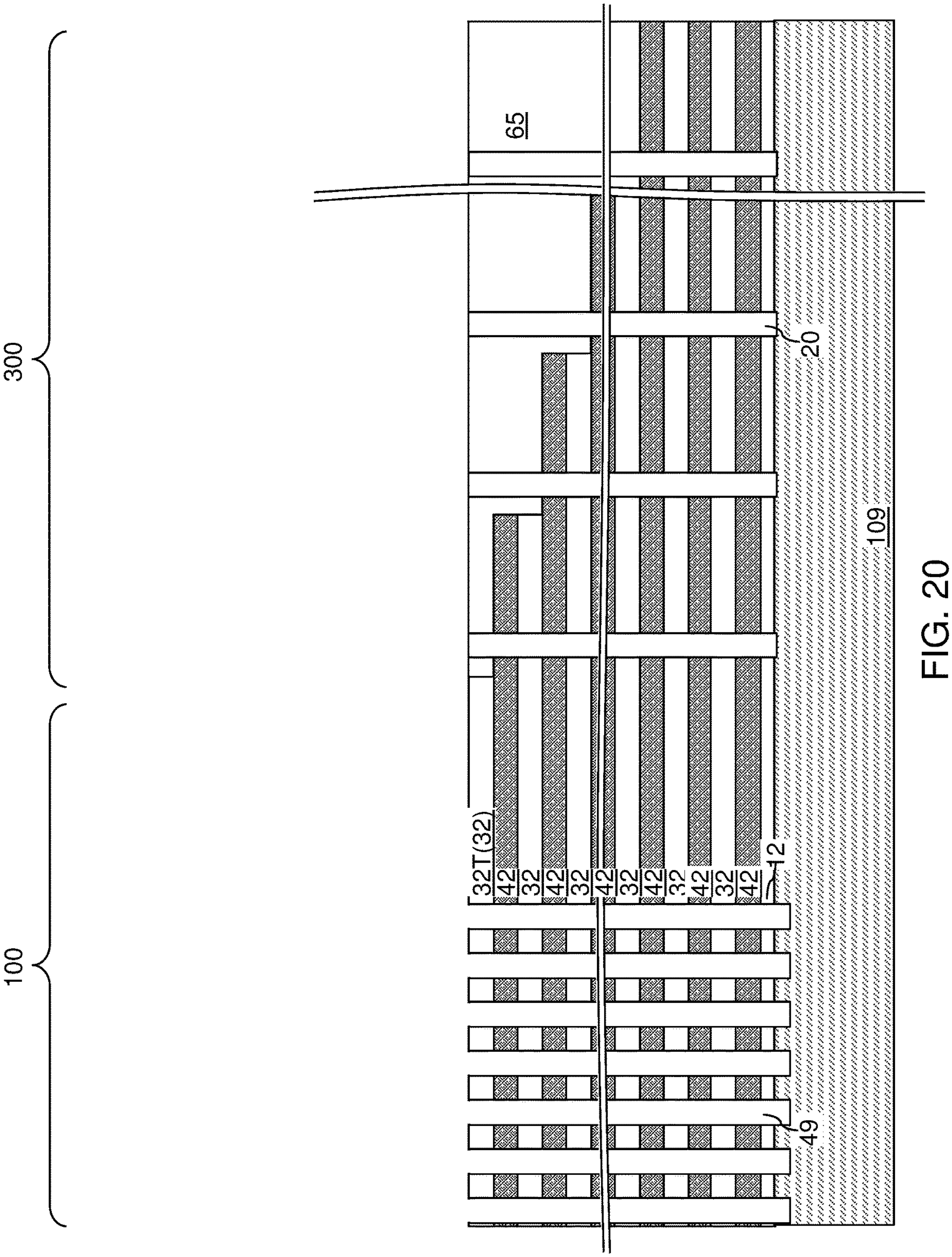
FIG. 20 is a vertical cross-sectional view of a second exemplary structure after formation of memory openings according to a second embodiment of the present disclosure.

Referring to FIG. 20, a second exemplary structure according to a second embodiment of the present disclosure can be derived from the first exemplary structure illustrated in FIGS. 5A and 5B by using a semiconductor material layer 109 in lieu of a carrier substrate 9. The semiconductor material layer 109 may comprise an upper portion of a semiconductor (e.g., silicon) wafer, a doped well in the upper portion of the semiconductor wafer or an epitaxial semiconductor (e.g., single crystal silicon) layer formed over a substrate. The semiconductor material layer 109 can have a doping of the first conductivity type, and can include dopants of the first conductivity type at an atomic concentration in a range from $1.0\times10^{14}/cm^3$ to $3.0\times10^{17}/cm^3$, although lesser and greater atomic concentrations may also be employed.

FIGS. 21A-21H are sequential vertical cross-sectional views of a memory opening 49 during formation of a memory opening fill structure 58 according to the second embodiment of the present disclosure.

Figure 21B:
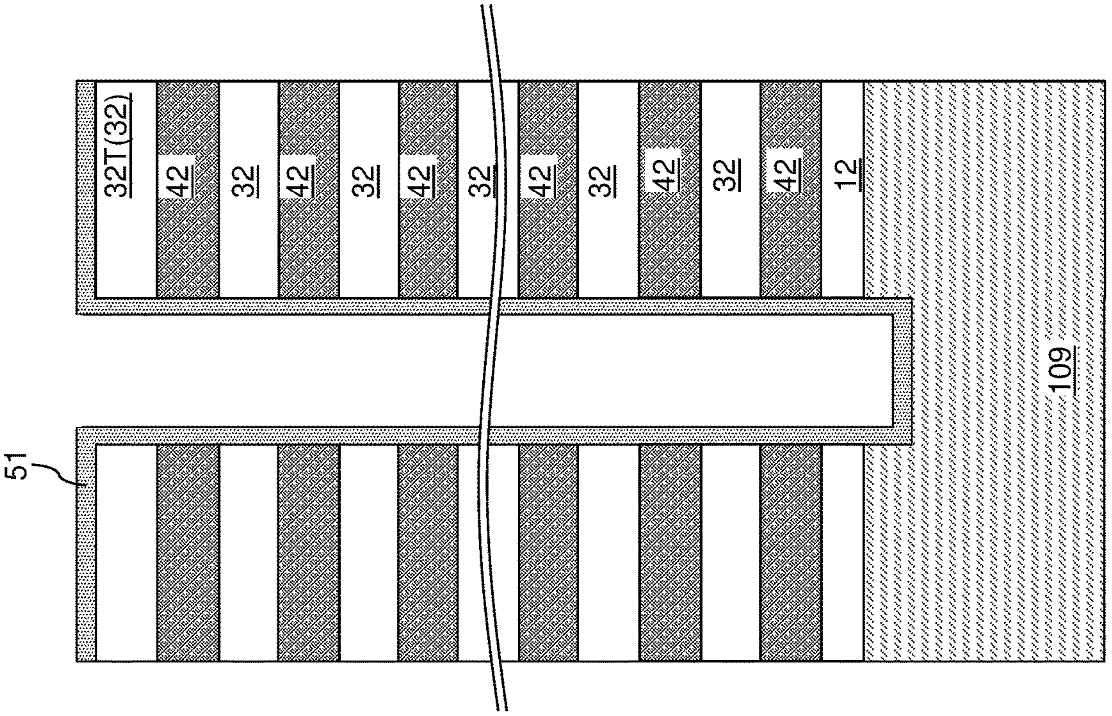
FIGS. 21A-21H are sequential vertical cross-sectional views of a memory opening during formation of a memory opening fill structure according to the second embodiment of the present disclosure.
Figure 21A:
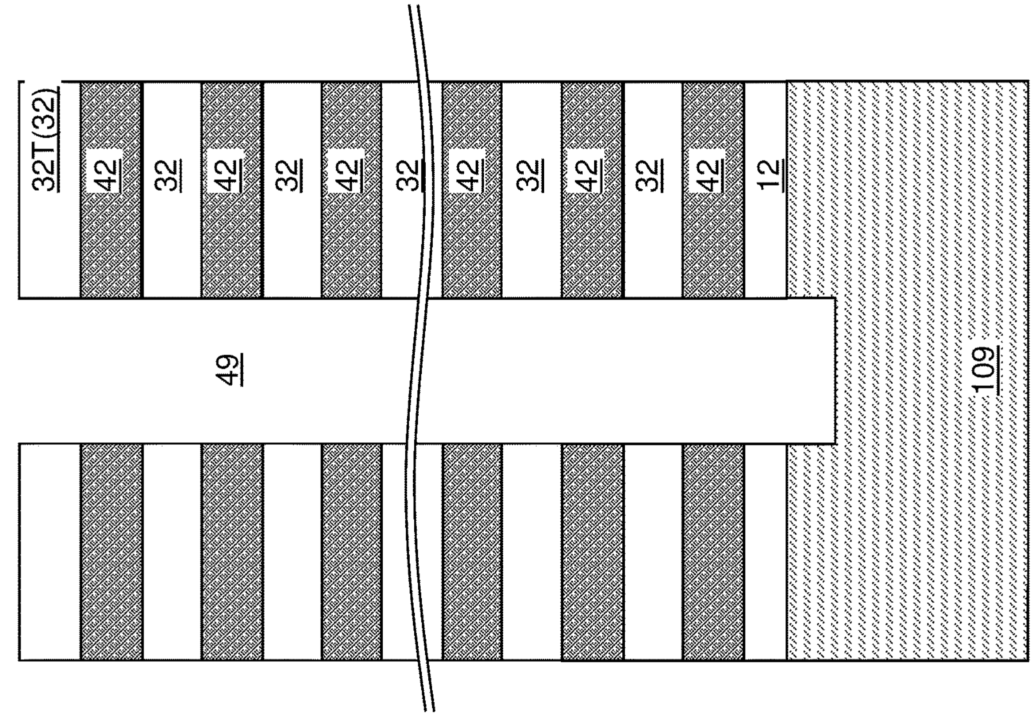

Referring to FIG. 21A, a memory opening 49 is illustrated after the processing steps of FIG. 20.

Referring to FIG. 21B, the processing steps described with reference to FIG. 6B can be performed to form the aluminum nitride layer 51.

Figure 21D:
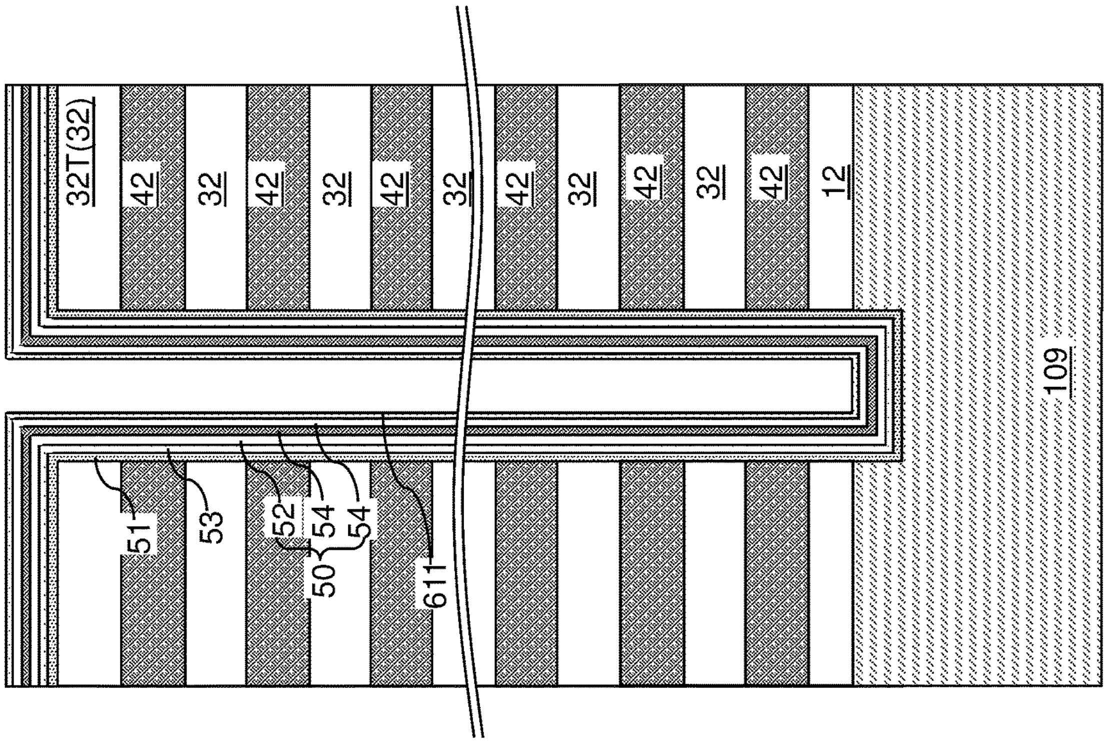
Figure 21C:
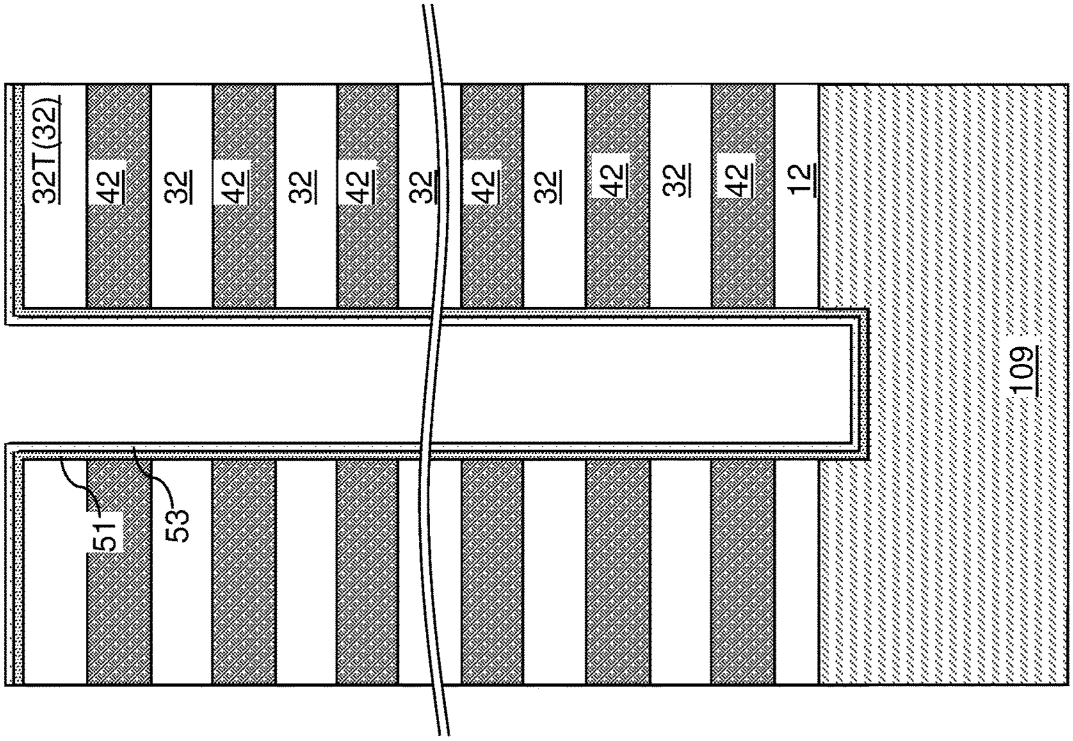

Referring to FIG. 21C, the processing steps described with reference to FIG. 6C can be performed to convert a surface portion of the aluminum nitride layer 51 into the aluminum oxide layer 53 to form a layer stack of the aluminum nitride layer 51 and the aluminum oxide layer 53.

Referring to FIG. 21D, the processing steps described with reference to FIG. 6D may be performed to form the memory film 50. Subsequently, an optional sacrificial cover layer 611 can be conformally deposited over the memory film 50. The sacrificial cover layer 611 comprises a sacrificial material that can protect the memory film 50 during a subsequent anisotropic etch process. For example, the sacrificial cover layer 611 may comprise amorphous carbon, undoped amorphous silicon, or doped polysilicon that is lightly doped with dopants of the first conductivity type.

Figure 21F:
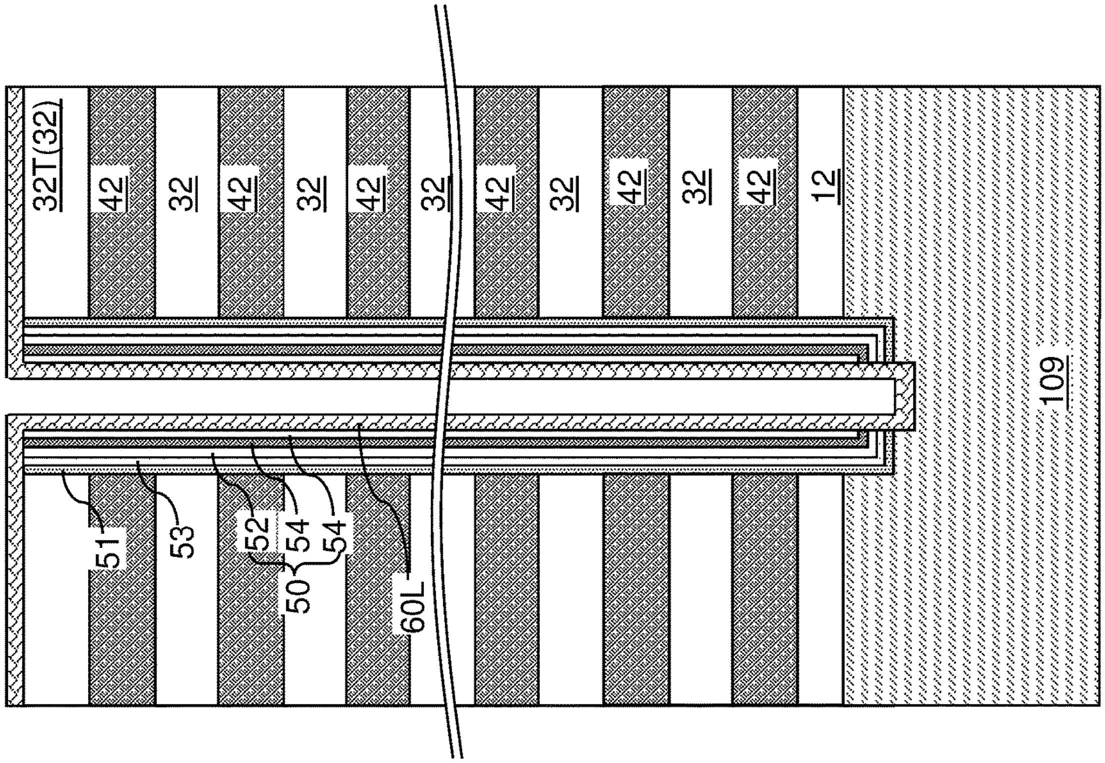
Figure 21E:
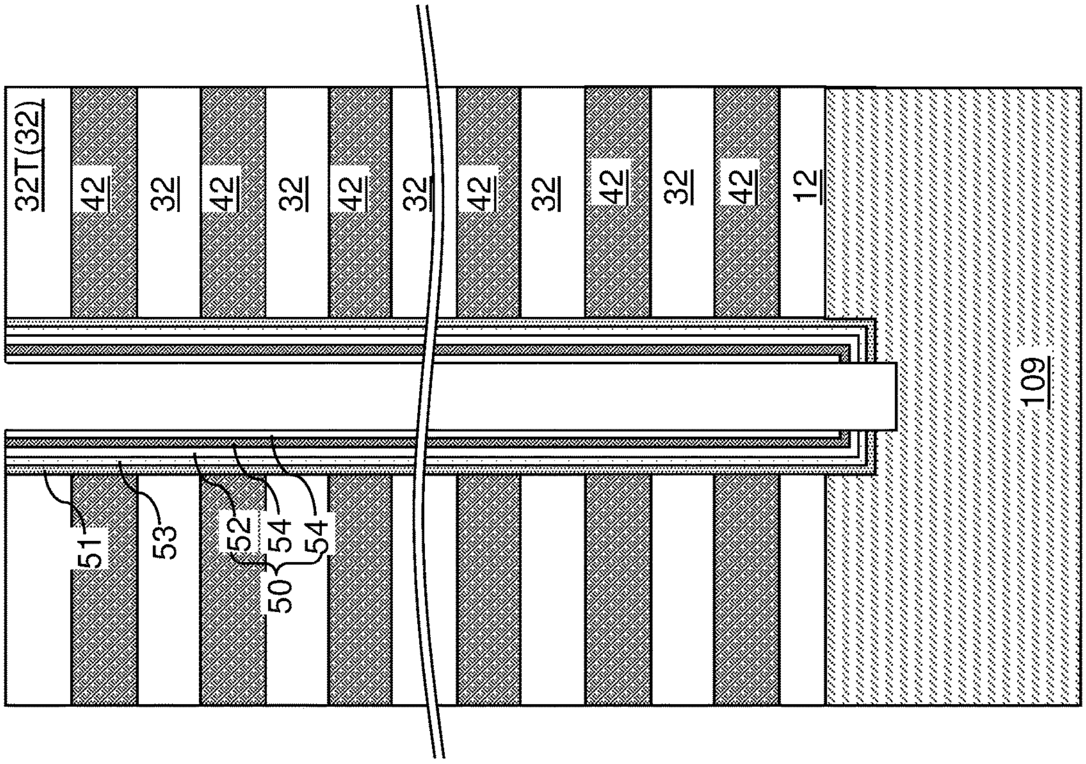

Referring to FIG. 21E, an anisotropic etch process can be performed to remove horizontally-extending portions of the sacrificial cover layer 611, the memory film 50, the aluminum oxide layer 53, and the aluminum nitride layer 51. Physically exposed portions of the semiconductor material layer 109 may be vertically recessed by a vertical recess distance, which may be in a range from 1 nm to 60 nm, such as from 2 nm to 30 nm, although lesser and greater vertical recess distances may also be employed.

Referring to FIG. 21F, the semiconductor channel material layer 60L may be formed, for example, by performing a processing step described with reference to FIG. 6D.

Figure 21G:
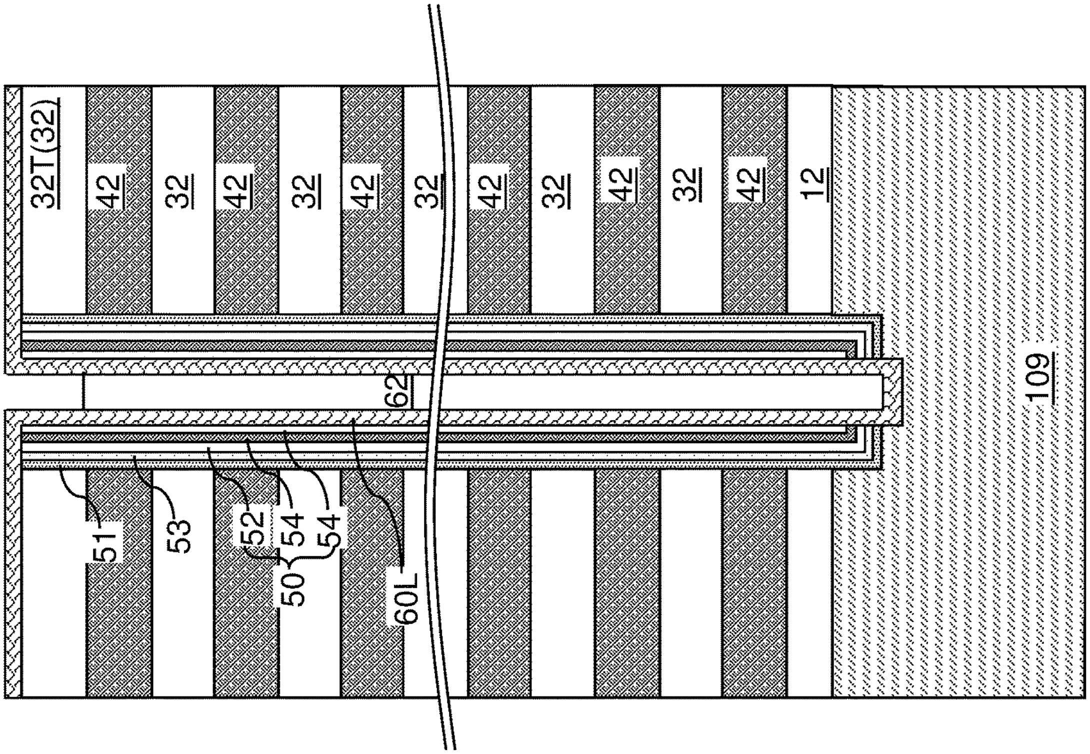

Referring to FIG. 21G, the processing steps described with reference to FIG. 6E may be performed to form the dielectric core 62 in each memory opening 49.

Figure 21H:
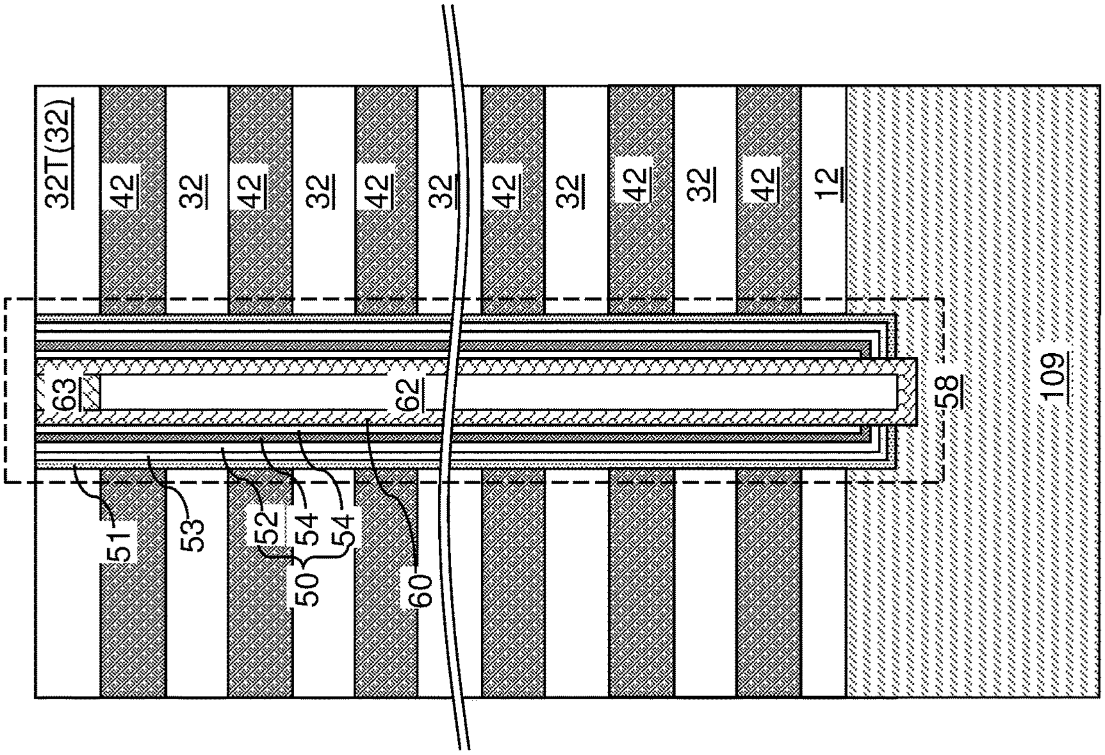

Referring to FIG. 21H, the processing steps described with reference to FIG. 6F may be performed to form the memory opening fill structure 58 in each memory opening 49.

Subsequently, the processing steps described with reference to FIGS. 8A-8C can be performed to form a contact-level dielectric layer 80 and lateral isolation trenches 79.

FIGS. 22A-22G are sequential vertical cross-sectional views of a region of the second exemplary structure during formation of a lateral isolation trench 79, replacement of the sacrificial material layers 42 with electrically conductive layers 46, and formation of a lateral isolation trench fill structure (74, 75) according to the second embodiment of the present disclosure.

Figure 22A:
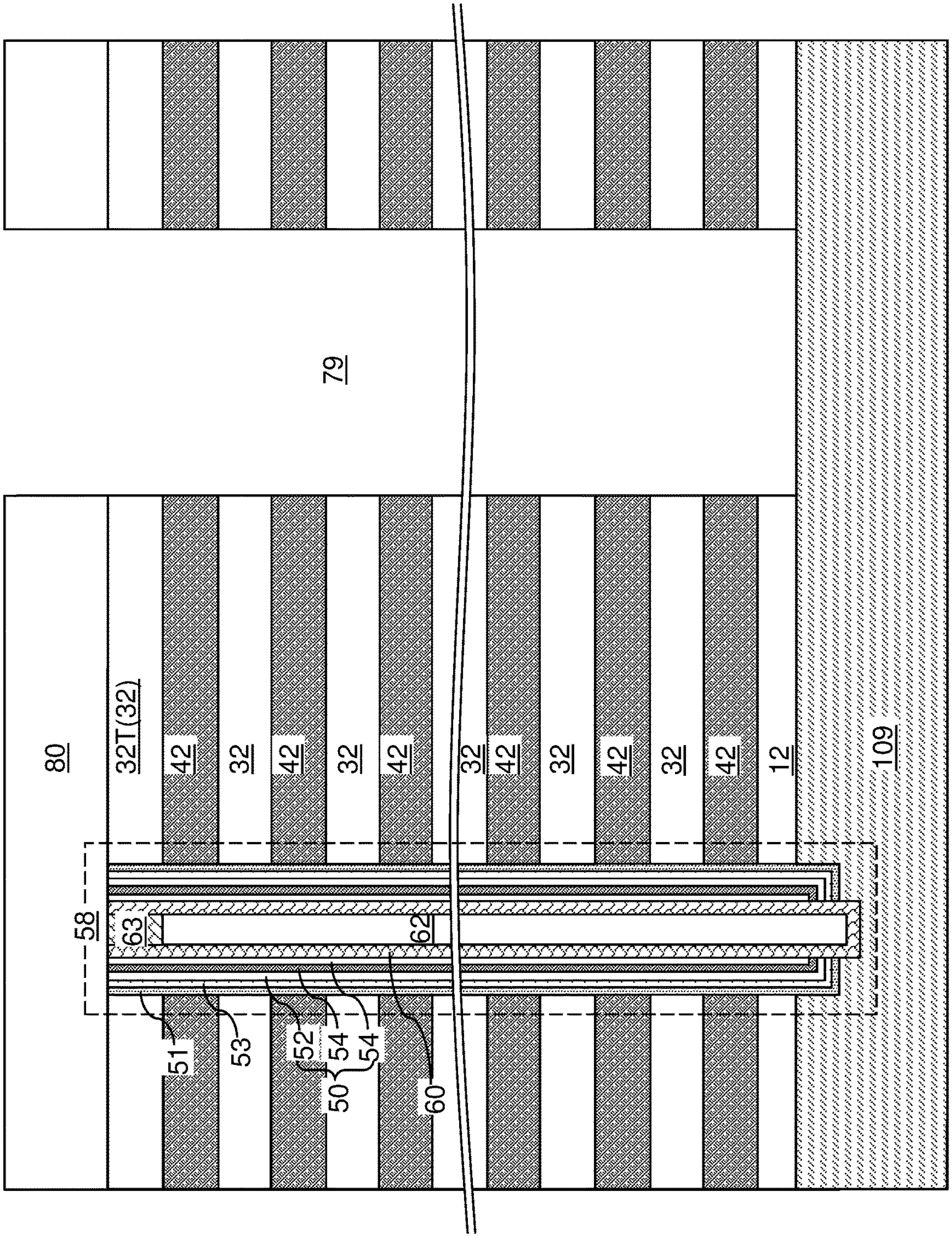
FIGS. 22A-22G are sequential vertical cross-sectional views of a region of the second exemplary structure during formation of a lateral isolation trench, replacement of the sacrificial material layers with electrically conductive layers, and formation of a lateral isolation trench fill structure according to the second embodiment of the present disclosure.

Referring to FIG. 22A, a region of the second exemplary structure is illustrated after formation of the contact-level dielectric layer 80 and the lateral isolation trenches 79.

Figure 22B:
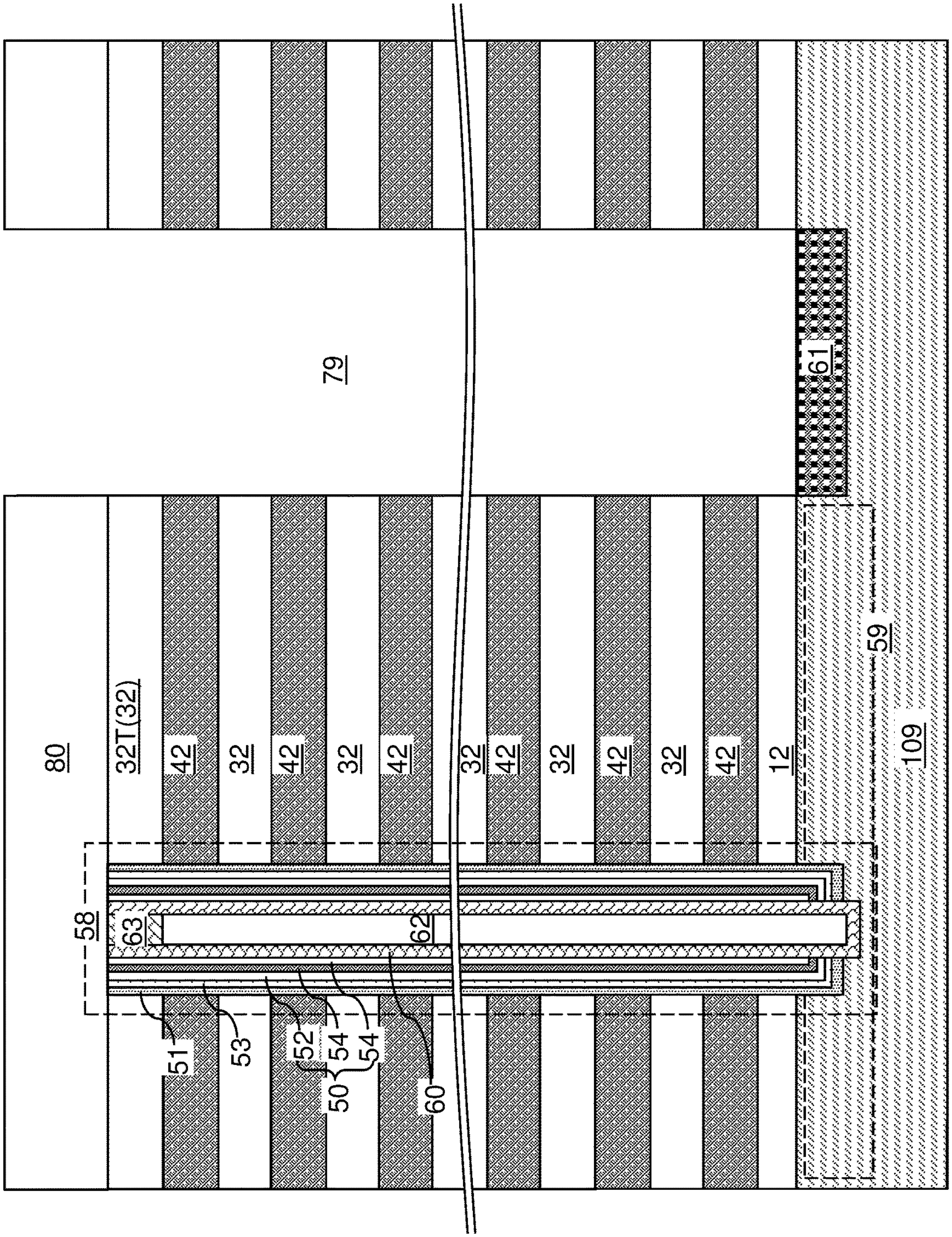

Referring to FIG. 22B, dopants of the second conductivity type may be implanted into surface portions of the semiconductor material layer 109 that underlie the lateral isolation trenches 79 to form source regions 61. Surface portions of the semiconductor material layer 109 that laterally extends between the source regions 61 and the memory opening fill structures 58 constitute horizontal semiconductor channels 59.

Figure 22C:
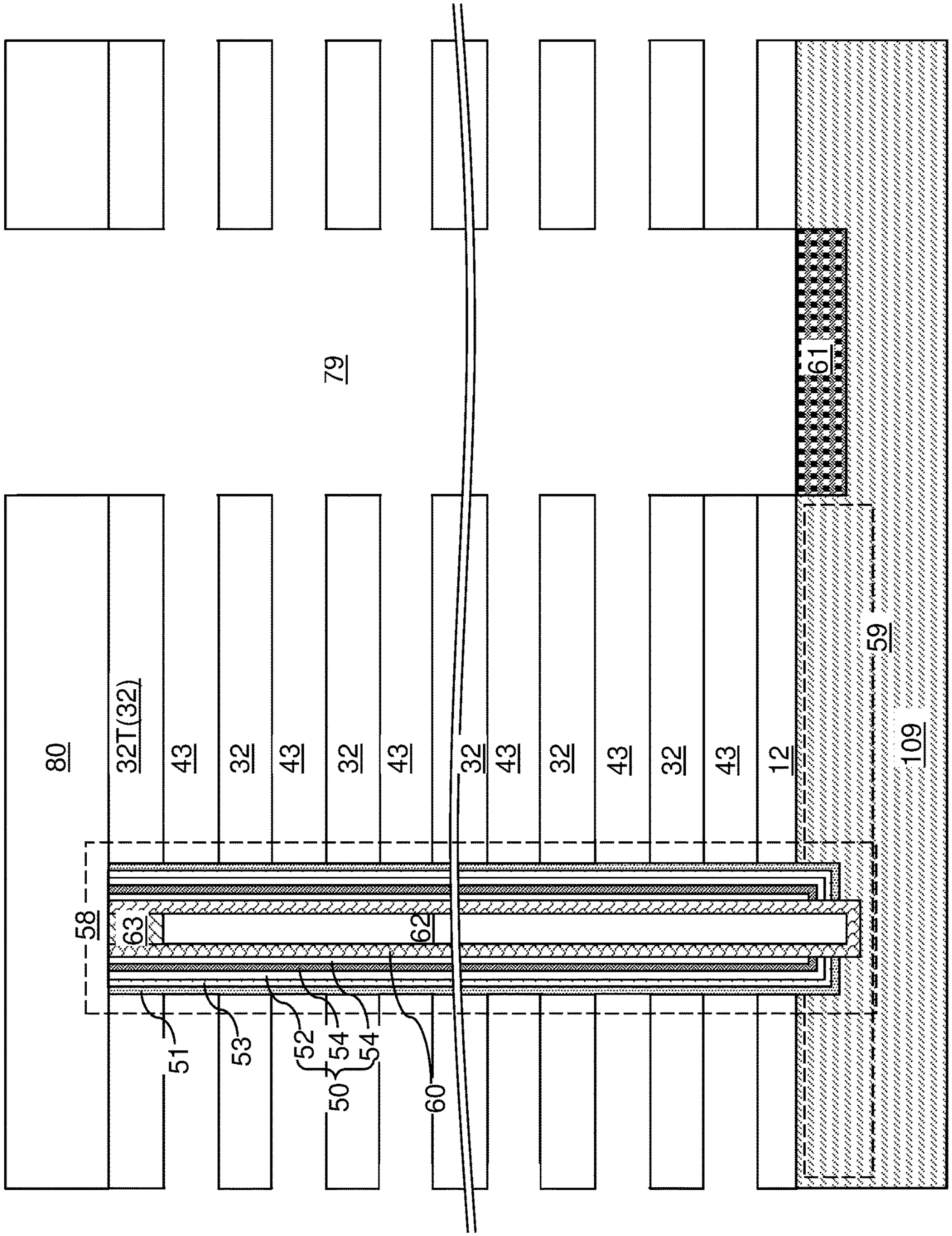

Referring to FIG. 22C, the processing steps described with reference to FIGS. 9A and 9B can be performed to form lateral recesses 43.

Figure 22D:
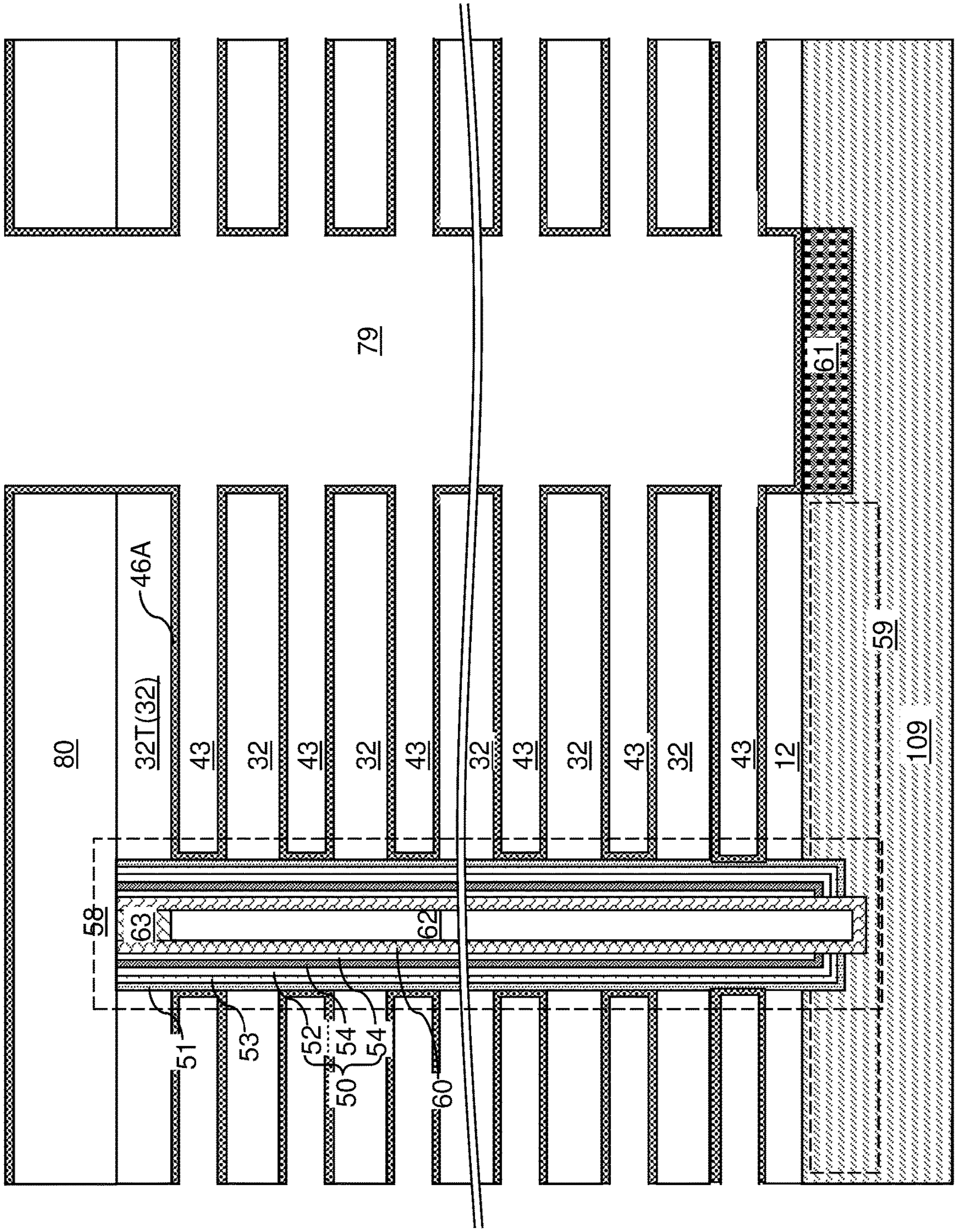

Referring to FIG. 22D, the processing steps described with reference to FIG. 10A can be performed to form a metallic nitride barrier layer 46A.

Figure 22E:
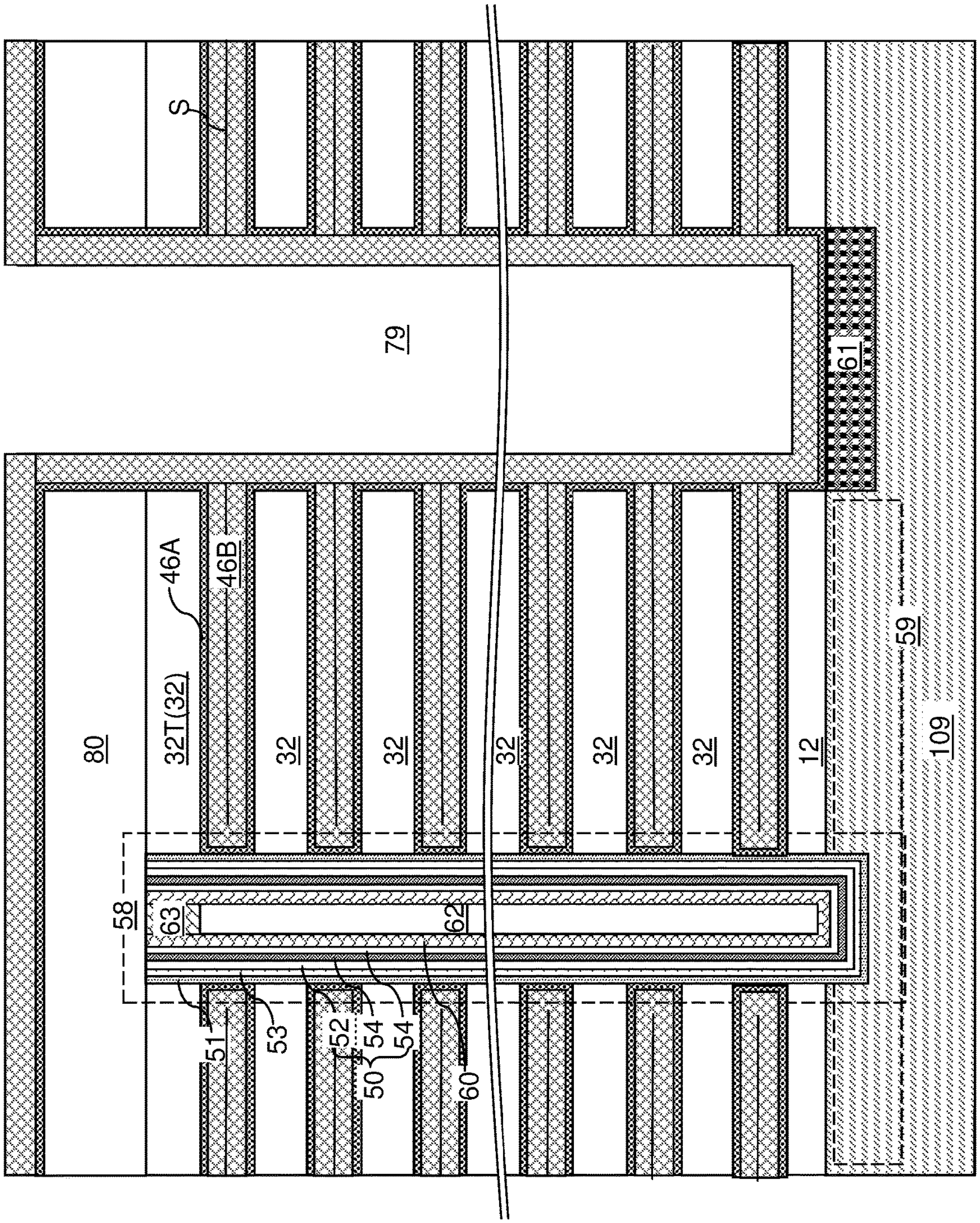

Referring to FIG. 22E, the processing steps described with reference to FIG. 10B can be performed to form a metallic fill material layer 46B.

Figure 22F:
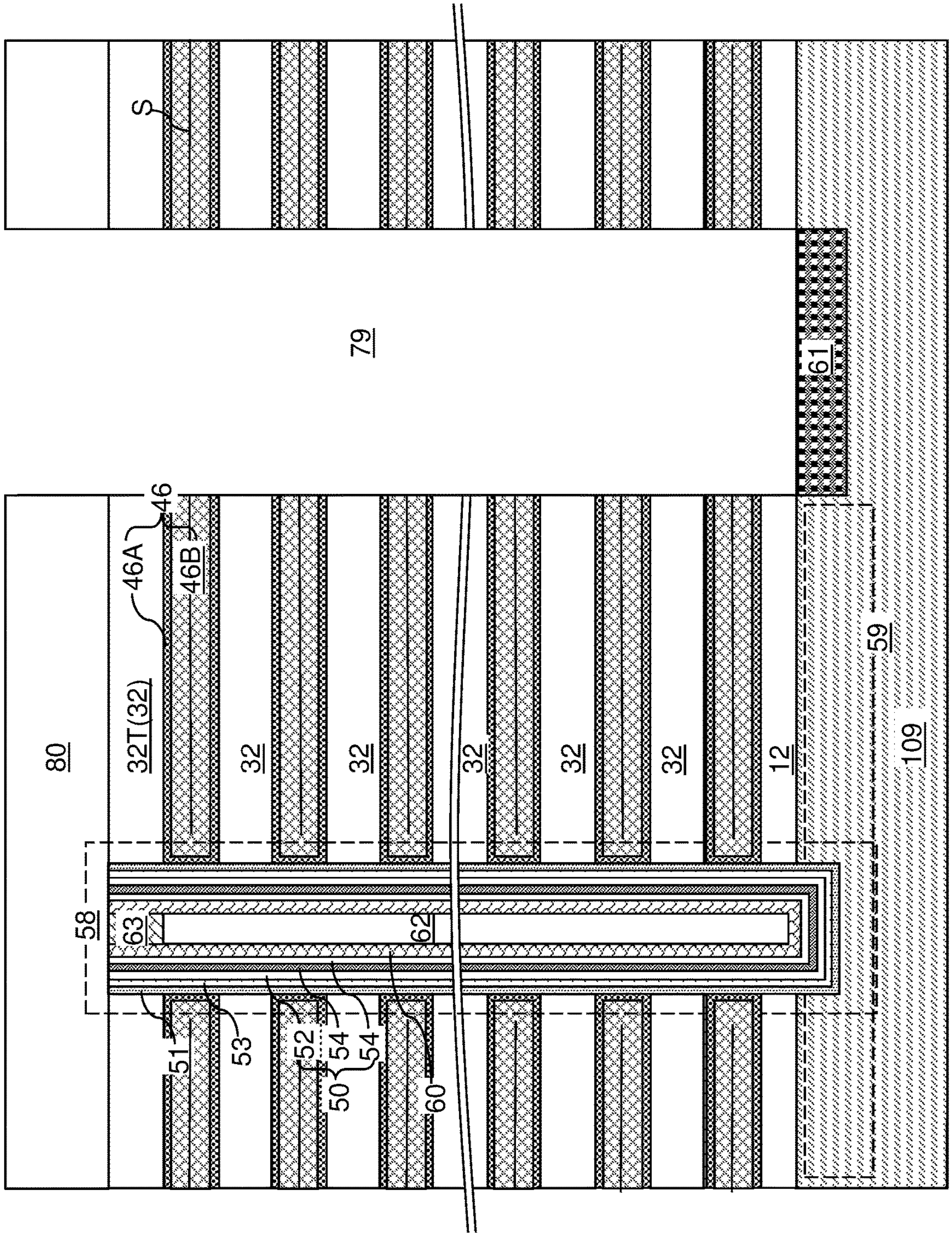

Referring to FIG. 22F, the processing steps described with reference to FIG. 10C can be performed to remove a continuous electrically conductive material layer from inside the lateral isolation trenches 79 and from above the contact-level dielectric layer 80. Remaining portions of the metallic nitride barrier layer 46A and the metallic fill material layer 46B constitute electrically conductive layers 46. Each electrically conductive layer 46 can be formed in a respective lateral recess 43, and can comprise a respective metallic nitride barrier layer 46A (which is a remaining portion of the metallic nitride barrier layer 46A as formed at the processing steps of FIG. 22D) and a respective metallic fill material layer 46B (which is a remaining portion of the metallic fill material layer 46B as formed at the processing steps of FIG. 22E).

Figure 22G:
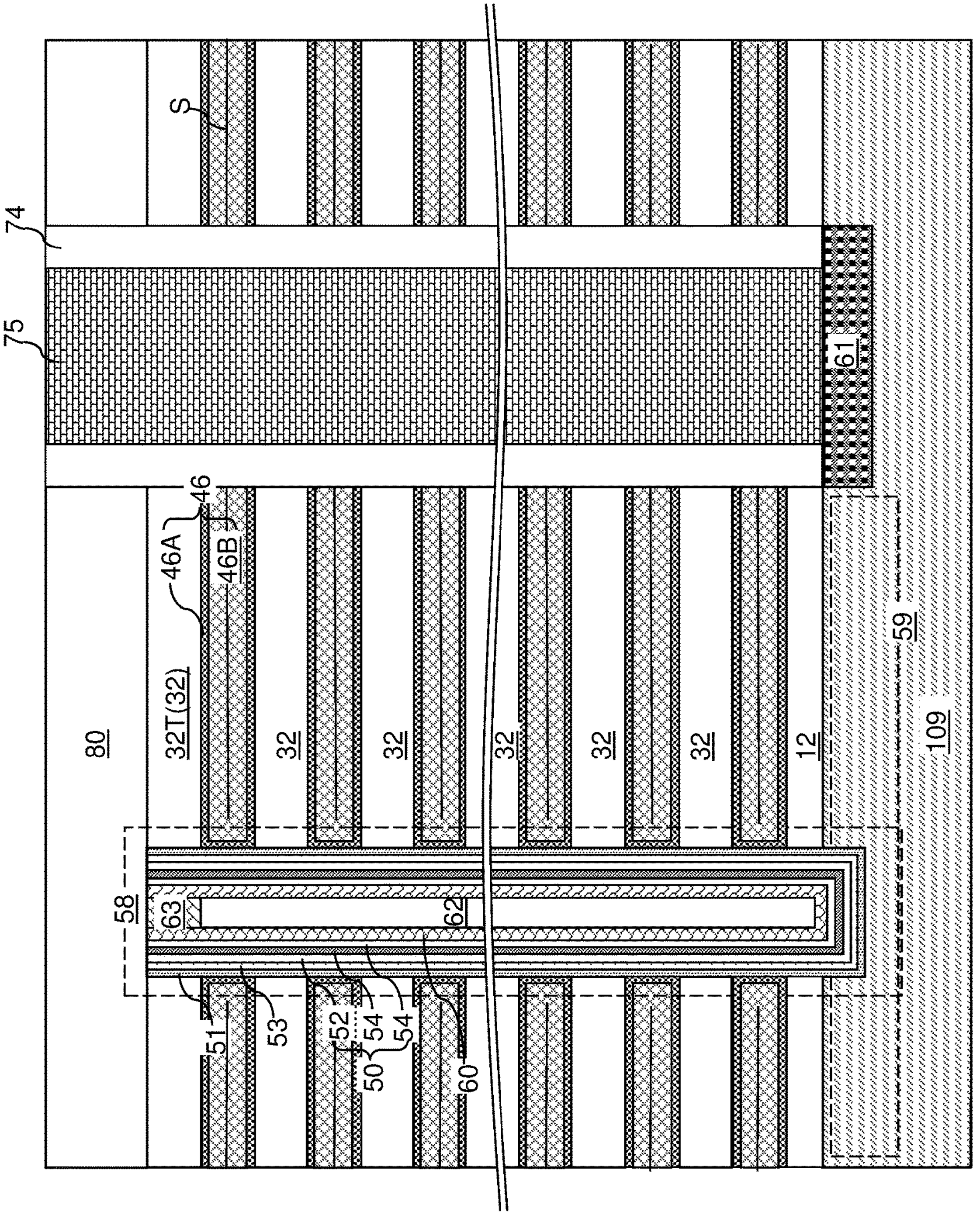

Referring to FIG. 22G, an insulating material can be conformally deposited and subsequently anisotropically etched to form an insulating spacer 74 at peripheral portions of the lateral isolation trenches 79. Each insulating spacer 74 may comprise a pair of lengthwise sidewalls that laterally extend along the first horizontal direction hd1 and contacting lengthwise sidewalls of a respective alternating stack of insulating layers 32 and electrically conductive layers 46. At least one conductive material can be deposited in remaining volumes of the lateral isolation trenches 79. Excess portions of the at least one conductive material can be removed from above the horizontal plane including the top surface of the contact-level dielectric layer 80 by a planarization process, which may comprise a chemical mechanical planarization (CMP) process or a recess etch process. Each remaining portion of the at least one conductive material constitutes a contact via structure, which may be a source contact via structure 75. A lateral isolation trench fill structure (74, 75) may be formed within each lateral isolation trench 79.

Figure 23:
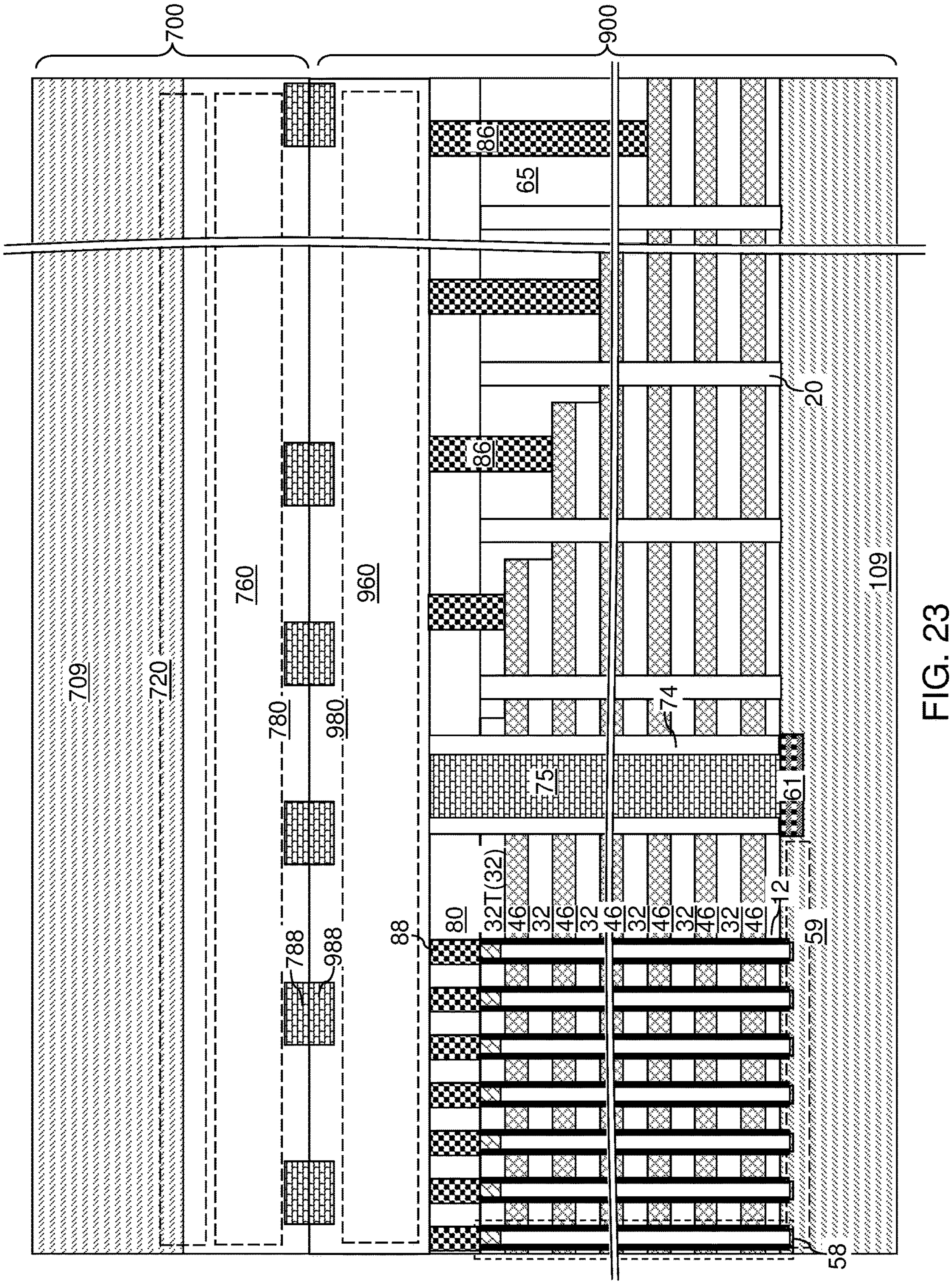
FIG. 23 is a vertical cross-sectional view of the second exemplary structure after bonding a logic die to a memory die according to the second embodiment of the present disclosure.

Referring to FIG. 23, the processing steps described with reference to FIGS. 12A, 12B, 13, 14, and 15 can be performed to form a memory die 900, to provide a logic die 700, and to form a bonded assembly of the memory die 900 and the logic die 700. The source contact via structures 75 may be employed to electrically bias the source regions 61. The semiconductor channels of the NAND strings comprise the vertical semiconductor channels 60 and the horizontal semiconductor channels 59.

Figure 24:
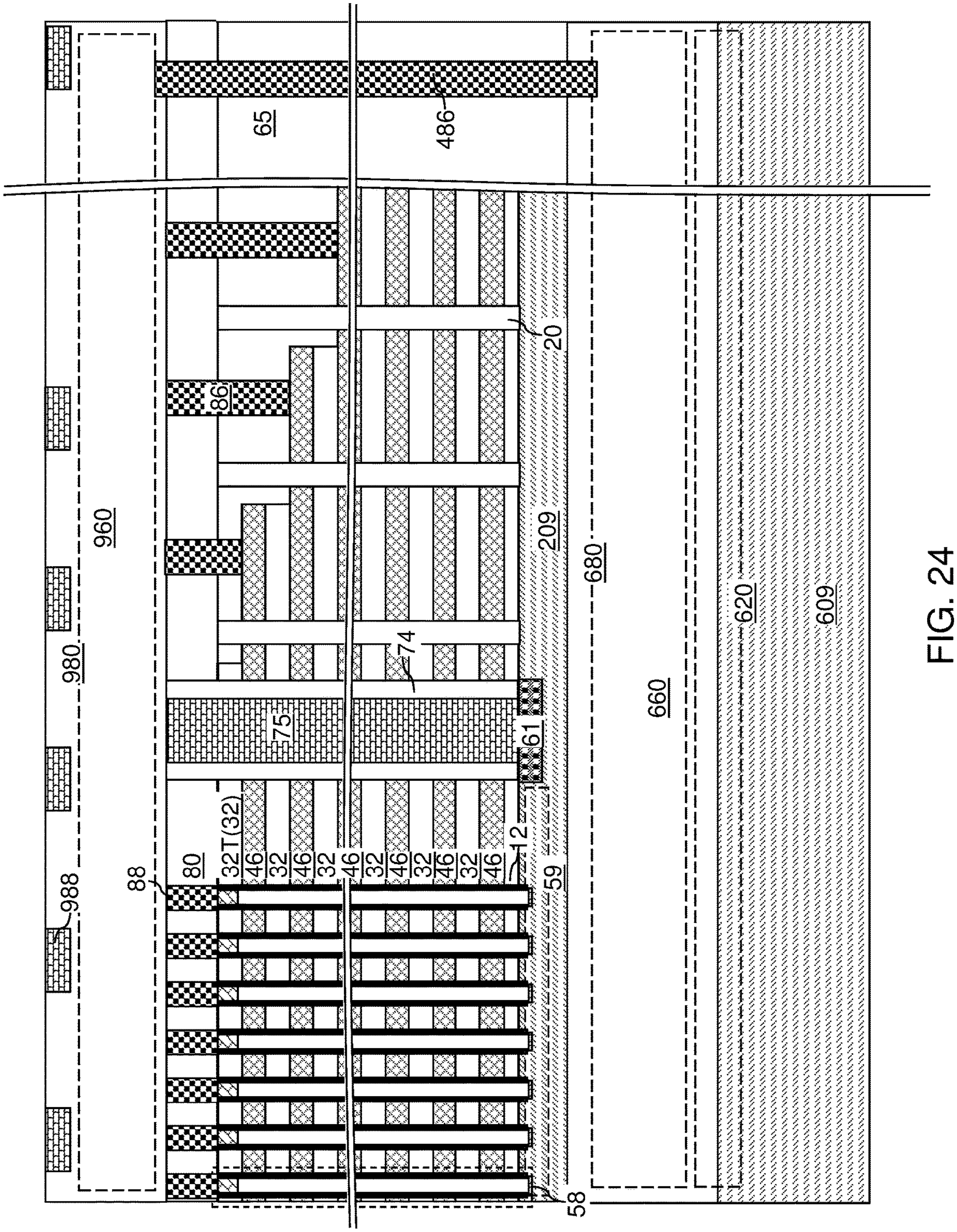
FIG. 24 is a vertical cross-sectional view of a third exemplary structure according to a third embodiment of the present disclosure.

Referring to FIG. 24, a third exemplary structure according to a third embodiment of the present disclosure. The third exemplary structure can be derived from the second exemplary structure by employing a combination of a semiconductor substrate including a substrate semiconductor layer 609 (e.g., a doped well in the semiconductor substrate or an epitaxial semiconductor layer on the semiconductor substrate), semiconductor devices 620 including a peripheral circuitry located on the substrate semiconductor layer 609 and configured to control operation of the three-dimensional memory array to be subsequently formed, lower-level metal interconnect structures 680 embedded within lower-level dielectric material layers 660 and electrically connected to the semiconductor devices 620, and a semiconductor material layer 209 overlying the lower-level dielectric material layers 660 in lieu of the semiconductor material layer 109 of the second exemplary structure. The semiconductor material layer 209 may comprise openings in or adjacent to a contact region including the stepped dielectric material portion 65. Connection via structures 486 can be formed through the stepped dielectric material portion 65 to provide electrical connection between a subset of the lower-level metal interconnect structures 680 and the memory-side metal interconnect structures 980, which are referred to upper-level metal interconnect structures 980 in the third exemplary structure. The memory-side dielectric material layers 960 are referred to as upper-level dielectric material layers 960 in the third exemplary structure. The semiconductor devices 620 may comprise CMOS peripheral (e.g., driver) circuit devices, and the third semiconductor structure can be provided in a CMOS-under-array (CUA) configuration.

Figure 25A:
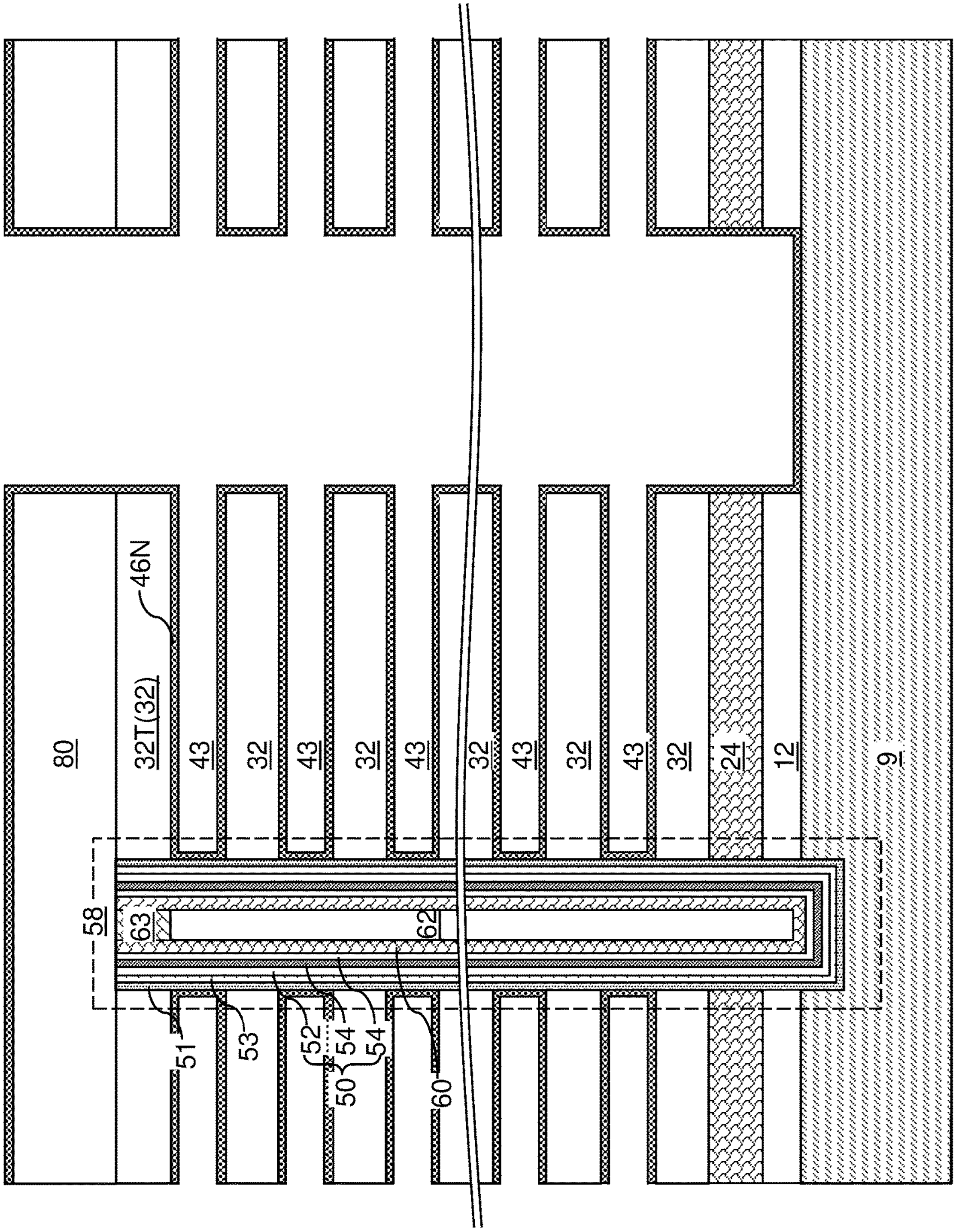
FIGS. 25A-25C are sequential vertical cross-sectional views of a region of a fourth exemplary structure during formation of electrically conductive layers according to the fourth embodiment of the present disclosure.
Figure 25B:
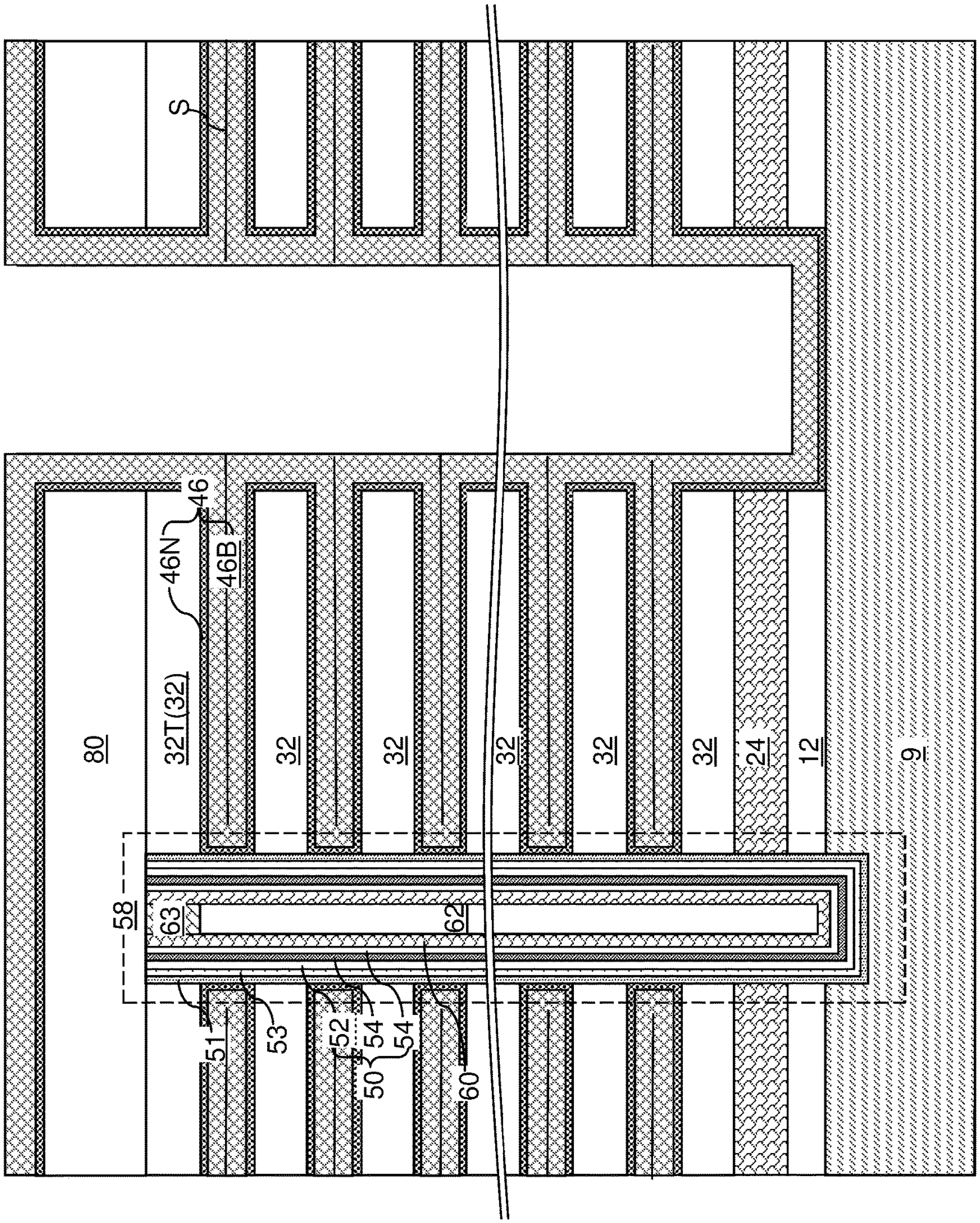
Figure 25C:
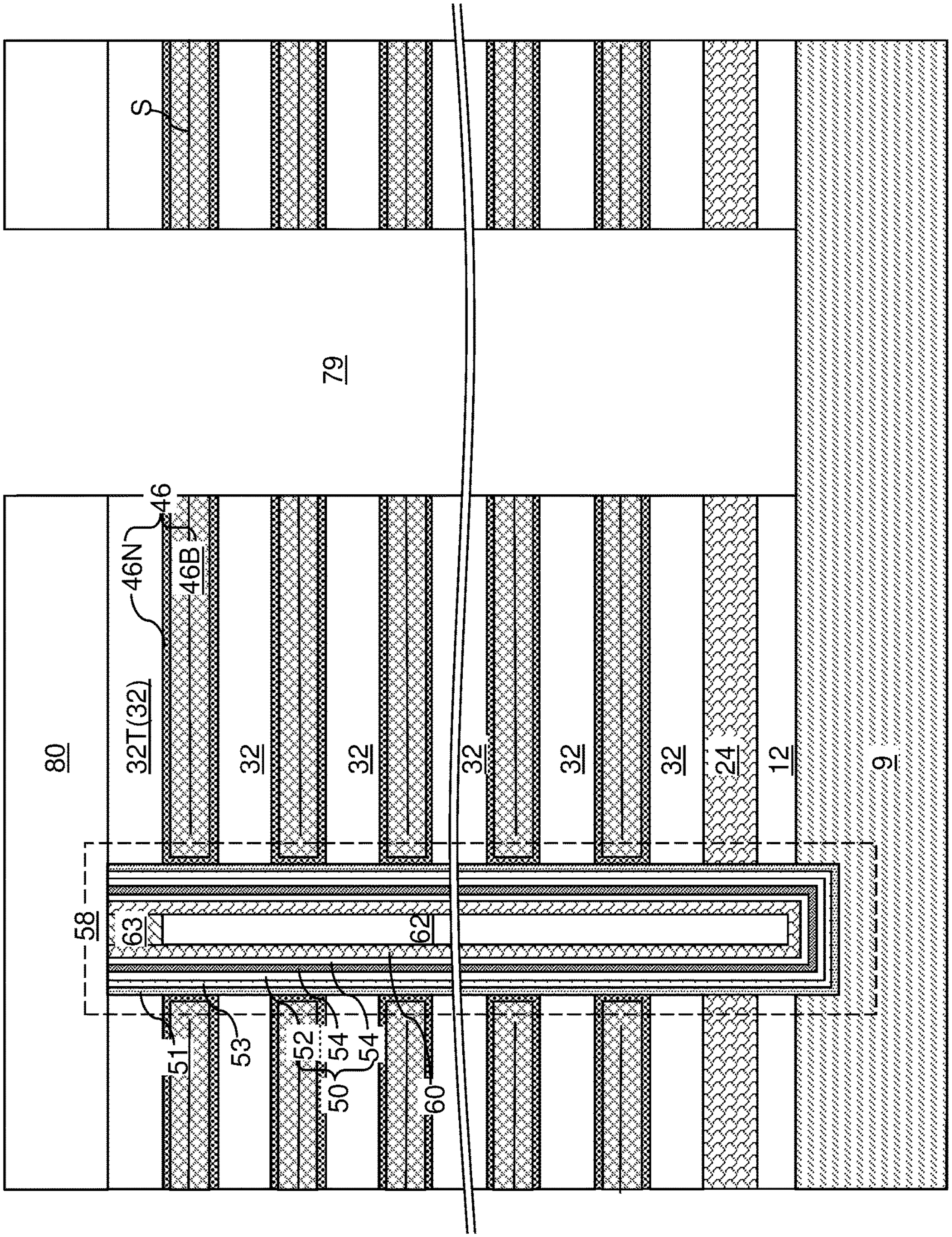

FIGS. 25A-25C are sequential vertical cross-sectional views of a region of the fourth exemplary structure during formation of electrically conductive layers according to the fourth embodiment of the present disclosure. In the fourth embodiment, the metallic nitride barrier layer 46A is replaced with a boron containing nucleation layer 46N.

Referring to FIG. 25A, the fourth exemplary structure can be derived from the first exemplary structure illustrated in FIG. 10A or from the corresponding figures of the second and third exemplary structures by forming the boron containing nucleation layer 46N in the lateral recesses instead of the metallic nitride barrier layer 46A. The boron containing nucleation layer 46N may be formed by providing diborane into the lateral recesses 43. The diborane may deposit a one to several monolayer thick boron containing nucleation layer 46N, such as a pure boron layer, on the surfaces of the aluminum nitride layer 51 and the insulating layers 32 exposed in the lateral recesses.

Referring to FIG. 25B, the step of FIG. 10B may be performed to deposit the metal fill material on the boron containing nucleation layer 46N in the plurality of lateral recesses 43, on the sidewalls of the at least one the lateral isolation trench 79, and over the top surface of the contact-level dielectric layer 80 to form the metallic fill material layer 46B. In one embodiment, the metallic fill material layer 46B may comprise a tungsten layer. In one embodiment, the boron containing nucleation layer 46N may remain between the metallic fill material layer 46B and the aluminum nitride layer 51, and between the metallic fill material layer 46B and the insulating layers 32. In this embodiment, the boron containing nucleation layer 46N may comprise a tungsten boride layer or a tungsten doped boron layer. In an alternative embodiment, the boron containing nucleation layer 46N may be absorbed into the metallic fill material layer 46B during the deposition of the metallic fill material layer 46B. In this embodiment, the boron containing nucleation layer 46N may comprise a boron doped tungsten region of the metallic fill material layer 46B. Thus, in the fourth embodiment, the metallic nitride barrier layer 46A of the first, second or third embodiments is replaced with the boron containing nucleation layer 46N. Therefore, there is no conductive diffusion barrier layer in the fourth embodiment, and the aluminum nitride layer 51 functions as an insulating diffusion barrier layer.

Referring to FIG. 25C, the etching step of FIG. 10C is performed to leave the electrically conductive layers 46 in the lateral recesses.

Referring to all drawings and according to various embodiments of the present disclosure, a semiconductor structure comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a memory film 50, a vertical semiconductor channel 60, and an aluminum nitride layer 51 that laterally surrounds the memory film 50.

In one embodiment, the aluminum nitride layer 51 is in contact with sidewalls of a plurality of the insulating layers 32 among the insulating layers 32 and in contact with sidewalls of a plurality of the electrically conductive layers 46.

In the first through third embodiments, each of the electrically conductive layers 46 comprises a metallic nitride barrier layer 46A that is in contact with a respective cylindrical segment of an outer sidewall of the aluminum nitride layer 51. In one embodiment, the metallic nitride barrier layer 46A comprises a metal boronitride layer, such as a tungsten boronitride layer. In one embodiment, each of the electrically conductive layers 46 comprises a metallic fill material layer 46B contacting a bottom surface of an upper horizontally-extending portion of the metallic nitride barrier layer 46A, contacting a top surface of a lower horizontally-extending portion of the metallic nitride barrier layer 46A, and contacting a cylindrical outer surface of a tubular portion of the metallic nitride barrier layer 46A. In one embodiment, the metallic fill material layer 46B consists essentially of an elemental metal, such as W, Mo, Ru or Co.

In the fourth embodiment, each of the electrically conductive layers 46 comprises a boron containing nucleation layer 46N that is in contact with a respective cylindrical segment of an outer sidewall of the aluminum nitride layer 51; and a metallic fill material layer 46B contacting a bottom surface of an upper horizontally-extending portion of the boron containing nucleation layer, contacting a top surface of a lower horizontally-extending portion of the boron containing nucleation layer, and contacting a cylindrical outer surface of a tubular portion of the boron containing nucleation layer. The metallic fill material layer 46B may comprise a tungsten layer, and the boron containing nucleation layer 46N may comprise boron and tungsten.

In one embodiment, the memory opening fill structure 58 further comprises an aluminum oxide layer 53 located between the aluminum nitride layer 51 and the memory film 50. In one embodiment, the aluminum oxide layer 53 comprises a nitrogen doped aluminum oxide layer in which an atomic concentration of nitrogen atoms in the aluminum oxide layer 53 decreases with an increasing distance from the aluminum nitride layer 51. In one embodiment, the aluminum oxide layer 53 contacts an inner sidewall of the aluminum nitride layer 51 and contacts an outer sidewall of the memory film 50.

In one embodiment, the memory film 50 comprises a vertical stack of memory elements (comprising portions of the memory material layer 54) located at levels of the electrically conductive layers 46, and a dielectric liner 56 (which may comprise a tunneling dielectric layer) in contact with the vertical semiconductor channel 60. In one embodiment, the aluminum nitride layer 51 continuously extends through each insulating layer and each electrically conductive layer in the alternating stack (32, 46).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A semiconductor structure, comprising:

an alternating stack of insulating layers and electrically conductive layers;

a memory opening vertically extending through the alternating stack; and a memory opening fill structure located in the memory opening and comprising a memory film, a vertical semiconductor channel, an aluminum nitride layer that laterally surrounds the memory film, and an aluminum oxide layer located between the aluminum nitride layer and the memory film, wherein each of the electrically conductive layers comprises a metallic nitride barrier layer that is in contact with a respective cylindrical segment of an outer sidewall of the aluminum nitride layer.

2. The semiconductor structure of claim 1, wherein the metallic nitride barrier layer comprises a metal boronitride layer.

3. The semiconductor structure of claim 2, wherein the metal boronitride layer comprises a tungsten boronitride layer.

4. The semiconductor structure of claim 2, wherein each of the electrically conductive layers further comprises a metallic fill material layer contacting a bottom surface of an upper horizontally-extending portion of the metallic nitride barrier layer, contacting a top surface of a lower horizontally-extending portion of the metallic nitride barrier layer, and contacting a cylindrical outer surface of a tubular portion of the metallic nitride barrier layer.

5. The semiconductor structure of claim 4, wherein the metallic fill material layer consists essentially of an elemental metal comprising tungsten, molybdenum, ruthenium or cobalt.

6. A semiconductor structure, comprising:

an alternating stack of insulating layers and electrically conductive layers;

a memory opening vertically extending through the alternating stack; and a memory opening fill structure located in the memory opening and comprising a memory film, a vertical semiconductor channel, an aluminum nitride layer that laterally surrounds the memory film, and an aluminum oxide layer located between the aluminum nitride layer and the memory film, wherein each of the electrically conductive layers comprises:

a boron containing nucleation layer that is in contact with a respective cylindrical segment of an outer sidewall of the aluminum nitride layer; and a metallic fill material layer contacting a bottom surface of an upper horizontally-extending portion of the boron containing nucleation layer, contacting a top surface of a lower horizontally-extending portion of the boron containing nucleation layer, and contacting a cylindrical outer surface of a tubular portion of the boron containing nucleation layer.

7. The semiconductor structure of claim 6, wherein the metallic fill material layer comprises a tungsten layer, and the boron containing nucleation layer comprises boron and tungsten.

8. A semiconductor structure, comprising:

an alternating stack of insulating layers and electrically conductive layers;

a memory opening vertically extending through the alternating stack; and a memory opening fill structure located in the memory opening and comprising a memory film, a vertical semiconductor channel, an aluminum nitride layer that laterally surrounds the memory film, and an aluminum oxide layer located between the aluminum nitride layer and the memory film, wherein the aluminum oxide layer comprises a nitrogen doped aluminum oxide layer in which an atomic concentration of nitrogen atoms decreases with increasing distance from the aluminum nitride layer.

* * * * *